US012805162B2

(12) United States Patent
Ikeda et al.

(10) Patent No.: US 12,805,162 B2
(45) Date of Patent: Nov. 17, 2026

(54) DISPLAY DEVICE, DISPLAY MODULE, AND ELECTRONIC DEVICE

(71) Applicant: Semiconductor Energy Laboratory Co., Ltd., Atsugi (JP)

(72) Inventors: Takayuki Ikeda, Atsugi (JP); Satoshi Seo, Sagamihara (JP); Sachiko Kawakami, Atsugi (JP); Daiki Nakamura, Atsugi (JP); Shunpei Yamazaki, Setagaya (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 242 days.

(21) Appl. No.: 18/560,710

(22) PCT Filed: May 13, 2022

(86) PCT No.: PCT/IB2022/054454

§ 371 (c)(1),
(2) Date: Nov. 14, 2023

(87) PCT Pub. No.: WO2022/248962

PCT Pub. Date: Dec. 1, 2022

(65) Prior Publication Data

US 2024/0292701 A1 Aug. 29, 2024

(30) Foreign Application Priority Data

May 27, 2021 (JP) ................................ 2021-089569

(51) Int. Cl.
*H10K 59/80* (2023.01)
*H10K 50/00* (2023.01)
(Continued)

(52) U.S. Cl.
CPC ......... *H10K 59/8731* (2023.02); *H10K 50/00* (2023.02); *H10K 50/19* (2023.02);
(Continued)

(58) Field of Classification Search
CPC .... H10K 59/8731; H10K 50/00; H10K 50/19; H10K 59/353; H10K 59/80518;
(Continued)

(56) References Cited

U.S. PATENT DOCUMENTS

| | | | |
|---|---|---|---|
| 5,953,985 | A | 9/1999 | Kobayashi |
| 6,120,338 | A | 9/2000 | Hirano et al. |

(Continued)

FOREIGN PATENT DOCUMENTS

| | | | |
|---|---|---|---|
| CN | 110476267 | A | 11/2019 |
| CN | 112054040 | A | 12/2020 |

(Continued)

OTHER PUBLICATIONS

Taiwanese Office Action (Application No. 111118496), dated Aug. 29, 2025.

(Continued)

*Primary Examiner* — Jonathan Han
(74) *Attorney, Agent, or Firm* — Eric J. Robinson; Robinson Intellectual Property Law Office, P.C.

(57) ABSTRACT

A display device with high display quality is provided. The display device includes a first subpixel including a first light-emitting device and a first coloring layer transmitting blue light in a display portion. The first light-emitting device includes a first pixel electrode, a first EL layer, and a common electrode. The first EL layer includes a first light-emitting material emitting blue light and a second light-emitting material emitting light with a longer wavelength than blue light. The first EL layer includes a first light-emitting unit over the first pixel electrode, a charge-generation layer over the first light-emitting unit, and a second light-emitting unit over the charge-generation layer. In an emission spectrum of blue display by the display portion at a low luminance, the intensity of a first emission peak at a (Continued)

wavelength longer than or equal to 400 nm and shorter than 500 nm is assumed to be 1; in this case, the intensity of a second emission peak at a wavelength longer than or equal to 500 nm and shorter than or equal to 700 nm in the emission spectrum is lower than or equal to 0.5.

9 Claims, 33 Drawing Sheets

(51) Int. Cl.
*H10K 50/19* (2023.01)
*H10K 59/35* (2023.01)

(52) U.S. Cl.
CPC ..... *H10K 59/353* (2023.02); *H10K 59/80518* (2023.02); *H10K 59/879* (2023.02)

(58) Field of Classification Search
CPC .... H10K 59/879; H10K 59/35; H10K 59/351; H10K 59/38; H10K 59/32; H10K 50/15; H10K 50/16; H10K 50/17; H10K 50/181; H10K 59/122; H10K 59/8052; H10K 59/90; G09F 9/30; H05B 33/12; H05B 33/22; H05B 33/24; H05B 33/26; H05B 33/20
See application file for complete search history.

(56) References Cited

U.S. PATENT DOCUMENTS

| | | | |
|---|---|---|---|
| 9,755,174 B2 | 9/2017 | Uesaka et al. | |
| 10,333,091 B2 | 6/2019 | Uesaka et al. | |
| 11,094,903 B2 | 8/2021 | Ohsawa et al. | |
| 11,588,125 B2 | 2/2023 | Ohsawa et al. | |
| 11,588,137 B2 | 2/2023 | Yamazaki et al. | |
| 11,678,550 B2 | 6/2023 | Kato | |
| 11,950,447 B2 | 4/2024 | Watabe et al. | |
| 2002/0072139 A1 | 6/2002 | Kashiwabara | |
| 2011/0148290 A1 | 6/2011 | Oota | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2016/0077390 A1* | 3/2016 | Sato | G02F 1/134336 349/33 |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0256754 A1 | 9/2017 | Defranco et al. | |
| 2017/0373036 A1* | 12/2017 | Yamazaki | H10K 59/38 |
| 2018/0095312 A1* | 4/2018 | Kubota | G02F 1/133553 |
| 2018/0190908 A1 | 7/2018 | Ke et al. | |
| 2020/0203662 A1 | 6/2020 | Mollard et al. | |
| 2020/0388790 A1 | 12/2020 | Yamazaki et al. | |
| 2021/0104697 A1 | 4/2021 | Ohsawa et al. | |
| 2021/0265432 A1 | 8/2021 | Kato | |
| 2023/0209851 A1 | 6/2023 | Ohsawa et al. | |
| 2023/0301151 A1 | 9/2023 | Kato | |

FOREIGN PATENT DOCUMENTS

| | | |
|---|---|---|
| CN | 112314056 A | 2/2021 |
| JP | 2000-036385 A | 2/2000 |
| JP | 2003-059663 A | 2/2003 |
| JP | 2008-098106 A | 4/2008 |
| JP | 2008-147072 A | 6/2008 |
| JP | 2008-251270 A | 10/2008 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-157692 A | 9/2016 |
| JP | 2016-197494 A | 11/2016 |
| JP | 2017-038049 A | 2/2017 |
| JP | 2018-201012 A | 12/2018 |
| JP | 2019-179696 A | 10/2019 |
| JP | 2020-160305 A | 10/2020 |
| JP | 2020-201484 A | 12/2020 |
| KR | 2019-0131569 A | 11/2019 |
| KR | 2020-0140206 A | 12/2020 |
| TW | 201902904 | 1/2019 |
| TW | 201944616 | 11/2019 |
| TW | 202035433 | 10/2020 |
| TW | 202114262 | 4/2021 |
| WO | WO-2017/025843 | 2/2017 |
| WO | WO-2018/087625 | 5/2018 |
| WO | WO-2018/185642 | 10/2018 |
| WO | WO-2020/004086 | 1/2020 |

OTHER PUBLICATIONS

International Search Report (Application No. PCT/IB2022/054454), dated Aug. 2, 2022.
Written Opinion (Application No. PCT/IB2022/054454), dated Aug. 2, 2022.
Zakhidov.A et al., "Orthogonal processing: A new strategy for organic electronics", Chem. Sci. (Chemical Science), Apr. 7, 2011, vol. 2, No. 6, pp. 1178-1182.
Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke. T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

DISPLAY DEVICE, DISPLAY MODULE, AND ELECTRONIC DEVICE

TECHNICAL FIELD

One embodiment of the present invention relates to a display device, a display module, and an electronic device. One embodiment of the present invention relates to a method for manufacturing a display device.

Note that one embodiment of the present invention is not limited to the above technical field. Examples of the technical field of one embodiment of the present invention include a semiconductor device, a display device, a light-emitting apparatus, a power storage device, a memory device, an electronic device, a lighting device, an input device (e.g., a touch sensor), an input/output device (e.g., a touch panel), a driving method thereof, and a manufacturing method thereof.

BACKGROUND ART

Recent display devices have been expected to be applied to a variety of uses. Usage examples of large-sized display devices include a television device for home use (also referred to as TV or television receiver), digital signage, and a PID (Public Information Display). In addition, a smartphone and a tablet terminal each including a touch panel, and the like, are being developed as portable information terminals.

Furthermore, higher-resolution display devices have been required. For example, devices for virtual reality (VR), augmented reality (AR), substitutional reality (SR), or mixed reality (MR) are given as devices required by high-resolution display devices and have been actively developed.

Light-emitting apparatuses including light-emitting devices (also referred to as light-emitting elements) have been developed as display devices, for example. Light-emitting devices (also referred to as EL devices or EL elements) utilizing electroluminescence (hereinafter referred to as EL) have features such as ease of reduction in thickness and weight, high-speed response to input signals, and driving with a constant DC voltage power source, and have been used in display devices.

Patent Document 1 discloses a display device using an organic EL device (also referred to as organic EL element) for VR.

REFERENCE

Patent Document

[Patent Document 1] PCT International Publication No. 2018/087625

SUMMARY OF THE INVENTION

Problems to be Solved by the Invention

Color shift between low luminance display and high luminance display might appear depending on a structure of a display device. An increase in the resolution of a display device might cause crosstalk (which is unintended light emission due to current flow to an adjacent subpixel). In view of the above, an object of one embodiment of the present invention is to provide a display device with high display quality. An object of one embodiment of the present invention is to provide a display device with small difference in color between low luminance display and high luminance display.

An object of one embodiment of the present invention is to provide a high-resolution display device. An object of one embodiment of the present invention is to provide a high-definition display device. An object of one embodiment of the present invention is to provide a highly reliable display device.

An object of one embodiment of the present invention is to provide a method for manufacturing a high-resolution display device. An object of one embodiment of the present invention is to provide a method for manufacturing a high-definition display device. An object of one embodiment of the present invention is to provide a method for manufacturing a highly reliable display device. An object of one embodiment of the present invention is to provide a method for manufacturing a display device with a high yield.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a display device including a display portion capable of full-color display. The display portion includes a first subpixel. The first subpixel includes a first light-emitting device and a first coloring layer transmitting blue light. The first light-emitting device includes a first pixel electrode, a first EL layer over the first pixel electrode, and a common electrode over the first EL layer. The first EL layer includes a first light-emitting material emitting blue light and a second light-emitting material emitting light with a longer wavelength than blue light. The first EL layer includes a first light-emitting unit over the first pixel electrode, a charge-generation layer over the first light-emitting unit, and a second light-emitting unit over the charge-generation layer. In an emission spectrum of blue display by the display portion at a first luminance, when the intensity of a first emission peak at a wavelength longer than or equal to 400 nm and shorter than 500 nm is 1, the intensity of a second emission peak at a wavelength longer than or equal to 500 nm and shorter than or equal to 700 nm in the emission spectrum is lower than or equal to 0.5. The first luminance is any value higher than 0 $cd/m^2$ and lower than 1 $cd/m^2$.

It is preferable that the display portion further include a second subpixel which includes a second light-emitting device and a second coloring layer transmitting light of a color different from the color of light transmitted by the first coloring layer. The second light-emitting device preferably includes a second pixel electrode, a second EL layer over the second pixel electrode, and the common electrode over the second EL layer. The first EL layer and the second EL layer preferably have the same structure. The first EL layer and the second EL layer are preferably separated from each other.

One embodiment of the present invention is a display device including a display portion capable of full-color display. The display portion includes a first subpixel and a second subpixel. The first subpixel includes a first light-emitting device and a first coloring layer transmitting blue light. The second subpixel includes a second light-emitting device and a second coloring layer transmitting light of a color different from the color of light transmitted by the first coloring layer. The first light-emitting device includes a first pixel electrode, a first EL layer over the first pixel electrode, and a common electrode over the first EL layer. The second light-emitting device includes a second pixel electrode, the first EL layer over the second pixel electrode, and the common electrode over the first EL layer. The first EL layer includes a first light-emitting unit over the first pixel electrode, a charge-generation layer over the first light-emitting unit, and a second light-emitting unit over the charge-generation layer. In an emission spectrum of blue display by the display portion at a first luminance, when the intensity of a first emission peak at a wavelength longer than or equal to 400 nm and shorter than 500 nm is 1, the intensity of a second emission peak at a wavelength longer than or equal to 500 nm and shorter than or equal to 700 nm in the emission spectrum is lower than or equal to 0.5. The first luminance is any value higher than 0 cd/$m^2$ and lower than 1 cd/$m^2$.

One embodiment of the present invention is a display device including a display portion capable of full-color display. The display portion includes a first subpixel and a second subpixel. The first subpixel includes a first light-emitting device and a first coloring layer transmitting blue light. The second subpixel includes a second light-emitting device and a second coloring layer transmitting light of a color different from the color of light transmitted by the first coloring layer. The first light-emitting device includes a first pixel electrode, a first EL layer over the first pixel electrode, and a common electrode over the first EL layer. The second light-emitting device includes a second pixel electrode, a second EL layer over the second pixel electrode, and the common electrode over the second EL layer. The first EL layer and the second EL layer have the same structure. The first EL layer and the second EL layer are separated from each other. The first EL layer includes a first light-emitting unit over the first pixel electrode, a charge-generation layer over the first light-emitting unit, and a second light-emitting unit over the charge-generation layer. In an emission spectrum of blue display by the display portion at a first luminance, when the intensity of a first emission peak at a wavelength longer than or equal to 400 nm and shorter than 500 nm is 1, the intensity of a second emission peak at a wavelength longer than or equal to 500 nm and shorter than or equal to 700 nm in the emission spectrum is lower than or equal to 0.5. The first luminance is any value higher than 0 cd/$m^2$ and lower than 1 cd/$m^2$.

The first light-emitting device preferably includes a common layer between the first EL layer and the common electrode. The second light-emitting device preferably includes the common layer between the second EL layer and the common electrode. The common layer preferably includes at least one of a hole-injection layer, a hole-transport layer, a hole-blocking layer, an electron-blocking layer, an electron-transport layer, and an electron-injection layer.

It is preferable that the display portion include a first insulating layer, the first insulating layer cover a side surface of the first EL layer and a side surface of the second EL layer, and the common electrode be positioned over the first insulating layer. The first insulating layer is preferably in contact with a side surface of the first pixel electrode and a side surface of the second pixel electrode.

It is preferable that the display portion include a second insulating layer, the first insulating layer include an inorganic material, and the second insulating layer include an organic material and cover the side surface of the first EL layer and the side surface of the second EL layer with the first insulating layer therebetween.

It is preferable that the resolution of the display portion be 1000 ppi or higher, 2000 ppi or higher, 3000 ppi or higher, 5000 ppi or higher, or 6000 ppi or higher and 20000 ppi or lower or 30000 ppi or lower.

The first subpixel preferably includes a lens overlapping with the first light-emitting device and the first coloring layer.

The first pixel electrode preferably includes a material reflecting visible light.

It is preferable that the first subpixel include a reflective layer, the first pixel electrode include a material transmitting visible light, and the first pixel electrode be positioned between the reflective layer and the first EL layer.

One embodiment of the present invention is a display module including the display device having any of the above-described structures and is, for example, a display module provided with a connector such as a flexible printed circuit (hereinafter referred to as an FPC) or a TCP (Tape Carrier Package), or a display module on which an integrated circuit (IC) is mounted by a COG (Chip On Glass) method, a COF (Chip On Film) method, or the like.

One embodiment of the present invention is an electronic device including the above-described display module and at least one of a housing, a battery, a camera, a speaker, and a microphone.

Effect of the Invention

One embodiment of the present invention can provide a display device with high display quality. One embodiment of the present invention can provide a display device with small difference in color between low luminance display and high luminance display. One embodiment of the present invention can provide a high-resolution display device. One embodiment of the present invention can provide a high-definition display device. One embodiment of the present invention can provide a highly reliable display device.

One embodiment of the present invention can provide a method for manufacturing a high-resolution display device. One embodiment of the present invention can provide a method for manufacturing a high-definition display device. One embodiment of the present invention can provide a method for manufacturing a highly reliable display device. One embodiment of the present invention can provide a method for manufacturing a display device with a high yield.

Note that the description of these effects does not preclude the existence of other effects. One embodiment of the present invention does not necessarily have all of these effects. Other effects can be derived from the description of the specification, the drawings, and the claims.

MODE FOR CARRYING OUT THE INVENTION

Figure 1A:
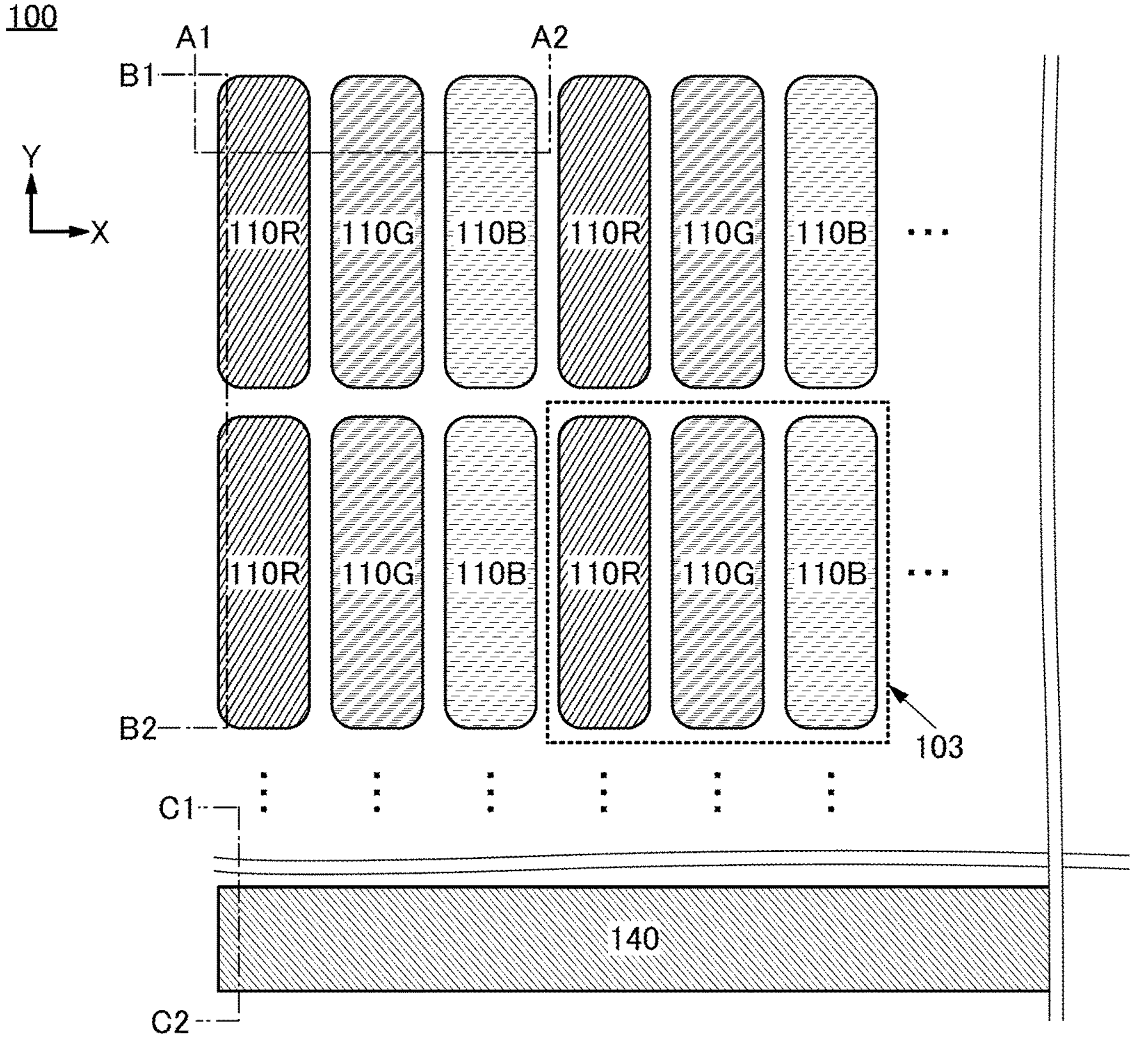
FIG. 1A is a top view illustrating an example of a display device.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. The same hatching pattern is applied to portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term “film” and the term “layer” can be used interchangeably depending on the case or the circumstances. For example, the term “conductive layer” can be replaced with the term “conductive film”. As another example, the term “insulating film” can be replaced with the term “insulating layer”.

In this specification and the like, a device manufactured using a metal mask or an FMM (fine metal mask, a high resolution metal mask) may be referred to as a device having an FMM structure or a device having an MM (metal mask) structure. In this specification and the like, a device manufactured without using a metal mask or an FMM may be referred to as a device having an MML (metal maskless) structure.

Embodiment 1

In this embodiment, a display device of one embodiment of the present invention and a manufacturing method thereof are described with reference to FIG. 1 to FIG. 11.

One embodiment of the present invention is a display device including a display portion capable of full-color display. A subpixel that is included in the display portion and exhibits blue light is provided with a light-emitting device and a coloring layer transmitting blue light. The light-emitting device includes a pixel electrode, an EL layer over the pixel electrode, and a common electrode over the EL layer. The EL layer includes a light-emitting material emitting blue light and a light-emitting material emitting light with a longer wavelength than blue light. The EL layer includes a first light-emitting unit over the pixel electrode, a charge-generation layer over the first light-emitting unit, and a second light-emitting unit over the charge-generation layer. In other words, in the display device of one embodiment of the present invention, a light-emitting device with a tandem structure which includes a plurality of light-emitting units is used. Note that the display portion capable of full-color display includes at least a subpixel exhibiting blue light and two or more kinds of subpixels exhibiting light of color different from blue. An example of the blue light is light with a peak wavelength longer than or equal to 400 nm and shorter than 500 nm.

According to the display device of one embodiment of the present invention, in an emission spectrum of blue display by the display portion at a first luminance, when the intensity of a first emission peak at a wavelength longer than or equal to 400 nm and shorter than 500 nm is 1, the intensity of a second emission peak at a wavelength longer than or equal to 500 nm and shorter than or equal to 700 nm in the emission spectrum is higher than or equal to 0 and lower than or equal to 0.5, and the first luminance is any value higher than 0 $cd/m^2$ and lower than 1 $cd/m^2$. In other words, when the display device of one embodiment of the present invention displays blue color at a low luminance, blue light is mainly observed while light with a longer wavelength than blue light is less observed (including the case where light with a longer wavelength than blue light is substantially not observed).

In a light-emitting device having a single structure (including only one light-emitting unit) with a plurality of light-emitting layers, the carrier balance cannot be easily adjusted and the emission color at a low luminance might be different from that at a high luminance. By contrast, in a light-emitting device with the tandem structure, the carrier balance can be more easily adjusted and the emission color at a low luminance is less different from that at a high luminance than in a light-emitting device with a single structure. Consequently, the display device of one embodiment of the present invention exhibits a small difference in color between low luminance display and high luminance display and can achieve high display quality.

In the display device of one embodiment of the present invention, subpixels include light-emitting devices including EL layers having the same structure and coloring layers overlapping with the light-emitting devices. Coloring layers that can transmit visible light of different colors are provided for subpixels, whereby full-color display can be performed.

It is not necessary to form light-emitting layers separately for a plurality of subpixels when the light-emitting devices including the EL layers having the same structure are used for the subpixels. Thus, a layer other than a pixel electrode included in the light-emitting device (e.g., a light-emitting layer) can be common between (can be shared by) a plurality of subpixels. However, some layers included in the light-emitting device have relatively high conductivity; when such a layer having high conductivity is shared by a plurality of subpixels, leakage current might be generated between the subpixels. Particularly when an increase in the resolution or the aperture ratio of a display device reduces the distance between subpixels, the leakage current might become too large to ignore and cause a decrease in display quality of the display device or the like. In view of the above, in the display device of one embodiment of the present invention, at least some of the layers included in the EL layer are formed to have an island shape in each subpixel. Since at least some of the layers included in the EL layer are divided between the subpixels, occurrence of crosstalk between adjacent subpixels can be prevented. This enables the display device to achieve both high resolution and high display quality.

For example, an island-shaped light-emitting layer can be formed by a vacuum evaporation method using a metal mask. However, this method causes a deviation from the designed shape and position of the island-shaped light-emitting layer due to various influences such as the accuracy of the metal mask, the positional deviation between the metal mask and a substrate, a warp of the metal mask, and the vapor-scattering-induced expansion of outline of the formed film; accordingly, it is difficult to achieve high resolution and high aperture ratio of the display device. In addition, the outline of the layer may blur during vapor deposition, whereby the thickness of an end portion may be reduced. That is, the thickness of the island-shaped light-emitting layer may vary from area to area. In the case of manufacturing a display device with a large size, high definition, or high resolution, the manufacturing yield might be reduced because of low dimensional accuracy of the metal mask and deformation due to heat or the like.

In view of the above, in manufacturing the display device of one embodiment of the present invention, a pixel electrode is formed for each subpixel, and then, a light-emitting layer is formed across a plurality of pixel electrodes. After that, the light-emitting layer is processed by a photolithography method, for example, so that one island-shaped light-emitting layer is formed per pixel electrode. Thus, the light-emitting layer can be divided into island-shaped light-emitting layers for respective subpixels.

As described above, in the method for manufacturing the display device of one embodiment of the present invention, the island-shaped light-emitting layers are formed by processing a light-emitting layer formed on the entire surface, not by using a metal mask having a fine pattern. Specifically, the size of the island-shaped light-emitting layers is obtained by division and scale down of the light-emitting layer by a photolithography method or the like. Thus, the size of the island-shaped light-emitting layers can be made smaller than the size of the layers formed with use of a metal mask. Accordingly, a high-resolution display device or a display device with a high aperture ratio, which has been difficult to achieve, can be manufactured.

The small number of times of processing of the light-emitting layer with a photolithography method is preferable because a reduction in manufacturing cost and an improvement of manufacturing yield become possible. In the method for manufacturing the display device of one embodiment of the present invention, the number of times of processing of the light-emitting layer with a photolithography method is one; thus, the display device can be manufactured with high yield.

It is difficult to set the distance between adjacent light-emitting devices to be less than 10 μm with a formation method using a metal mask, for example. However, with the above method, the distance between adjacent light-emitting devices can be decreased to be less than 10 μm, less than or equal to 5 μm, less than or equal to 3 μm, less than or equal to 2 μm, or less than or equal to 1 μm. For example, with use of an exposure tool for LSI, the distance can be decreased to be less than or equal to 500 nm, less than or equal to 200 nm, less than or equal to 100 nm, or less than or equal to 50 nm. Accordingly, the area of a non-light-emitting region that could exist between two light-emitting devices can be significantly reduced, and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, a pattern of the light-emitting layer itself (also referred to as processing size) can be made much smaller than that in the case of using a metal mask. For example, in the case of using a metal mask for forming the light-emitting layers separately, a variation in the thickness occurs between the center and the edge of the light-emitting layer. This causes a reduction in an effective area that can be used as a light-emitting region with respect to the area of the light-emitting layer. In contrast, in the above manufacturing method, the film formed to have a uniform thickness is processed, so that island-shaped light-emitting layers can be formed to have a uniform thickness. Accordingly, even with a fine pattern, almost the all area can be used as a light-emitting region. Thus, a display device having both a high resolution and a high aperture ratio can be manufactured.

Furthermore, in the method for manufacturing the display device of one embodiment of the present invention, it is preferable to form a layer including a light-emitting layer (which can also be referred to as an EL layer or part of an EL layer) on the entire surface and subsequently form a sacrificial layer (which may be called a mask layer) over the EL layer. Then, a resist mask is formed over the sacrificial layer, and the EL layer and the sacrificial layer are processed using the resist mask, whereby an island-shaped EL layer is preferably formed.

Provision of a sacrificial layer over an EL layer can reduce damage to the EL layer during a manufacturing step of the display device and increase the reliability of the light-emitting device.

The island-shaped EL layer includes at least the light-emitting layer and preferably includes a plurality of layers. Specifically, one or more layers are preferably formed over the light-emitting layer. A layer between the light-emitting layer and the sacrificial layer can inhibit the light-emitting layer from being exposed on the outermost surface during the manufacturing step of the display device and can reduce damage to the light-emitting layer. Thus, the reliability of the light-emitting device can be increased. Thus, the island-shaped EL layer preferably includes the light-emitting layer and a carrier-transport layer (an electron-transport layer or a hole-transport layer) over the light-emitting layer.

Note that in the light-emitting device, all layers included in the EL layer are not necessarily formed into island shapes, and some layers can be shared by (are common between) a plurality of light-emitting devices. Examples of layers in the EL layer include a light-emitting layer, carrier-injection layers (a hole-injection layer and an electron-injection layer), carrier-transport layers (a hole-transport layer and an electron-transport layer), carrier-blocking layers (a hole-blocking layer and an electron-blocking layer), and the like. In the method for manufacturing the display device of one embodiment of the present invention, some of the layers included in the EL layer are formed to have an island shape for each subpixel, and then, at least part of the sacrificial layer is removed and the other layer(s) included in the EL layer (e.g., a carrier-injection layer) and a common electrode (also referred to as an upper electrode) can be formed as shared layers by the plurality of light-emitting devices.

In contrast, the carrier-injection layer is often a layer having relatively high conductivity in the EL layer. Therefore, when the carrier-injection layer is in contact with the side surface of the island-shaped EL layer or the side surface of the pixel electrode, the light-emitting device might be short-circuited. Note that also in the case where the carrier-injection layer is formed in an island shape and the common electrode is formed to be shared by the plurality of light-emitting devices, the light-emitting device might be short-circuited when the common electrode is in contact with the side surface of the EL layer or the side surface of the pixel electrode.

Thus, the display device of one embodiment of the present invention includes an insulating layer covering at least the side surface of the island-shaped light-emitting layer.

Thus, at least some layers in the island-shaped EL layer and the pixel electrode can be inhibited from being in contact with the carrier-injection layer or the common electrode. Hence, a short circuit of the light-emitting device is inhibited, and the reliability of the light-emitting device can be increased.

Moreover, providing the insulating layer can fill the space between the adjacent island-shaped EL layers; hence, the formation surface of a layer (e.g., the carrier-injection layer or the common electrode) provided over the island-shaped EL layer has less unevenness and can be flatter. Consequently, the coverage of the carrier-injection layer or the common electrode can be increased. As a result, disconnection of the common electrode can be prevented.

Note that in this specification and the like, disconnection refers to a phenomenon in which a layer, a film, or an electrode is split because of the shape of the formation surface (e.g., a level difference).

The insulating layer can be provided in contact with the island-shaped EL layer. Thus, the EL layer can be prevented from being peeled off. When the insulating layer and the island-shaped EL layer are in close contact with each other, an effect of fixing the adjacent island-shaped EL layers by or attaching the adjacent island-shaped EL layers to the insulating layer can be attained. Furthermore, the insulating layer inhibits moisture from entering the interface between the pixel electrode and the EL layer, so that peeling off the EL layer can be prevented. Thus, the reliability of the light-emitting device can be increased. The manufacturing yield of the light-emitting device can be increased.

The insulating layer preferably has a function of a barrier insulating layer against at least one of water and oxygen. Alternatively, the insulating layer preferably has a function of inhibiting the diffusion of at least one of water and oxygen. Alternatively, the insulating layer preferably has a function of capturing or fixing (also referred to as gettering) at least one of water and oxygen.

Note that in this specification and the like, a barrier insulating layer refers to an insulating layer having a barrier property. A barrier property in this specification and the like means a function of inhibiting diffusion of a targeted substance (also referred to as having low permeability). Alternatively, a barrier property refers to a function of capturing or fixing (also referred to as gettering) a targeted substance.

When the insulating layer has a function of the barrier insulating layer or a gettering function, entry of impurities (typically, at least one of water and oxygen) that would diffuse into the light-emitting devices from the outside can be inhibited. With this structure, a highly reliable light-emitting device, furthermore, a highly reliable display device can be provided.

The display device of one embodiment of the present invention includes a pixel electrode, a first light-emitting unit over the pixel electrode, a charge-generation layer (also referred to as an intermediate layer) over the first light-emitting unit, a second light-emitting unit over the charge-generation layer, an insulating layer provided to cover side surfaces of the first light-emitting unit, the charge-generation layer, and the second light-emitting unit, and a common electrode provided over the second light-emitting unit. Note that a layer common to light-emitting devices of different colors may be provided between the second light-emitting unit and the common electrode.

The hole-injection layer, the electron-injection layer, and the charge-generation layer, for example, often have relatively high conductivity in the EL layer. Since the side surfaces of these layers are covered with the insulating layer in the display device of one embodiment of the present invention, these layers can be inhibited from being in contact with the common electrode or the like. Hence, a short circuit of the light-emitting device is inhibited, and the reliability of the light-emitting device can be increased.

The insulating layer that covers the side surface of the island-shaped EL layer may have a single-layer structure or a stacked-layer structure.

For example, an insulating layer having a single-layer structure using an inorganic material can be used as a protective insulating layer for the EL layer. In this way, the reliability of the display device can be increased.

When the insulating layer has a stacked-layer structure, the first layer of the insulating layer is preferably formed using an inorganic insulating material because it is formed in contact with the EL layer. In particular, the first layer of the insulating layer is preferably formed by an atomic layer deposition (ALD) method, by which damage due to deposition is small. Alternatively, an inorganic insulating layer is preferably formed by a sputtering method, a chemical vapor deposition (CVD) method, or a plasma-enhanced chemical vapor deposition (PECVD) method, which have higher deposition speed than an ALD method. In that case, a highly reliable display device can be manufactured with high productivity. The second layer of the insulating layer is preferably formed using an organic material to fill a depressed portion formed by the first layer of the insulating layer.

For example, an aluminum oxide film formed by an ALD method can be used as the first layer of the insulating layer, and an organic resin film can be used as the second layer of the insulating layer.

In the case where the side surface of the EL layer and the organic resin film are in direct contact with each other, the EL layer might be damaged by an organic solvent or the like that might be contained in the organic resin film. When the first layer of the insulating layer is formed using an inorganic insulating film such as an aluminum oxide film by an ALD method, a structure in which the organic resin film and the side surface of the EL layer are not in direct contact with each other can be obtained. Thus, the EL layer can be inhibited from being dissolved by the organic solvent, for example.

In the display device of one embodiment of the present invention, it is not necessary to provide an insulating layer that covers the end portion of the pixel electrode between the pixel electrode and the EL layer; thus, the distance between adjacent light-emitting devices can be made extremely small. Thus, a display device with higher resolution or higher definition can be achieved. In addition, a mask for forming the insulating layer is not needed, which leads to a reduction in manufacturing cost of the display device.

Furthermore, light emitted by the EL layer can be extracted efficiently with a structure where an insulating layer covering the end portion of the pixel electrode is not provided between the pixel electrode and the EL layer, i.e., a structure where an insulating layer is not provided between the pixel electrode and the EL layer. Therefore, the display device of one embodiment of the present invention can significantly reduce the viewing angle dependence. A reduction in the viewing angle dependence leads to an increase in visibility of an image on the display device. For example, in the display device of one embodiment of the present invention, the viewing angle (the maximum angle with a certain contrast ratio maintained when the screen is seen from an oblique direction) can be more than or equal to 100° and less than 180°, preferably more than or equal to 150° and less than or equal to 170°. Note that the viewing angle refers to that in both the vertical direction and the horizontal direction.

To prevent crosstalk, one embodiment of the present invention is not limited to the structure in which the island-shaped EL layers are formed for the respective light-emitting devices. For example, crosstalk can be prevented also by the structure in which a region where the EL layer is thinner is formed between adjacent light-emitting devices. The existence of the region where the EL layer is thinner between adjacent light-emitting devices prevents current flow through the outside of a region of the EL layer that is in contact with the pixel electrode. In the EL layer, the region in contact with the pixel electrode can be used mainly as a light-emitting region.

For example, the ratio of a thickness T1 of the pixel electrode to a thickness T2 of the EL layer, i.e., T1/T2, is preferably higher than or equal to 0.5, further preferably higher than or equal to 0.8, further preferably higher than or equal to 1.0, still further preferably higher than or equal to 1.5. In the region between adjacent light-emitting devices, the thickness T1 of the pixel electrode may be smaller in some cases when a depressed portion is formed in the insulating layer having surface where the pixel electrode is formed (refer to an insulating layer 255*b* described later in Embodiment 3 (FIG. 17A or the like)). Specifically, the ratio of T3, which is the sum of the thickness of the pixel electrode and the depth of the depressed portion, to the thickness T2 of the EL layer, i.e., T3/T2, is preferably higher than or equal to 0.5, further preferably higher than or equal to 0.8, further preferably higher than or equal to 1.0, still further preferably higher than or equal to 1.5. When T1 and T2, or T2 and T3 have the above relationship, the region where the EL layer is thinner can be formed easily between adjacent light-emitting devices. The EL layer may have a region where the EL layer is extremely thinner, so that part of the EL layer may be separated.

Each of the thickness T1 of the pixel electrode and the sum T3 is, for example, preferably greater than or equal to 160 nm, greater than or equal to 200 nm, or greater than or equal to 250 nm and less than or equal to 1000 nm, less than or equal to 750 nm, less than or equal to 500 nm, less than or equal to 400 nm, or less than or equal to 300 nm.

For example, the angle (also referred to as a taper angle) between the side surface of the pixel electrode and the surface where a component is formed is preferably greater than or equal to 60° and less than or equal to 140°, further preferably greater than or equal to 70° and less than or equal to 140°, still further preferably greater than or equal to 80° and less than or equal to 140°. When the taper angle of the pixel electrode has the above value, the region where the EL layer is thinner can be formed easily between adjacent light-emitting devices.

Structure Example of Display Device

FIG. 1 and FIG. 2 illustrate a display device of one embodiment of the present invention.

FIG. 1A is a top view of a display device 100. The display device 100 includes a display portion in which a plurality of pixels 103 are arranged, and a connection portion 140 outside the display portion. A plurality of subpixels are arranged in matrix in the display portion. FIG. 1A illustrates subpixels arranged in two rows and six columns, which form pixels in two rows and two columns. The connection portion 140 can also be referred to as a cathode contact portion.

The pixel 103 illustrated in FIG. 1A includes three subpixels, a subpixel 110R, a subpixel 110G, and a subpixel 110B.

The subpixel 110R emits red light, the subpixel 110G emits green light, and the subpixel 110B emits blue light. Note that in this embodiment, three colors of red (R), green (G), and blue (B) are given as colors of light emitted by subpixels; however, the subpixels may emit light of three colors of yellow (Y), cyan (C), and magenta (M). The number of types of subpixels is not limited to three, and four or more types of subpixels may be used. As the four subpixels, subpixels of four colors of R, G, B, and white (W), subpixels of four colors of R, G, B, and Y, or four subpixels of R, G, B, and infrared light (IR) can be given, for example.

It can be said that the pixel 103 illustrated in FIG. 1A employs stripe arrangement.

In this specification and the like, the row direction and the column direction are sometimes referred to as the X direction and the Y direction, respectively. The X direction and the Y direction intersect with each other and are, for example, orthogonal to each other (see FIG. 1A).

FIG. 1A illustrates an example in which subpixels of different colors are arranged in the X direction and subpixels of the same color are arranged in the Y direction. Note that subpixels of different colors may be arranged in the Y direction, and subpixels of the same color may be arranged in the X direction.

Although the top view of FIG. 1A illustrates an example in which the connection portion 140 is positioned in the lower side of the display portion, one embodiment of the present invention is not limited thereto. The connection portion 140 may be provided in at least one of the upper side, the right side, the left side, and the lower side of the display portion in the top view, and may be provided so as to surround the four sides of the display portion. The top surface shape of the connection portion 140 can be a belt-like shape, an L shape, a U shape, a frame-like shape, or the like. The number of the connection portions 140 can be one or more.

Figure 1B:
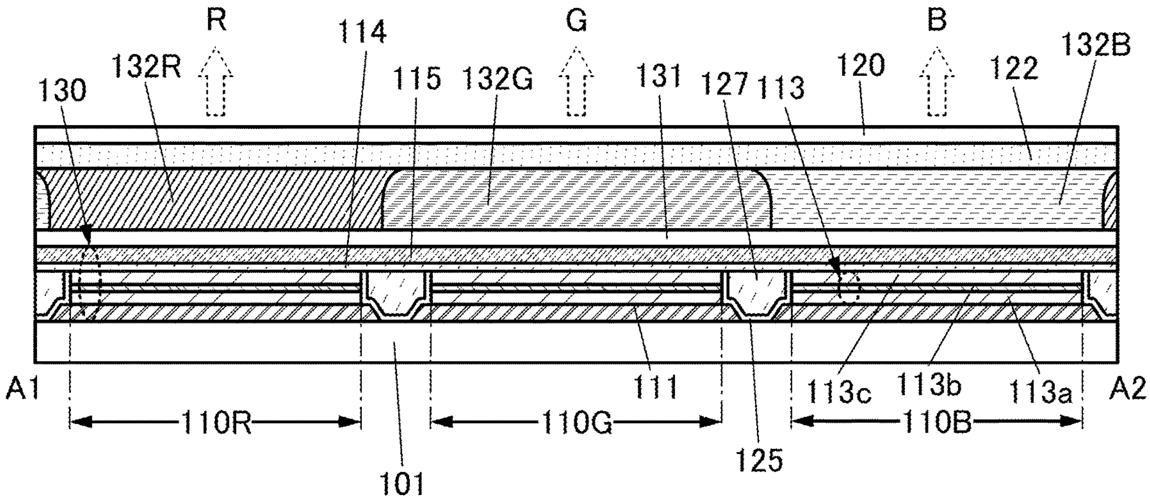
FIG. 1B is a cross-sectional view illustrating an example of a display device.
Figure 2A:
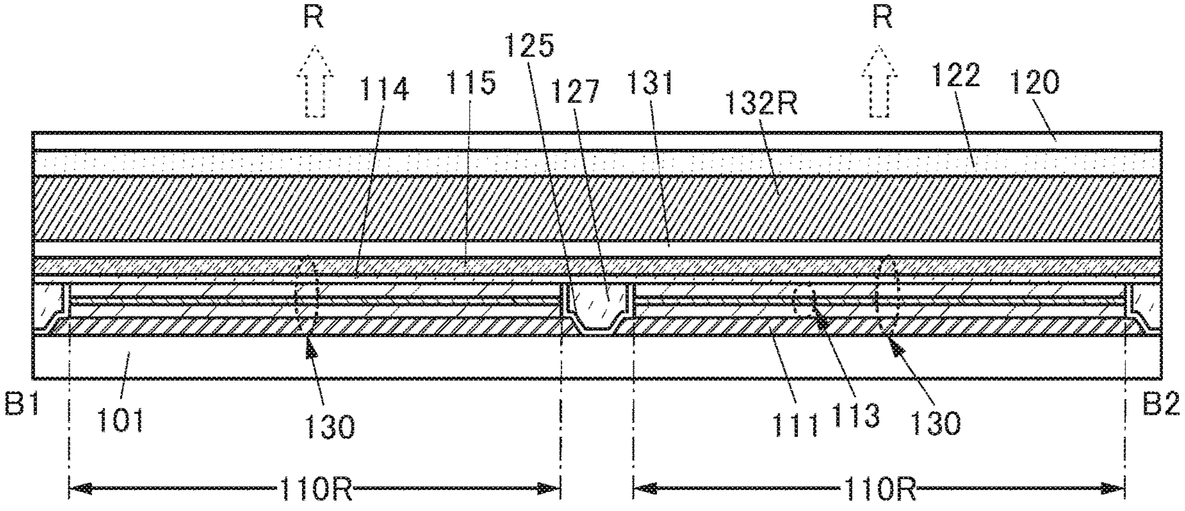
FIG. 2A to FIG. 2C are cross-sectional views each illustrating an example of a display device.
Figure 2B:
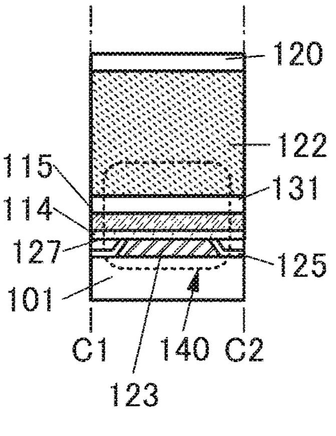
Figure 2C:
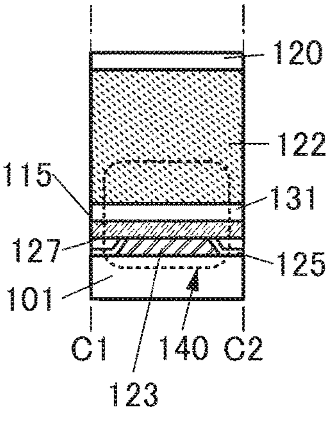

FIG. 1B is a cross-sectional view taken along the dashed-dotted line A1-A2 in FIG. 1A. FIG. 2A is a cross-sectional view taken along the dashed-dotted line B1-B2 in FIG. 1A. FIG. 2B and FIG. 2C are cross-sectional views taken along the dashed-dotted line C1-C2 in FIG. 1A.

As illustrated in FIG. 1B and FIG. 2A, the display device 100 includes light-emitting devices 130 over a layer 101 including a transistor and a protective layer 131 to cover the light-emitting devices. Coloring layers 132R, 132G, and 132B are provided over the protective layer 131, and a substrate 120 is bonded onto the protective layer 131 with a resin layer 122. In a region between adjacent light-emitting devices, an insulating layer 125 and an insulating layer 127 over the insulating layer 125 are provided.

Although FIG. 1B, FIG. 2A, and the like illustrate in such a manner that a plurality of insulating layers 125 and a plurality of insulating layers 127 are provided, the display device 100 can have a structure, when seen from above, such that the insulating layers 125 are connected to each other and the insulating layers 127 are connected to each other. In other words, the display device 100 can have a structure such that one insulating layer 125 and one insulating layer 127 are provided, for example. Note that the display device 100 may include a plurality of insulating layers 125 which are separated from each other and a plurality of insulating layers 127 which are separated from each other.

The display device of one embodiment of the present invention can have any of the following structures: a top-emission structure in which light is emitted in a direction opposite to the substrate where the light-emitting device 130 is formed, a bottom-emission structure where light is emitted toward the substrate where the light-emitting device 130 is formed, and a dual-emission structure where light is emitted toward both surfaces.

The layer 101 including a transistor can employ a stacked-layer structure in which a plurality of transistors are provided over a substrate and an insulating layer is provided to cover these transistors, for example. The layer 101 including a transistor may have a depressed portion between the adjacent light-emitting devices 130. For example, an insulating layer positioned on the outermost surface of the layer 101 including a transistor may have a depressed portion. Structure examples of the layer 101 including a transistor will be described in Embodiment 2 and Embodiment 3.

The light-emitting device 130 included in each subpixel includes an EL layer 113 and a common layer 114. The common layer 114 can be regarded as part of the EL layer in the light-emitting device. In this specification and the like, in the EL layers included in the light-emitting devices, the island-shaped layer provided in each light-emitting device is referred to as the EL layer 113, and the layer shared by the plurality of light-emitting devices is referred to as the common layer 114.

The plurality of EL layers 113 are each provided into an island shape. The plurality of EL layers 113 can have the same structure.

For example, the EL layer 113 can include a light-emitting material emitting blue light and a light-emitting material emitting light with a longer wavelength than blue light. For example, the EL layer 113 can employ a combination of a light-emitting material emitting blue light and a light-emitting material emitting yellow light or a combination of a light-emitting material emitting blue light, a light-emitting material emitting green light, and a light-emitting material emitting red light.

The EL layer 113 includes a plurality of light-emitting units. The EL layer 113 includes two light-emitting units in this embodiment, for example. Specifically, the EL layer 113 includes a first light-emitting unit 113*a*, a charge-generation layer 113*b*, and a second light-emitting unit 113*c*.

The light-emitting units each include a light-emitting layer. For example, when emission colors of the plurality of light-emitting units are complementary to each other, the light-emitting device 130 can emit white light.

When having a microcavity structure, which is described later, the light-emitting device 130 configured to emit white light may emit light with a specific color such as red, green, or blue intensified.

As the light-emitting device 130, EL devices such as an OLED (Organic Light Emitting Diode) and a QLED (Quantum-dot Light Emitting Diode) are preferably used. Examples of a light-emitting substance (also referred to as a light-emitting material) included in the EL device include a substance that emits fluorescent light (a fluorescent material), a substance that emits phosphorescent light (a phosphorescent material), and a substance exhibiting thermally activated delayed fluorescence (a thermally activated delayed fluorescent (TADF) material). As the TADF material, a material in which the singlet and triplet excited states are in thermal equilibrium may be used. Since such a TADF material has a short emission lifetime (excitation lifetime), it inhibits a reduction in the efficiency of a light-emitting device in a high-luminance region. An inorganic compound (e.g., a quantum dot material) may also be used as the light-emitting substance included in the EL device.

The light-emitting device 130 includes an EL layer between a pair of electrodes. The EL layer includes at least a light-emitting layer. In this specification and the like, one of the pair of electrodes may be referred to as a pixel electrode and the other may be referred to as a common electrode.

One of the pair of electrodes of the light-emitting device functions as an anode and the other electrode functions as a cathode. The case where the pixel electrode functions as an anode and the common electrode functions as a cathode is described below as an example in some cases.

The light-emitting device 130 includes a pixel electrode 111 over the layer 101 including a transistor, the island-shaped EL layer 113 over the pixel electrode 111, the common layer 114 over the EL layer 113, and a common electrode 115 over the common layer 114.

The EL layer 113 includes at least a light-emitting layer. The EL layer 113 may include one or more of a hole-injection layer, a hole-transport layer, a hole-blocking layer, a, charge-generation layer, an electron-blocking layer, an electron-transport layer, and an electron-injection layer.

The first light-emitting unit 113*a* and the second light-emitting unit 113*c* each include at least a light-emitting layer. The first light-emitting unit 113*a* and the second light-emitting unit 113*c* may each include one or more of a hole-injection layer, a hole-transport layer, a hole-blocking layer, an electron-blocking layer, an electron-transport layer, and an electron-injection layer.

The common layer 114 includes, for example, an electron-injection layer or a hole-injection layer. Alternatively, the common layer 114 may be a stack of an electron-transport layer and an electron-injection layer, and may be a stack of a hole-transport layer and a hole-injection layer. The common layer 114 is shared by the plurality of light-emitting devices 130 and for example, is shared by all of the light-emitting devices 130.

In this embodiment, a light-emitting device with a tandem structure is used. Although the light-emitting device includes two light-emitting units in this embodiment, the number of light-emitting units included in the light-emitting device may be three or more.

The common electrode 115 is shared by the plurality of light-emitting devices 130 and for example, is shared by all the light-emitting devices 130. The common electrode 115 shared by the plurality of light-emitting devices 130 is electrically connected to a conductive layer 123 provided in the connection portion 140 (see FIG. 2B and FIG. 2C). As the conductive layer 123, a conductive layer formed using the same material through the same steps as the pixel electrode 111 can be used.

Note that FIG. 2B illustrates an example in which the common layer 114 is provided over the conductive layer 123 and the conductive layer 123 and the common electrode 115 are electrically connected to each other through the common layer 114. The common layer 114 is not necessarily provided in the connection portion 140. For example, FIG. 2C illustrates an example in which the common layer 114 is not provided over the conductive layer 123 and the conductive layer 123 and the common electrode 115 are directly connected to each other. For example, by using a mask for specifying a film formation area (also referred to as an area mask or a rough metal mask), the common layer 114 can be formed in a region different from a region where the common electrode 115 is formed.

Figure 3A:
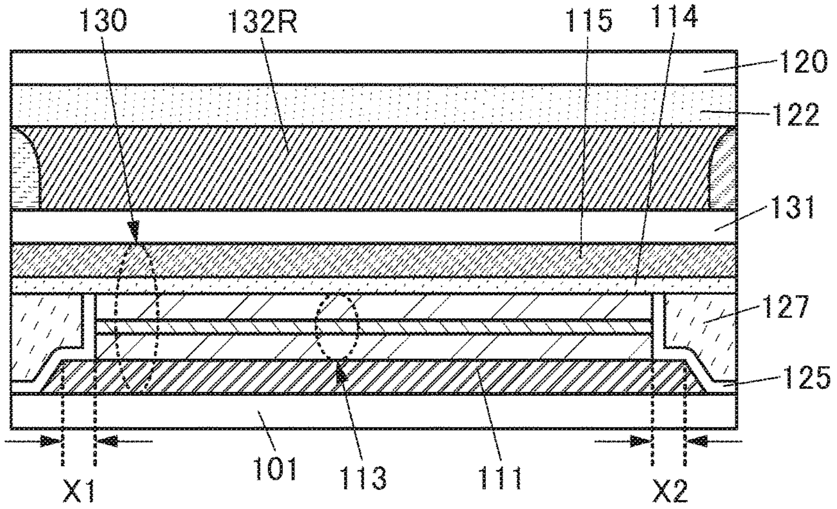
FIG. 3A to FIG. 3C are cross-sectional views each illustrating an example of a display device.
Figure 3B:
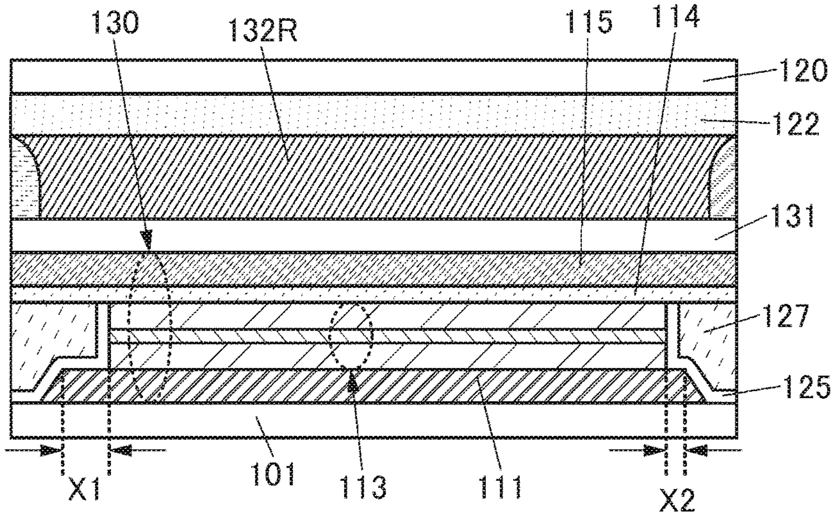

There is no particular limitation on the relationship in size between the pixel electrode 111 and the EL layer 113. FIG. 1B and FIG. 2A each illustrate an example where the end portion of the EL layer 113 is positioned inward from the end portion of the pixel electrode 111. FIG. 3A is an enlarged view of the light-emitting device illustrated in FIG. 1B and FIG. 2A. In FIG. 3A, the end portion of the EL layer 113 is positioned over the pixel electrode 111. FIG. 3A illustrates an example where the EL layer 113 is positioned on the middle of the pixel electrode 111 and a width X1 on the left side and a width X2 on the right side, which are the widths of regions where the EL layer 113 does not overlap in the pixel electrode 111, are equal or substantially equal to each other. The EL layer 113 may be positioned closer to either end portion of the pixel electrode 111. FIG. 3B illustrates an example where the EL layer 113 is positioned closer to the right end portion of the pixel electrode 111 and the width X2 is narrower than the width X1 accordingly.

Figure 3C:
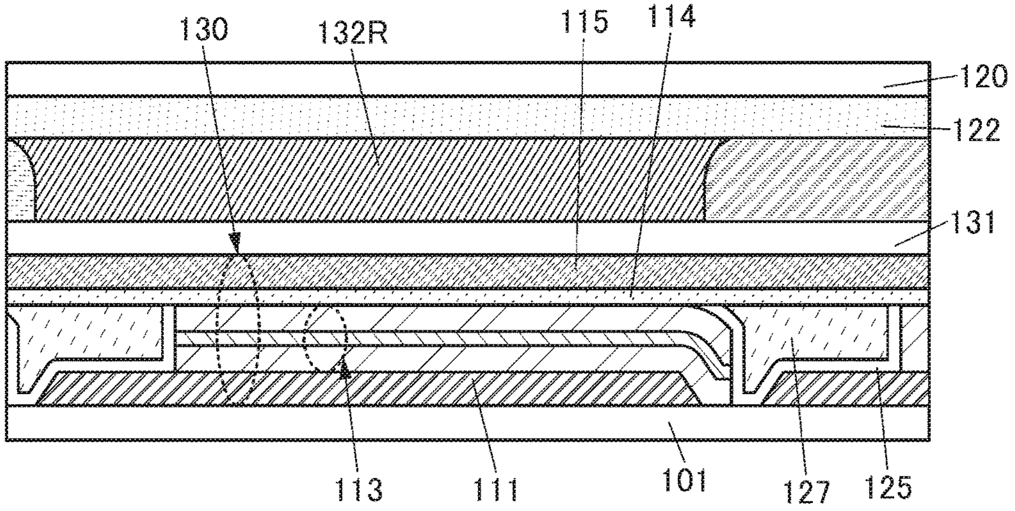

The end portion of the EL layer 113 may have both a portion positioned outward from the end portion of the pixel electrode 111 and a portion positioned inward from the end portion of the pixel electrode 111. In FIG. 3C, the end portion of the EL layer 113 is positioned outward from the end portion of the pixel electrode 111 and covers the end portion of the pixel electrode 111. Specifically, FIG. 3C illustrates an example where the left end portion of the EL layer 113 is positioned inward from the left end portion of the pixel electrode 111 and the right end portion of the EL layer 113 covers the right end portion of the pixel electrode 111.

Figure 4:
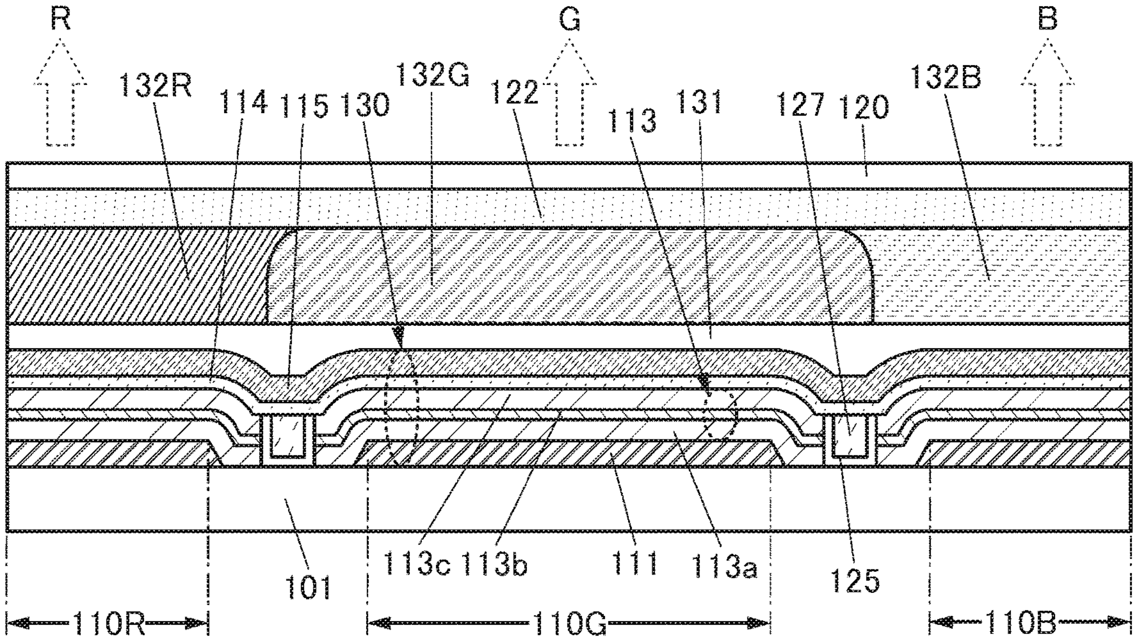
FIG. 4 is a cross-sectional view illustrating an example of a display device.

FIG. 4 illustrates an example where the end portions of the EL layer 113 are positioned outward from the end portions of the pixel electrode 111. In FIG. 4, the EL layer 113 is provided to cover the end portions of the pixel electrode 111.

The end portion of the pixel electrode 111 and the end portion of the EL layer 113 may be aligned or substantially aligned with each other.

In the case where end portions are aligned or substantially aligned with each other and the case where top surface shapes are the same or substantially the same, it can be said that outlines of stacked layers at least partly overlap with each other in a top view. For example, the case of patterning or partly patterning an upper layer and a lower layer with use of the same mask pattern is included in the expression. However, in some cases, the outlines are not completely overlapped with each other and the upper layer is positioned on an inner side of the lower layer or the upper layer is positioned on an outer side of the lower layer; such a case is also represented by the expression "end portions are aligned or substantially aligned with each other" or "top surface shapes are substantially aligned with each other".

The end portion of the pixel electrode 111 may have a tapered shape. When the side surface of the pixel electrode 111 has a tapered shape, coverage with the insulating layer 125 provided along the side surface of the pixel electrode 111 can be improved. Furthermore, when the side surface of the pixel electrode 111 has a tapered shape, a material (also referred to as dust or particles) in the manufacturing step is easily removed by processing such as cleaning, which is preferable.

The protective layer 131 is preferably provided over the light-emitting device 130. Providing the protective layer 131 can improve the reliability of the light-emitting device. The protective layer 131 may have a single-layer structure or a stacked-layer structure of two or more layers.

There is no limitation on the conductivity of the protective layer 131. As the protective layer 131, at least one type of an insulating film, a semiconductor film, and a conductive film can be used.

The protective layer 131 including an inorganic film can inhibit deterioration of the light-emitting device by preventing oxidation of the common electrode 115 and inhibiting entry of impurities (e.g., moisture and oxygen) into the light-emitting device 130, for example; thus, the reliability of the display device can be improved.

As the protective layer 131, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

The protective layer 131 preferably includes a nitride insulating film or a nitride oxide insulating film, and further preferably includes a nitride insulating film.

As the protective layer 131, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the protective layer 131, the protective layer 131 preferably has a high visible-light-transmitting property. For example, ITO, IGZO, and aluminum oxide are preferable because they are inorganic materials having a high visible-light-transmitting property.

The protective layer 131 can be, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (such as water and oxygen) into the EL layer.

Furthermore, the protective layer 131 may include an organic film. For example, the protective layer 131 may include both an organic film and an inorganic film.

The protective layer 131 may have a stacked-layer structure of two layers which are formed by different formation methods. Specifically, the first layer of the protective layer 131 may be formed by an ALD method, and the second layer of the protective layer 131 may be formed by a sputtering method.

In the subpixel 110R, the coloring layer 132R transmitting red light is provided over the protective layer 131. Thus, from the subpixel 110R, light emitted by the light-emitting device 130 is extracted as red light to the outside of the display device 100 through the coloring layer 132R. Note that the coloring layer 132R may be shared by a plurality of subpixels 110R adjacent to each other. Alternatively, the coloring layers 132R may be independently provided for each subpixel 110R.

Similarly, in the subpixel 110G, the coloring layer 132G transmitting green light is provided over the protective layer 131. Thus, from the subpixel 110G, light emitted by the light-emitting device 130 is extracted as green light to the outside of the display device 100 through the coloring layer 132G.

Also in the subpixel 110B, the coloring layer 132B transmitting blue light is provided over the protective layer 131. Thus, from the subpixel 110B, light emitted by the light-emitting device 130 is extracted as blue light to the outside of the display device 100 through the coloring layer 132B.

FIG. 1B and FIG. 2A each illustrate an example in which the coloring layers 132R, 132G, and 132B are directly provided over the light-emitting device 130 with the protective layer 131 provided therebetween. With such a structure, the alignment accuracy of the light-emitting device 130 and the coloring layer can be improved. It is preferable that the distance between the light-emitting device 130 and the coloring layer be decreased, in which case color mixing can be inhibited and the viewing angle characteristics can be improved.

Figure 5A:
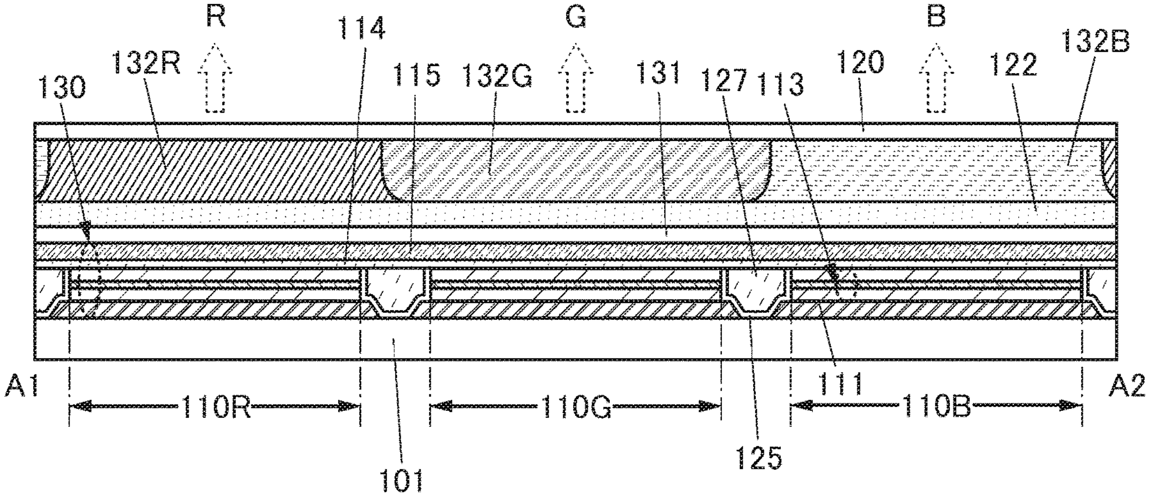
FIG. 5A to FIG. 5C are cross-sectional views each illustrating an example of a display device.

Alternatively, as illustrated in FIG. 5A, the substrate 120 provided with the coloring layers 132R, 132G, and 132B may be attached to the protective layer 131 with the resin layer 122. The coloring layers 132R, 132G, and 132B are provided on the substrate 120, whereby the heat treatment temperature in the forming step of them can be increased.

Although not illustrated, an insulating layer covering the end portion of the top surface of the pixel electrode 111 may be provided. The EL layer 113 can have a portion over and in contact with the pixel electrode 111 and a portion over and in contact with the insulating layer. The insulating layer can have a single-layer structure or a stacked-layer structure using one or both of an inorganic insulating film and an organic insulating film.

Examples of an organic insulating material that can be used for the insulating layer covering the end portion of the pixel electrode 111 include an acrylic resin, an epoxy resin, a polyimide resin, a polyamide resin, a polyimide-amide resin, a polysiloxane resin, a benzocyclobutene-based resin, and a phenol resin. As an inorganic insulating film that can be used as the insulating layer, an inorganic insulating film that can be used as the protective layer 131 can be used.

When an inorganic insulating film is used as the insulating layer covering the end portion of the pixel electrode 111, impurities are less likely to enter the light-emitting device 130 as compared with the case where an organic insulating film is used; therefore, the reliability of the light-emitting device 130 can be improved. When an organic insulating film is used as the insulating layer covering the end portion of the pixel electrode 111, a short circuit in the light-emitting device 130 can be prevented because the organic insulating film has higher step coverage and is less likely to be influenced by the shape of the pixel electrode than the inorganic insulating film. Specifically, when an organic insulating film is used as the insulating layer, the insulating layer can be processed into a tapered shape or the like. Note that in this specification and the like, a tapered shape refers to a shape such that at least part of a side surface of a component is inclined with respect to the substrate surface or the surface where the component is formed. For example, a tapered shape preferably includes a region where the angle between the inclined side surface and the substrate surface or the surface where a component is formed (such an angle is also referred to as a taper angle) is less than 90°.

The side surface of the pixel electrode 111 and the side surface of the EL layer 113 are covered with the insulating layer 125 and the insulating layer 127. Thus, the common layer 114 (or the common electrode 115) can be prevented from being in contact with the side surface of the pixel electrode 111 and the side surface of the EL layer 113, so that a short-circuit of the light-emitting device can be suppressed. Thus, the reliability of the light-emitting device can be increased.

The insulating layer 125 preferably covers at least one of the side surface of the pixel electrode 111 and the side surface of the EL layer 113, and further preferably covers both the side surface of the pixel electrode 111 and the side surface of the EL layer 113. The insulating layer 125 can be in contact with the side surface of the pixel electrode 111 and the side surface of the EL layer 113.

The insulating layer 127 is provided over the insulating layer 125 to fill a depressed portion in the insulating layer 125. The insulating layer 127 can have a structure overlapping with the side surfaces of the pixel electrode 111 and the EL layer 113 with the insulating layer 125 provided therebetween (also referred to as a structure covering the side surfaces thereof).

The insulating layer 125 and the insulating layer 127 can fill a gap between the adjacent island-shaped layers, whereby the formation surface of a layer (e.g., the common electrode) provided over the island-shaped layers can be less uneven and can be flatter. Thus, the coverage with the common electrode can be increased and disconnection of the common electrode can be prevented.

The common layer 114 and the common electrode 115 are provided over the EL layer 113, the insulating layer 125, and the insulating layer 127. Before the insulating layer 125 and the insulating layer 127 are provided, a level difference due to a region where the pixel electrode 111 and the EL layer 113 are provided and a region where neither the pixel electrode 111 nor the EL layer 113 is provided (a region between the light-emitting devices) is caused. In the display device of one embodiment of the present invention, the level difference can be planarized with the insulating layer 125 and the insulating layer 127, and the coverage with the common layer 114 and the common electrode 115 can be improved. Consequently, it is possible to inhibit a connection defect due to disconnection of the common electrode 115. Alternatively, an increase in electrical resistance, which is caused by a reduction in thickness locally of the common electrode 115 due to level difference, can be inhibited.

To improve the planarity of a surface over which the common layer 114 and the common electrode 115 are formed, the levels of the top surface of the insulating layer 125 and the top surface of the insulating layer 127 are aligned or substantially aligned with the level of the top surface of the EL layer 113 at its end portion (also referred to as the level of the end portion of the top surface of the EL layer 113). The top surface of the insulating layer 127 preferably has a flat surface; however, it may include a projecting portion, a convex curved surface, a concave curved surface, or a depressed portion.

The insulating layer 125 or the insulating layer 127 can be provided to be in contact with the island-shaped EL layer 113. When the insulating layer 125 or the insulating layer 127 is in close contact with the EL layer 113, an effect of fixing or attaching the adjacent EL layers 113 to the insulating layer 125 or the insulating layer 127 can be attained. Thus, film separation of the EL layer 113 can be prevented and the reliability of the light-emitting device can be increased. The manufacturing yield of the light-emitting device can be increased.

Note that one of the insulating layer 125 and the insulating layer 127 is not necessarily provided. For example, a single-layer insulating layer 125 using an inorganic material can be used as a protective insulating layer of the EL layer 113. In this way, the reliability of the display device can be increased. For another example, a single-layer insulating layer 127 using an organic material can fill a gap between the adjacent EL layers 113 and planarization can be performed. In this way, the coverage with the common electrode 115 (the upper electrode) formed over the EL layer 113 and the insulating layer 127 can be increased.

Figure 5B:
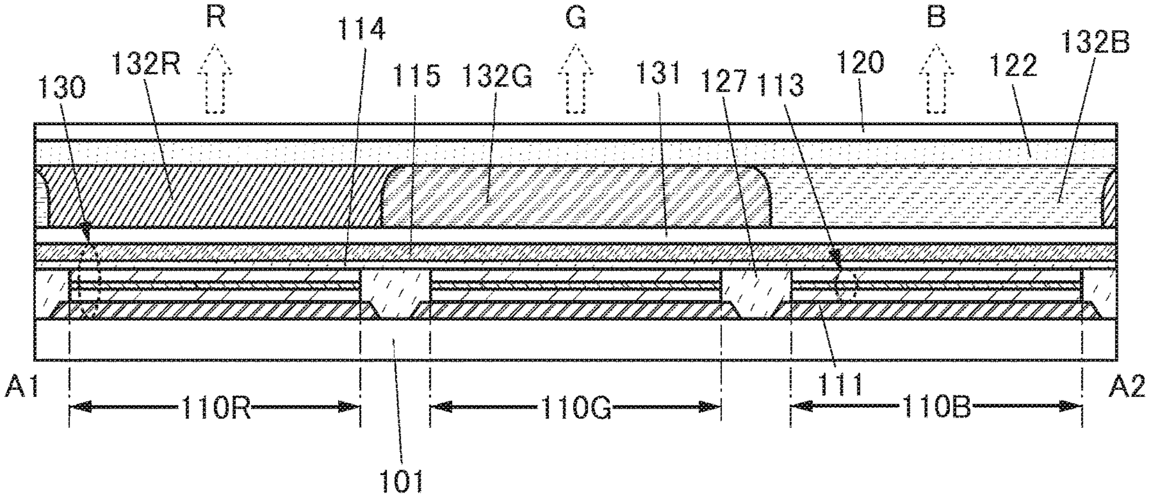

FIG. 5B illustrates an example in which the insulating layer 125 is not provided. In the case where the insulating layer 125 is not provided, the insulating layer 127 can be in contact with the side surfaces of the pixel electrode 111 and the EL layer 113. The insulating layer 127 can be provided to fill a gap between the EL layers 113 included in the respective light-emitting devices 130.

In this case, an organic material which causes less damage to the EL layer 113 is preferably used for the insulating layer 127. For example, it is preferable to use, for the insulating layer 127, an organic material such as polyvinyl alcohol (PVA), polyvinyl butyral, polyvinyl pyrrolidone, polyethylene glycol, polyglycerin, pullulan, water-soluble cellulose, or alcohol-soluble polyamide resin.

Figure 5C:
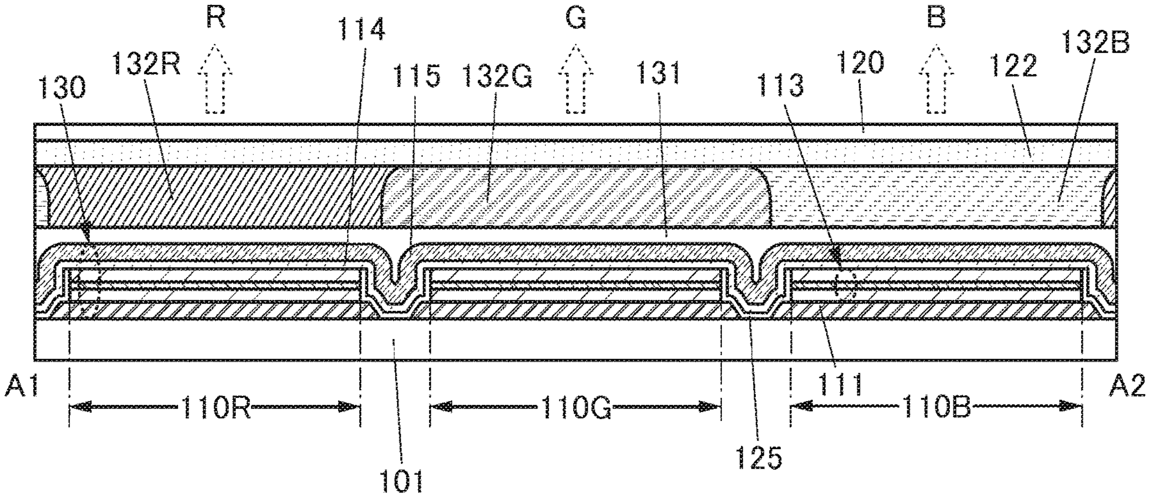

FIG. 5C illustrates an example in which the insulating layer 127 is not provided.

Note that although FIG. 5C illustrates an example in which the common layer 114 is provided in the depressed portion of the insulating layer 125, spaces may be formed in the regions.

The insulating layer 125 has a region in contact with the side surface of the EL layer 113 and functions as a protective insulating layer of the EL layer 113. With the insulating layer 125, entry of impurities (such as oxygen and moisture) from the side surface of the EL layer 113 into its inside can be inhibited, and thus a highly reliable display device can be obtained.

The insulating layer 125 can be formed using an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium-gallium-zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, aluminum oxide is preferably used because it has high selectivity with respect to the EL layer in etching and has a function of protecting the EL layer when the insulating layer 127 to be described later is formed. An inorganic insulating film such as an aluminum oxide film, a hafnium oxide film, or a silicon oxide film is formed by an ALD method as the insulating layer 125, whereby the insulating layer 125 can have few pinholes and an excellent function of protecting the EL layer. The insulating layer 125 may have a stacked-layer structure of a film formed by an ALD method and a film formed by a sputtering method. The insulating layer 125 may have a stacked-layer structure of an aluminum oxide film formed by an ALD method and a silicon nitride film formed by a sputtering method, for example.

Note that in this specification and the like, oxynitride refers to a material that contains more oxygen than nitrogen, and nitride oxide refers to a material that contains more nitrogen than oxygen. For example, silicon oxynitride refers to a material which contains oxygen at a higher proportion than nitrogen, and silicon nitride oxide refers to a material which contains nitrogen at a higher proportion than oxygen.

The insulating layer 125 preferably has a function of a barrier insulating layer against at least one of water and oxygen. Alternatively, the insulating layer 125 preferably has a function of inhibiting the diffusion of at least one of water and oxygen. Alternatively, the insulating layer 125 preferably has a function of capturing or fixing (also referred to as gettering) at least one of water and oxygen.

When the insulating layer 125 has a function of the barrier insulating layer or a gettering function, entry of impurities (typically, at least one of water and oxygen) that would diffuse into the light-emitting devices from the outside can be inhibited. With this structure, a highly reliable light-emitting device, furthermore, a highly reliable display device can be provided.

The insulating layer 125 preferably has a low impurity concentration. Accordingly, degradation of the EL layer, which is caused by entry of impurities into the EL layer from the insulating layer 125, can be inhibited. In addition, when the impurity concentration is reduced in the insulating layer 125, a barrier property against at least one of water and oxygen can be increased. For example, the insulating layer 125 preferably has one of a sufficiently low hydrogen concentration and a sufficiently low carbon concentration, desirably has both of them.

The insulating layer 125 can be formed by a sputtering method, a CVD method, a pulsed laser deposition (PLD) method, an ALD method, or the like. The insulating layer 125 is preferably formed by an ALD method achieving good coverage.

When the substrate temperature at the time when the insulating layer 125 is formed is increased, the formed insulating layer 125, even with a small thickness, can have a low impurity concentration and a high barrier property against at least one of water and oxygen. Therefore, the substrate temperature is preferably higher than or equal to 60° C., further preferably higher than or equal to 80° C., still further preferably higher than or equal to 100° C., yet still further preferably higher than or equal to 120° C. Meanwhile, the insulating layer 125 is formed after formation of an island-shaped EL layer, it is preferable that the insulating layer 125 be formed at a temperature lower than the upper temperature limit of the EL layer. Therefore, the substrate temperature is preferably lower than or equal to 200° C., further preferably lower than or equal to 180° C., still further preferably lower than or equal to 160° C., still further preferably lower than or equal to 150° C., yet still further preferably lower than or equal to 140° C.

Examples of indicators of the upper temperature limit are the glass transition point, the softening point, the melting point, the thermal decomposition temperature, and the 5% weight loss temperature. The upper temperature limit of the EL layer can be, for example, any of the above temperatures, preferably the lowest temperature thereof.

The insulating layer 127 provided over the insulating layer 125 has a function of filling the depressed portion of the insulating layer 125 formed between adjacent light-emitting devices for planarization. In other words, the insulating layer 127 brings an effect of improving the planarity of a surface where the common electrode 115 is formed. As the insulating layer 127, an insulating layer containing an organic material can be suitably used. For the insulating layer 127, an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like can be used, for example. Examples of organic materials used for the insulating layer 127 include polyvinyl alcohol (PVA), polyvinyl butyral, polyvinyl pyrrolidone, polyethylene glycol, polyglycerin, pullulan, water-soluble cellulose, and an alcohol-soluble polyamide resin. Alternatively, a photosensitive resin can be used for the insulating layer 127. A photoresist may be used for the photosensitive resin. As the photosensitive resin, a positive photosensitive material or a negative photosensitive material can be used.

The insulating layer 127 may be formed using a material absorbing visible light. When the insulating layer 127 absorbs light emitted by the light-emitting device, leakage of light (stray light) from the light-emitting device to the adjacent light-emitting device through the insulating layer 127 can be inhibited. Thus, the display quality of the display device can be improved. Since no polarizing plate is required to improve the display quality of the display device, the weight and thickness of the display device can be reduced.

Examples of the material absorbing visible light include a material containing a pigment of black or any other color, a material containing a dye, a light-absorbing resin material (e.g., polyimide), and a resin material that can be used for color filters (a color filter material). Using a resin material obtained by mixing color filter materials of two or three or more colors is particularly preferred to enhance the effect of blocking visible light. In particular, mixing color filter materials of three or more colors enables the formation of a black or nearly black resin layer.

FIG. 6A to FIG. 6F each illustrate a cross-sectional structure of a region 139 including the insulating layer 127 and its surroundings.

Figure 6A:
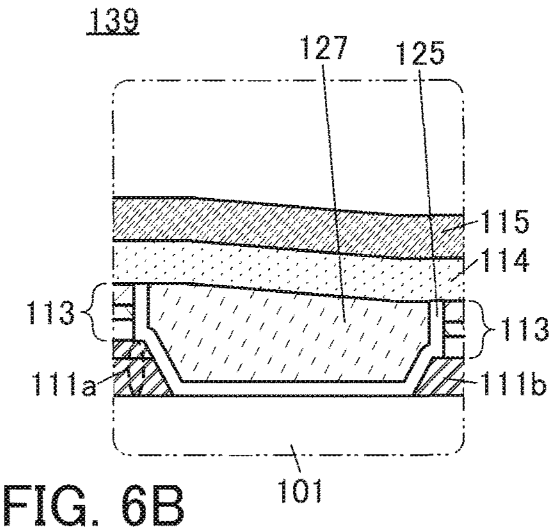
FIG. 6A to FIG. 6F are cross-sectional views each illustrating an example of a display device.

FIG. 6A illustrates an example in which the thickness of the pixel electrode differs between subpixels of different colors. FIG. 6A illustrates an example where a pixel electrode 111*a* has a two-layer structure and a pixel electrode 111*b* has a single-layer structure. Specifically, the thickness of the pixel electrode 111*a* and the thickness of the pixel electrode 111*b* are different from each other. Since EL layer 113 is formed in common between the subpixels of different colors, the thickness of EL layer 113 over the pixel electrode 111*a* and the thickness of EL layer 113 over the pixel electrode 111*b* are the same or substantially the same as each other. Therefore, the level of the top surface of the EL layer 113 over the pixel electrode 111*a* is different from that over the pixel electrode 111*b*. On both the pixel electrode 111*a* side and the pixel electrode 111*b* side, the top surface of the insulating layer 125 is at the same level or substantially the same level as that of the EL layer 113. The top surface of the insulating layer 127 has a gentle slope such that the side closer to the pixel electrode 111*a* is higher and the side closer to the pixel electrode 111*b* is lower. In this manner, the levels of the insulating layer 125 and the insulating layer 127 are preferably equal to the levels of the top surfaces of the adjacent EL layers. Alternatively, the top surface of the insulating layer 125 and the top surface of the insulating layer 127 may include a flat portion that is level with the top surface of any of adjacent EL layers.

Figure 6B:
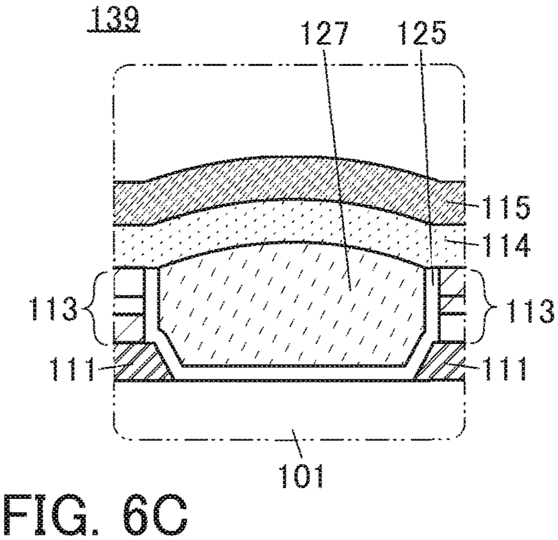

In FIG. 6B, the top surface of the insulating layer 127 has a region whose level is higher than that of top surface of the EL layer 113. As illustrated in FIG. 6B, it can be said that the top surface of the insulating layer 127 has a shape in which its center and vicinity thereof rise, i.e., a shape including a convex curved surface, in the cross-sectional view.

Figure 6C:
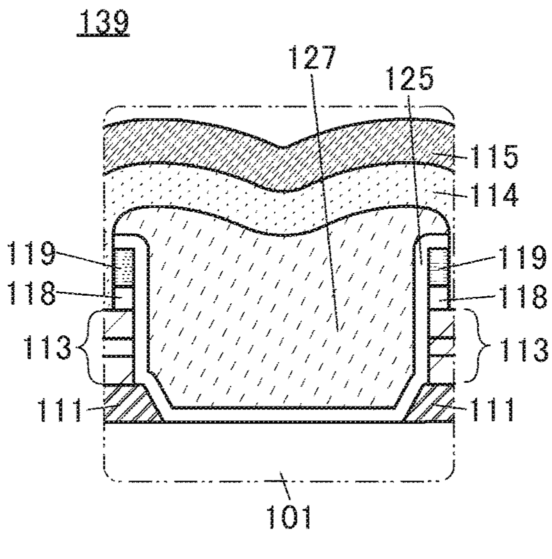

In the cross-sectional view of FIG. 6C, the top surface of the insulating layer 127 gently rises from its end portions toward the center, i.e., has convex curved surfaces, and has a depressed portion in the center and its vicinity, i.e., has a concave curved surface. The insulating layer 127 has a region whose level is higher than that of the top surface of the EL layer 113. In the region 139, the display device includes at least one of a sacrificial layer 118 and a sacrificial layer 119. The end portion of the insulating layer 125 and the end portion of the insulating layer 127 overlap with the top surface of the EL layer 113 and are positioned over at least one of the sacrificial layer 118 and the sacrificial layer 119.

Figure 6D:
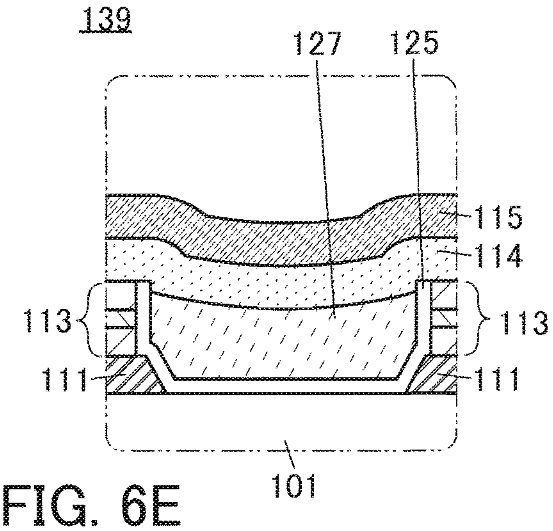

In FIG. 6D, the top surface of the insulating layer 127 includes a region whose level is lower than that of the top surface of the EL layer 113. In the cross-sectional view, the top surface of the insulating layer 127 has a depressed portion in the center and its vicinity, i.e., has a concave curved surface.

Figure 6E:
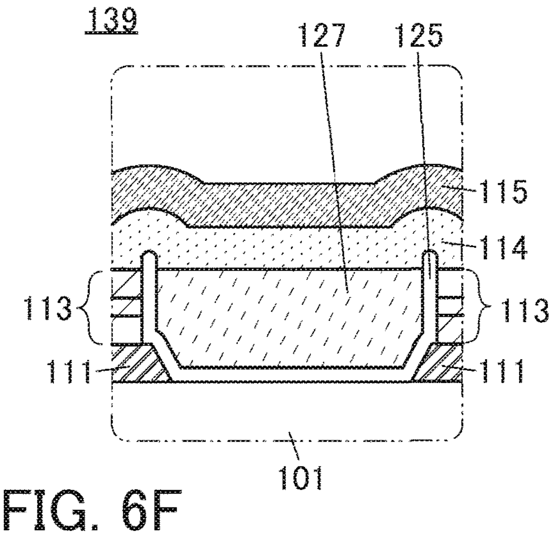

In FIG. 6E, the top surface of the insulating layer 125 has a region whose level is higher than that of top surface of the EL layer 113. That is, the insulating layer 125 protrudes from the formation surface of the common layer 114 and forms a projecting portion.

For example, when the insulating layer 125 is formed so that its level is equal to or substantially equal to the level of the sacrificial layer, the insulating layer 125 may protrude as illustrated in FIG. 6E.

Figure 6F:
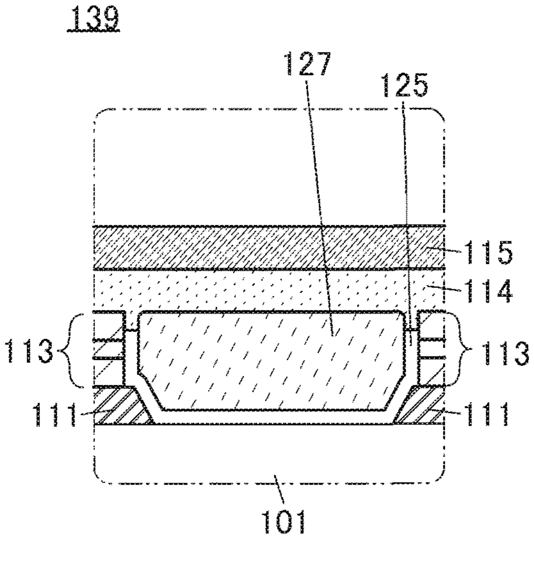

In FIG. 6F, the top surface of the insulating layer 125 includes a region whose level is lower than that of the top surface of the EL layer 113. That is, the insulating layer 125 forms a depressed portion on the formation surface of the common layer 114.

As described above, the insulating layer 125 and the insulating layer 127 can have a variety of shapes.

As the sacrificial layer, one or more kinds of inorganic films such as a metal film, an alloy film, a metal oxide film, a semiconductor film, and an inorganic insulating film can be used, for example.

For example, a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials can be used for the sacrificial layer.

For the sacrificial layer, a metal oxide such as In—Ga—Zn oxide can be used. As the sacrificial layer, an In—Ga—Zn oxide film can be formed by a sputtering method, for example. Furthermore, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like can be used. Indium tin oxide containing silicon, or the like can also be used.

In addition, in place of gallium described above, an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be used.

As the sacrificial layer, a variety of inorganic insulating films that can be used as the protective layer 131 can be used. In particular, an oxide insulating film is preferable because its adhesion to the EL layer is higher than that of a nitride insulating film. For example, an inorganic insulating material such as aluminum oxide, hafnium oxide, or silicon oxide can be used for the sacrificial layer. As the sacrificial layer, an aluminum oxide film can be formed by an ALD method, for example. The use of an ALD method is preferable, in which case damage to a base (in particular, the EL layer or the like) can be reduced. As the sacrificial layer, a silicon nitride film can be formed by a sputtering method, for example.

For example, the sacrificial layer can employ a stacked-layer structure of an inorganic insulating film (e.g., an aluminum oxide film) formed by an ALD method and an In—Ga—Zn oxide film formed by a sputtering method. Alternatively, the sacrificial layer can employ a stacked-layer structure of an inorganic insulating film (e.g., an aluminum oxide film) formed by an ALD method and an aluminum film, a tungsten film, or an inorganic insulating film (e.g., a silicon nitride film) formed by a sputtering method.

In the display device of this embodiment, the distance between the light-emitting devices can be narrowed. Specifically, the distance between the light-emitting devices, the distance between the EL layers, or the distance between the pixel electrodes can be less than 10 μm, 5 μm or less, 3 μm or less, 2 μm or less, 1 μm or less, 500 nm or less, 200 nm or less, 100 nm or less, 90 nm or less, 70 nm or less, 50 nm or less, 30 nm or less, 20 nm or less, 15 nm or less, or 10 nm or less. In other words, the display device of this embodiment includes a region where a distance between two EL layers 113 adjacent to each other is less than or equal to 1 μm, preferably less than or equal to 0.5 μm (500 nm), further preferably less than or equal to 100 nm.

A light-blocking layer may be provided on the surface of the substrate 120 on the resin layer 122 side. Moreover, a variety of optical members can be provided on the outer side of the substrate 120. Examples of optical members include a polarizing plate, a retardation plate, a light diffusion layer (e.g., a diffusion film), an anti-reflective layer, and a light-condensing film. Furthermore, an antistatic film inhibiting the attachment of dust, a water repellent film suppressing the attachment of stain, a hard coat film inhibiting generation of a scratch caused by the use, an impact-absorbing layer, or the like may be provided as a surface protective layer on the outer surface of the substrate 120. For example, it is preferable to provide, as the surface protective layer, a glass layer or a silica layer ($SiO_x$ layer) because the surface contamination or damage can be inhibited from being generated. The surface protective layer may be formed using DLC (diamond like carbon), alumina ($AlO_x$), a polyester-based material, a polycarbonate-based material, or the like. For the surface protective layer, a material having high visible-light transmittance is preferably used. The surface protective layer is preferably formed using a material with high hardness.

For the substrate 120, glass, quartz, ceramic, sapphire, a resin, a metal, an alloy, a semiconductor, or the like can be used. The substrate on the side from which light from the light-emitting device is extracted is formed using a material which transmits the light. When a flexible material is used for the substrate 120, the display devices can have increased flexibility and a flexible display can be obtained. Furthermore, a polarizing plate may be used as the substrate 120.

For the substrate 120, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used as the substrate 120.

In the case where a circularly polarizing plate overlaps with the display devices, a highly optically isotropic substrate is preferably used as the substrate included in the display devices. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of films having high optical isotropy include a triacetyl cellulose (TAC, also referred to as cellulose triacetate) film, a cycloolefin polymer (COP) film, a cycloolefin copolymer (COC) film, and an acrylic film.

When a film used as the substrate absorbs water, the shape of the display panel might be changed, e.g., creases might be caused. Thus, as the substrate, a film with a low water absorption rate is preferably used. For example, the water absorption rate of the film is preferably 1% or lower, further preferably 0.1% or lower, still further preferably 0.01% or lower.

For the resin layer 122, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

Next, materials that can be used for the light-emitting device will be described.

A conductive film transmitting visible light is used as the electrode through which light is extracted, which is either the pixel electrode or the common electrode. A conductive film reflecting visible light is preferably used as the electrode through which light is not extracted. In the case where a display device includes a light-emitting device emitting infrared light, a conductive film which transmits visible light and infrared light is used as the electrode through which light is extracted, and a conductive film reflecting visible light and infrared light is preferably used as the electrode through which light is not extracted.

A conductive film transmitting visible light may be used also for an electrode through which no light is extracted. In that case, this electrode is preferably provided between a reflective layer and the EL layer. In other words, light emitted by the EL layer may be reflected by the reflective layer to be extracted from the display device. For the reflective layer, a variety of materials reflecting visible light can be used. One or more of insulators, semiconductors, and conductors can be used for the reflective layer. The visible light reflectivity of the reflective layer is higher than or equal to 40% and lower than or equal to 100%, preferably higher than or equal to 70% and lower than or equal to 100%.

As a material that forms the pair of electrodes (the pixel electrode and the common electrode) of the light-emitting device, a metal, an alloy, an electrically conductive compound, a mixture thereof, and the like can be used as appropriate. Specific examples include an indium tin oxide (In—Sn oxide, also referred to as ITO), an In—Si—Sn oxide (also referred to as ITSO), an indium zinc oxide (In—Zn oxide), an In—W—Zn oxide, an alloy containing aluminum (an aluminum alloy) such as an alloy of aluminum, nickel, and lanthanum (Al—Ni—La), and an alloy containing silver such as an alloy of silver and magnesium and an alloy of silver, palladium, and copper (Ag—Pd—Cu, also referred to as APC). In addition, it is possible to use a metal such as aluminum (Al), magnesium (Mg), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting device preferably employs a microcavity structure. Therefore, one of the pair of electrodes of the light-emitting device is preferably an electrode having properties of transmitting and reflecting visible light (a transflective electrode), and the other is preferably an electrode having a property of reflecting visible light (a reflective electrode). When the light-emitting device has a microcavity structure, light obtained from the light-emitting layer can be resonated between the electrodes, whereby light emitted from the light-emitting device can be intensified.

The transflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light at a wavelength longer than or equal to 400 nm and shorter than 750 nm) transmittance higher than or equal to 40% is preferably used in the light-emitting device. The visible light reflectivity of the transflective electrode is higher than or equal to 10% and lower than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ Ωcm or lower.

The light-emitting layer contains a light-emitting material (also referred to as a light-emitting substance). The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of a hole-transport material and an electron-transport material can be used. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by ExTET (Exciplex-Triplet Energy Transfer), which is energy transfer from the exciplex to the light-emitting substance (phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In addition to the light-emitting layer, the EL layer 113 (or the light-emitting unit) may further include a layer containing any of a substance with a high hole-injection property, a substance with a high hole-transport property (also referred to as a hole-transport material), a hole-blocking material, a substance with a high electron-transport property (also referred to as an electron-transport material), a substance with a high electron-injection property, an electron-blocking material, a substance with a bipolar property (also referred to as a substance with a high electron- and hole-transport property or a bipolar material), and the like.

Either a low molecular compound or a high molecular compound can be used in the light-emitting device, and an inorganic compound may also be included. Each layer included in the light-emitting device can be formed by any of the following methods: an evaporation method (including a vacuum evaporation method), a transfer method, a printing method, an inkjet method, a coating method, and the like.

For example, the EL layer 113 (or the light-emitting unit) may include one or more of a hole-injection layer, a hole-transport layer, a hole-blocking layer, an electron-blocking layer, an electron-transport layer, and an electron-injection layer.

The common layer 114 can include one or more of a hole-injection layer, a hole-transport layer, a hole-blocking layer, an electron-blocking layer, an electron-transport layer, and an electron-injection layer. For example, a carrier-injection layer (a hole-injection layer or an electron-injection layer) may be formed as the common layer 114. Note that the light-emitting device 130 does not necessarily include the common layer 114.

It is preferable that an uppermost light-emitting unit in the EL layer 113 (the second light-emitting unit 113*c* in this embodiment) include a light-emitting layer and a carrier-transport layer over the light-emitting layer. Accordingly, the light-emitting layer is inhibited from being exposed on the outermost surface in the step of manufacturing the display device 100, so that damage to the light-emitting layer can be reduced. Thus, the reliability of the light-emitting device can be increased.

The hole-injection layer injects holes from the anode to the hole-transport layer and contains a substance with a high hole-injection property. Examples of a substance with a high hole-injection property include an aromatic amine compound and a composite material containing a hole-transport material and an acceptor material (electron-accepting material).

The hole-transport layer transports holes injected from the anode by the hole-injection layer, into the light-emitting layer. The hole-transport layer contains a hole-transport material. The hole-transport material preferably has a hole mobility of $1\times10^{-6}$ $cm^2/Vs$ or higher. Note that other substances can also be used as long as the substances have a hole-transport property higher than an electron-transport property. As the hole-transport material, substances with a high hole-transport property, such as a π-electron rich heteroaromatic compound (e.g., a carbazole derivative, a thiophene derivative, and a furan derivative) and an aromatic amine (a compound having an aromatic amine skeleton), are preferred.

The electron-transport layer transports electrons injected from the cathode by the electron-injection layer, into the light-emitting layer. The electron-transport layer contains an electron-transport material. The electron-transport material preferably has an electron mobility of $1\times10^{-6}$ $cm^2/Vs$ or higher. Note that other substances can also be used as long as the substances have an electron-transport property higher than a hole-transport property. As the electron-transport material, any of the following substances with a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer injects electrons from the cathode to the electron-transport layer and contains a substance with a high electron-injection property. As the substance with a high electron-injection property, an alkali metal, an alkaline earth metal, or a compound thereof can be used. As the substance with a high electron-injection property, a composite material containing an electron-transport material and a donor material (electron-donating material) can also be used.

The electron-injection layer can be formed using an alkali metal, an alkaline earth metal, or a compound thereof, such as lithium, cesium, ytterbium, lithium fluoride (LiF), cesium fluoride (CsF), calcium fluoride ($CaF_x$, where X is a given number), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide ($LiO_x$), or cesium carbonate, for example. The electron-injection layer may have a stacked-layer structure of two or more layers. In the stacked-layer structure, for example, lithium fluoride can be used for the first layer and ytterbium can be used for the second layer.

Alternatively, the electron-injection layer may be formed using an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, and a pyridazine ring), and a triazine ring.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

Moreover, the light-emitting device 130 of this embodiment has a tandem structure. Thus, a charge-generation layer is provided between two light-emitting units. The charge-generation layer includes at least a charge-generation region. The charge-generation layer has a function of injecting electrons into one of the two light-emitting units and injecting holes to the other when voltage is applied between the pair of electrodes.

As described above, the charge-generation layer includes at least a charge-generation region. The charge-generation region preferably contains an acceptor material (electron-accepting material), and for example, preferably contains a hole-transport material and an acceptor material which can be used for the above-described hole-injection layer.

The charge-generation layer preferably includes a layer containing a substance having a high electron-injection property. The layer can also be referred to as an electron-injection buffer layer. The electron-injection buffer layer is preferably provided between the charge-generation region and the electron-transport layer. By provision of the electron-injection buffer layer, an injection barrier between the charge-generation region and the electron-transport layer can be lowered; thus, electrons generated in the charge-generation region can be easily injected into the electron-transport layer.

The electron-injection buffer layer preferably contains an alkali metal or an alkaline earth metal, and for example, can contain an alkali metal compound or an alkaline earth metal compound. Specifically, the electron-injection buffer layer preferably contains an inorganic compound containing an alkali metal and oxygen or an inorganic compound containing an alkaline earth metal and oxygen, further preferably contains an inorganic compound containing lithium and oxygen (e.g., lithium oxide ($Li_2O$)). Alternatively, a material that can be used for the electron-injection layer can be used for the electron-injection buffer layer.

The charge-generation layer preferably includes a layer containing a substance having a high electron-transport property. The layer can also be referred to as an electron-relay layer. The electron-relay layer is preferably provided between the charge-generation region and the electron-injection buffer layer. In the case where the charge-generation layer does not include an electron-injection buffer layer, the electron-relay layer is preferably provided between the charge-generation region and the electron-transport layer. The electron-relay layer has a function of preventing interaction between the charge-generation region and the electron-injection buffer layer (or the electron-transport layer) and smoothly transferring electrons.

A phthalocyanine-based material such as copper(II) phthalocyanine (abbreviation: CuPc) or a metal complex having a metal-oxygen bond and an aromatic ligand is preferably used for the electron-relay layer.

Note that the charge-generation region, the electron-injection buffer layer, and the electron-relay layer cannot be clearly distinguished from each other in some cases on the basis of the cross-sectional shapes, the characteristics, or the like.

Note that the charge-generation layer may contain a donor material instead of an acceptor material. For example, the charge-generation layer may include a layer containing an electron-transport material and a donor material, which can be used for the electron-injection layer.

When the light-emitting units are stacked, provision of a charge-generation layer between two light-emitting units can suppress an increase in driving voltage.

Manufacturing Method Example of Display Device

Next, an example of a method for manufacturing the display device will be described with reference to FIG. 7 and FIG. 8. FIG. 7A to FIG. 7D and FIG. 8A to FIG. 8C each illustrate a cross-sectional view along the dashed-dotted line A1-A2 and a cross-sectional view along the dashed-dotted line C1-C2 in FIG. 1A side by side.

Thin films included in the display device (e.g., insulating films, semiconductor films, and conductive films) can be formed by a sputtering method, a chemical vapor deposition (CVD) method, a vacuum evaporation method, a pulsed laser deposition (PLD) method, an ALD method, or the like. Examples of a CVD method include a plasma-enhanced chemical vapor deposition (PECVD: Plasma Enhanced CVD) method and a thermal CVD method. An example of a thermal CVD method is a metal organic chemical vapor deposition (MOCVD: Metal Organic CVD) method.

Alternatively, thin films included in the display device (e.g., insulating films, semiconductor films, and conductive films) can be formed by a method such as spin coating, dipping, spray coating, ink-jetting, dispensing, screen printing, or offset printing or with a doctor knife, a slit coater, a roll coater, a curtain coater, or a knife coater.

Specifically, for manufacture of the light-emitting device, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, functional layers (e.g., a hole-injection layer, a hole-transport layer, a light-emitting layer, an electron-transport layer, and an electron-injection layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an inkjet method, a screen printing (stencil) method, an offset printing (planography) method, a flexography (relief printing) method, a gravure printing method, or a micro-contact printing method), or the like.

Thin films included in the display device can be processed by a photolithography method or the like. Alternatively, thin films may be processed by a nanoimprinting method, a sandblasting method, a lift-off method, or the like. Alternatively, island-shaped thin films may be directly formed by a film formation method using a shielding mask such as a metal mask.

There are two typical methods in a photolithography method. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Furthermore, instead of the light used for the exposure, an electron beam can also be used. It is preferable to use EUV, X-rays, or an electron beam because extremely minute processing can be performed. Note that a photomask is not needed when exposure is performed by scanning with a beam such as an electron beam.

For etching of thin films, a dry etching method, a wet etching method, a sandblast method, or the like can be used.

Figure 7A:
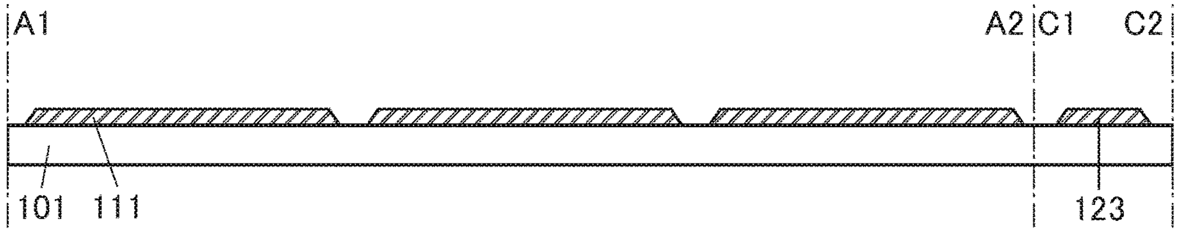
FIG. 7A to FIG. 7D are cross-sectional views illustrating an example of a method for manufacturing a display device.

First, the pixel electrode 111 and the conductive layer 123 are formed over the layer 101 including a transistor (FIG. 7A). The pixel electrode 111 can be formed by a sputtering method or a vacuum evaporation method, for example.

Figure 7B:
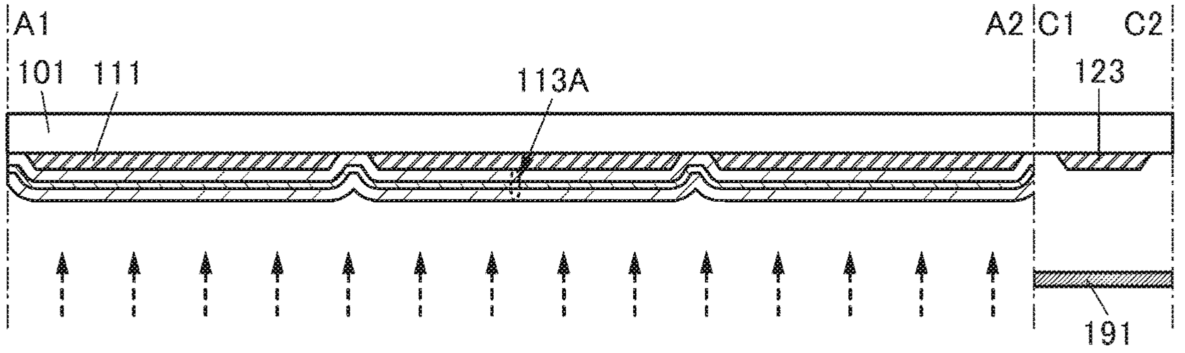

Next, an EL layer 113A that is to be the EL layer 113 later is formed over the pixel electrode 111 and the layer 101 including a transistor (FIG. 7B).

As illustrated in FIG. 7B, the EL layer 113A is not formed over the conductive layer 123 in the cross sectional view along the dashed-dotted line C1-C2. For example, a mask 191 for specifying a film formation area (also referred to as an area mask or a rough metal mask to distinguish from a fine metal mask) is used, so that the EL layer 113A can be formed only in a desired region. In one embodiment of the present invention, the light-emitting device is formed using a resist mask; with a combination of a resist mask and an area mask as described above, the light-emitting device can be formed in a relatively simple process.

The EL layer 113A can be formed by an evaporation method, specifically a vacuum evaporation method, for example. FIG. 7B illustrates a state where film formation is performed under a condition that the substrate is inverted so that a film formation surface faces downward, i.e., film formation is performed with a face-down system.

The EL layer 113A may be formed by a transfer method, a printing method, an inkjet method, a coating method, or the like.

Figure 7C:
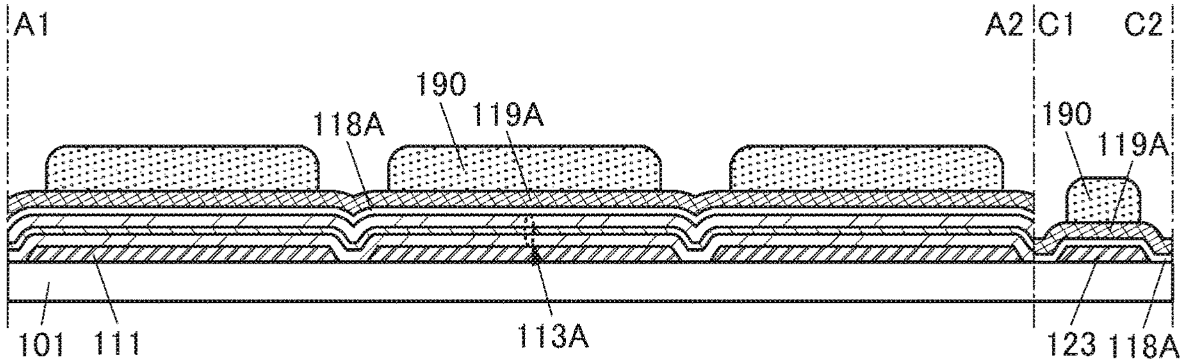

Next, over the EL layer 113A and the conductive layer 123, a sacrificial layer 118A that is to be the sacrificial layer 118 and a sacrificial layer 119A that is to be the sacrificial layer 119 are sequentially formed (FIG. 7C). For the sacrificial layer 118A and the sacrificial layer 119A, a film that is highly resistant to the process conditions for the EL layer 113A, specifically, a film having high etching selectivity with the EL layer 113A is used.

The sacrificial layer 118A and the sacrificial layer 119A can be formed by a sputtering method, an ALD method (including a thermal ALD method or a PEALD method), a CVD method, or a vacuum evaporation method, for example. The sacrificial layer 118A, which is formed over and in contact with the EL layer 113A, is preferably formed by a formation method that causes less damage to the EL layer 113A than a formation method for the sacrificial layer 119A. For example, the sacrificial layer 118A is preferably formed by an ALD method or a vacuum evaporation method rather than a sputtering method. The sacrificial layer 118A and the sacrificial layer 119A are formed at a temperature lower than the upper temperature limit of the EL layer 113A. The typical substrate temperatures in formation of the sacrificial layer 118A and the sacrificial layer 119A are each lower than or equal to 200° C., preferably lower than or equal to 150° C., further preferably lower than or equal to 120° C., still further preferably lower than or equal to 100° C., yet still further preferably lower than or equal to 80° C.

The sacrificial layer 118A and the sacrificial layer 119A are preferably films that can be removed by a wet etching method. The use of a wet etching method can reduce damage to the EL layer 113A in processing of the sacrificial layer 118A and the sacrificial layer 119A, compared to the case of using a dry etching method.

The sacrificial layer 118A is preferably a film having high etching selectivity with the sacrificial layer 119A.

In the method for manufacturing the display device of this embodiment, it is preferred that the layers included in the EL layer (e.g., the hole-injection layer, the hole-transport layer, the light-emitting layer, and the electron-transport layer) not be easily processed in the step of processing the sacrificial layers, and that the sacrificial layers not be easily processed in the steps of processing the layers included in the EL layer. In consideration of the above, the materials and a processing method for the sacrificial layers and processing methods for the EL layer are preferably selected.

Although this embodiment describes an example in which the sacrificial layer is formed with a two-layer structure of the sacrificial layer 118A and the sacrificial layer 119A, the sacrificial layer may have a single-layer structure or a stacked-layer structure of three or more layers.

As the sacrificial layer 118A and the sacrificial layer 119A, it is preferable to use an inorganic film such as a metal film, an alloy film, a metal oxide film, a semiconductor film, an organic insulating film, or an inorganic insulating film, for example.

For the sacrificial layer 118A and the sacrificial layer 119A, it is preferable to use a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials, for example. It is particularly preferable to use a low-melting-point material such as aluminum or silver. The use of a metal material capable of blocking ultraviolet light for one or both of the sacrificial layer 118A and the sacrificial layer 119A is preferable, in which case the EL layer can be inhibited from being irradiated with ultraviolet light and deteriorating.

For the sacrificial layer 118A and the sacrificial layer 119A, a metal oxide such as In—Ga—Zn oxide can be used. As the sacrificial layer 118A or the sacrificial layer 119A, an In—Ga—Zn oxide film can be formed by a sputtering method, for example. Furthermore, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like can be used. Indium tin oxide containing silicon, or the like can also be used.

In addition, in place of gallium described above, an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be used.

As the sacrificial layer 118A and the sacrificial layer 119A, a variety of inorganic insulating films that can be used as the protective layer 131 can be used. In particular, an oxide insulating film is preferable because its adhesion to the EL layer is higher than that of a nitride insulating film. For example, an inorganic insulating material such as aluminum oxide, hafnium oxide, or silicon oxide can be used for the sacrificial layer 118A and the sacrificial layer 119A. As the sacrificial layer 118A or the sacrificial layer 119A, an aluminum oxide film can be formed by an ALD method, for example. The use of an ALD method is preferable, in which case damage to a base (in particular, the EL layer or the like) can be reduced.

For example, an inorganic insulating film (e.g., an aluminum oxide film) formed by an ALD method can be used as the sacrificial layer 118A, and an inorganic film (e.g., an In—Ga—Zn oxide film, an aluminum film, or a tungsten film) formed by a sputtering method can be used as the sacrificial layer 119A.

Note that the same inorganic insulating film can be used for both the sacrificial layer 118A and the insulating layer 125 that is to be formed later. For example, an aluminum oxide film formed by an ALD method can be used for both the sacrificial layer 118A and the insulating layer 125. Here, for the sacrificial layer 118A and the insulating layer 125, the same film-formation condition may be used or different film-formation conditions may be used. For example, when the sacrificial layer 118A is formed under conditions similar to those of the insulating layer 125, the sacrificial layer 118A can be an insulating layer having a high barrier property against at least one of water and oxygen. Meanwhile, since the sacrificial layer 118A is a layer almost or all of which is to be removed in a later step, it is preferable that the processing of the sacrificial layer 118A be easy. Therefore, the sacrificial layer 118A is preferably formed with a substrate temperature lower than that for formation of the insulating layer 125.

An organic material may be used for one or both of the sacrificial layer 118A and the sacrificial layer 119A. For example, a material dissolvable in a solvent that is chemically stable with respect to at least a film on the outermost side of the EL layer 113A may be used as the organic material. Specifically, a material that will be dissolved in water or alcohol can be suitably used. In forming a film of such a material, it is preferable to apply the material dissolved in a solvent such as water or alcohol by a wet film formation method and then perform heat treatment for evaporating the solvent. At this time, the heat treatment is preferably performed in a reduced-pressure atmosphere, in which case the solvent can be removed at a low temperature in a short time and thermal damage to the EL layer can be reduced accordingly.

The sacrificial layer 118A and the sacrificial layer 119A may be formed by a wet film formation method such as spin coating, dipping, spray coating, ink-jetting, dispensing, screen printing, offset printing, doctor blade coating, slit coating, roll coating, curtain coating, or knife coating.

The sacrificial layer 118A and the sacrificial layer 119A may be formed using an organic resin such as polyvinyl alcohol (PVA), polyvinyl butyral, polyvinylpyrrolidone, polyethylene glycol, polyglycerin, pullulan, water-soluble cellulose, or an alcohol-soluble polyamide resin. A fluorine resin such as perfluoropolymer may be used for the sacrificial layer 118A and the sacrificial layer 119A.

For example, an organic film (e.g., a PVA film) formed by an evaporation method or any of the above wet film formation method can be used as the sacrificial layer 118A, and an inorganic film (e.g., a silicon nitride film) formed by a sputtering method can be used as the sacrificial layer 119A.

Next, a resist mask 190 is formed over the sacrificial layer 119A (FIG. 7C). The resist mask 190 can be formed by application of a photosensitive resin (photoresist), exposure, and development.

The resist mask may be formed using either a positive resist material or a negative resist material.

The resist mask 190 is provided at a position overlapping with the pixel electrode 111. As the resist mask 190, one island-shaped pattern is preferably provided for one subpixel.

Note that the resist mask 190 is preferably provided also at a position overlapping with the conductive layer 123. This can inhibit the conductive layer 123 from being damaged during the step of manufacturing the display device. Note that the resist mask 190 is not necessarily provided over the conductive layer 123.

Figure 7D:
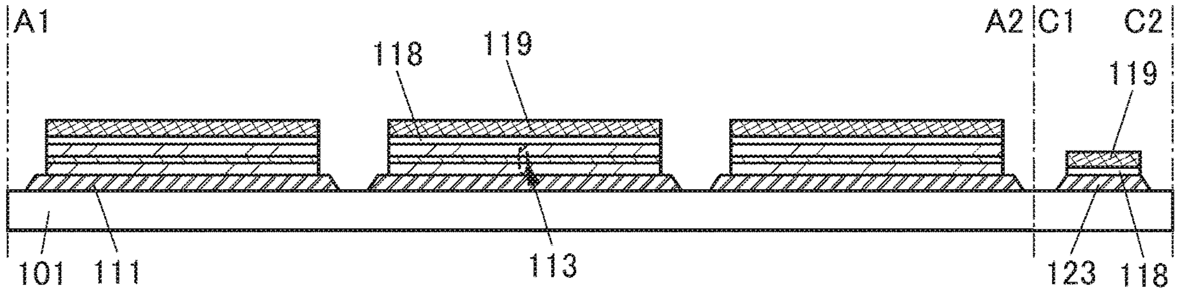

Next, part of the sacrificial layer 119A is removed with use of the resist mask 190, so that the sacrificial layer 119 is formed (FIG. 7D). The sacrificial layer 119 partly remains over the pixel electrode 111 and the conductive layer 123.

In the etching of the sacrificial layer 119A, an etching condition with high selectivity is preferably employed so that the sacrificial layer 118A is not removed by the etching. Since the EL layer 113A is not exposed in processing the sacrificial layer 119A, the range of choices of the processing method is wider than that for processing the sacrificial layer 118A. Specifically, deterioration of the EL layer 113A can be further inhibited even when a gas containing oxygen is used as an etching gas for processing the sacrificial layer 119A.

After that, the resist mask 190 is removed. The resist mask 190 can be removed by ashing using oxygen plasma or the like, for example. Alternatively, an oxygen gas and any of $CF_4$, $C_4F_8$, $SF_6$, $CHF_3$, $Cl_2$, $H_2O$, $BCl_3$, or a noble gas (also referred to as a rare gas) such as He. Alternatively, the resist mask 190 may be removed by wet etching method. At this time, the sacrificial layer 118A is positioned on the outermost surface, and the EL layer 113A is not exposed; thus, the EL layer 113A can be inhibited from being damaged in the step of removing the resist mask 190. In addition, the range of choices of the method for removing the resist mask 190 can be widened.

Next, part of the sacrificial layer 118A is removed with use of the sacrificial layer 119 as a mask (also referred to as hard mask) to form the sacrificial layer 118 (FIG. 7D).

The sacrificial layer 118A and the sacrificial layer 119A can be processed by a wet etching method or a dry etching method. The sacrificial layer 118A and the sacrificial layer 119A are preferably processed by anisotropic etching.

The use of a wet etching method can reduce damage to the EL layer 113A in processing of the sacrificial layer 118A and the sacrificial layer 119A, compared to the case of using a dry etching method. In the case of using a wet etching method, it is preferable to use a developer, a tetramethylammonium hydroxide (TMAH) aqueous solution, dilute hydrofluoric acid, oxalic acid, phosphoric acid, acetic acid, nitric acid, or a chemical solution containing a mixed solution of any of these acids, for example.

In the case of using a dry etching method, deterioration of the EL layer 113A can be inhibited by not using a gas containing oxygen as the etching gas. In the case of using a dry etching method, it is preferable to use a gas containing $CF_4$, $C_4F_8$, $SF_6$, $CHF_3$, $Cl_2$, $H_2O$, or $BCl_3$ or a noble gas (also referred to as a rare gas) such as He as the etching gas, for example.

For example, when an aluminum oxide film formed by an ALD method is used as the sacrificial layer 118A, the sacrificial layer 118A can be processed by a dry etching method using $CHF_3$ and He. In the case where an In—Ga—Zn oxide film formed by a sputtering method is used as the sacrificial layer 119A, the sacrificial layer 119A can be processed by a wet etching method using a diluted phosphoric acid. Alternatively, the sacrificial layer 119A may be processed by a dry etching method using $CH_4$ and Ar. Alternatively, the sacrificial layer 119A can be processed by a wet etching method using a diluted phosphoric acid. When a tungsten film formed by a sputtering method is used as the sacrificial layer 119A, the sacrificial layer 119A can be processed by a dry etching method using a combination of $SF_6$, $CF_4$, and $O_2$ or a combination of $CF_4$, $Cl_2$, and $O_2$.

Next, the EL layer 113A is processed to form the EL layer 113. For example, part of the EL layer 113A is removed with use of the sacrificial layer 119 and the sacrificial layer 118 as a hard mask to form the EL layer 113 (FIG. 7D).

As illustrated in FIG. 7D, the EL layer 113A is processed, whereby the plurality of EL layers 113 can be formed. That is, the EL layer 113A can be divided into the plurality of EL layers 113. Note that the EL layer 113A is not necessarily divided in either the row direction or the column direction. In that case, the EL layer 113 can have a belt-like shape.

The EL layer 113A is preferably processed by anisotropic etching. In particular, an anisotropic dry etching method is preferably used. Alternatively, a wet etching method may be used.

In the case of using a dry etching method, deterioration of the EL layer 113A can be inhibited by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Thus, damage to the EL layer 113A can be inhibited. Furthermore, a defect such as attachment of a reaction product generated at the etching can be inhibited.

In the case of using a dry etching method, it is preferable to use a gas containing at least one of $H_2$, $CF_4$, $C_4F_8$, $SF_6$, $CHF_3$, $Cl_2$, $H_2O$, $BCl_3$, and a noble gas (also referred to as a rare gas) such as He and Ar as the etching gas, for example. Alternatively, a gas containing oxygen and at least one of the above is preferably used as the etching gas. Alternatively, an oxygen gas may be used as the etching gas. Specifically, for example, a gas containing $H_2$ and Ar or a gas containing $CF_4$ and He can be used as the etching gas. As another example, a gas containing $CF_4$, He, and oxygen can be used as the etching gas.

As described above, in one embodiment of the present invention, the sacrificial layer 119 is formed in the following manner: the resist mask 190 is formed over the sacrificial layer 119A; and part of the sacrificial layer 119A is removed with use of the resist mask 190. After that, part of the EL layer 113A is removed with use of the sacrificial layer 119 as a hard mask, so that the EL layer 113 is formed. Thus, the EL layer 113 can be formed by processing the EL layer 113A with a photolithography method. Note that part of the EL layer 113A may be removed using the resist mask 190. Then, the resist mask 190 may be removed.

Each subpixel includes the island-shaped EL layer 113, which can inhibit generation of leakage current between the subpixels. Accordingly, degradation of the display quality of the display device can be inhibited. In addition, both the higher resolution and higher display quality of the display device can be achieved.

Figure 8A:
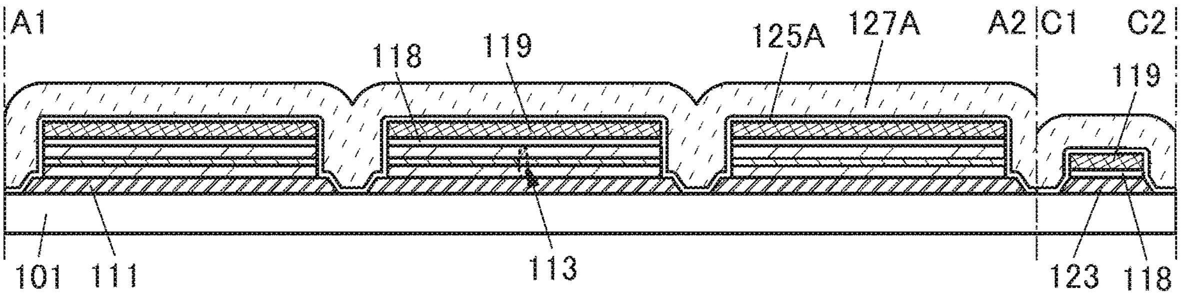
FIG. 8A to FIG. 8C are cross-sectional views illustrating an example of a method for manufacturing a display device.

Next, an insulating film 125A that is to be the insulating layer 125 later is formed to over the pixel electrode 111, the EL layer 113, the sacrificial layer 118, and the sacrificial layer 119 (FIG. 8A).

As the insulating film 125A, an insulating film is preferably formed at a substrate temperature higher than or equal to 60° C., higher than or equal to 80° C., higher than or equal to 100° C., or higher than or equal to 120° C. and lower than or equal to 200° C., lower than or equal to 180° C., lower than or equal to 160° C., lower than or equal to 150° C., or lower than or equal to 140° C. to have a thickness greater than or equal to 3 nm, greater than or equal to 5 nm, or greater than or equal to 10 nm and less than or equal to 200 nm, less than or equal to 150 nm, less than or equal to 100 nm, or less than or equal to 50 nm, for example.

As the insulating film 125A, an aluminum oxide film is preferably formed by an ALD method, for example.

Then, an insulating film 127A is formed over the insulating film 125A (FIG. 8A). A photosensitive material, for example, a photosensitive resin, can be used for the insulating film 127A. For example, the insulating film 127A can be formed by a wet film formation method such as spin coating, dipping, spray coating, ink-jetting, dispensing, screen printing, offset printing, doctor blade coating, slit coating, roll coating, curtain coating, or knife coating. Specifically, an organic insulating film that is to be the insulating layer 127 is preferably formed by spin coating.

The insulating film 125A and the insulating film 127A are preferably formed by a formation method by which the EL layer 113 is less damaged. In particular, the insulating film 125A, which is formed in contact with the side surface of the EL layer 113 is preferably formed by a formation method that causes less damage to the EL layer 113 than the method of forming the insulating film 127A. The insulating film 125A and the insulating film 127A are each formed at a temperature lower than the upper temperature limit of the EL layer 113. The typical substrate temperatures in formation of the insulating film 125A and the insulating film 127A are each lower than or equal to 200° C., preferably lower than or equal to 180° C., further preferably lower than or equal to 160° C., still further preferably lower than or equal to 150° C., yet still further preferably lower than or equal to 140° C. As the insulating film 125A, an aluminum oxide film can be formed by an ALD method, for example. The use of an ALD method is preferable, in which case damage by the film formation is reduced and a film with good coverage can be formed.

Figure 8B:
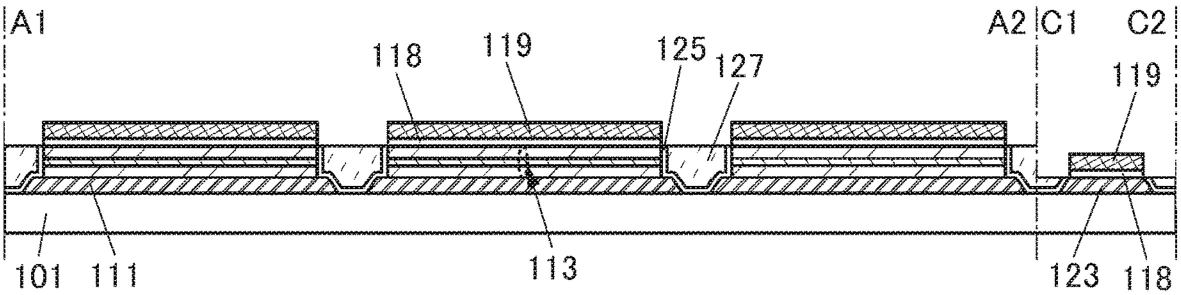

Next, the insulating film 127A is processed to form the insulating layer 127 (FIG. 8B). For example, in the case where a photosensitive material is used for the insulating film 127A, exposure and development are performed on the insulating film 127A, whereby the insulating layer 127 can be formed. Etching may be performed so that the surface level of the insulating layer 127 is adjusted. The insulating layer 127 may be processed by ashing using oxygen plasma, for example.

Next, at least part of the insulating film 125A is removed, so that the insulating layer 125 is formed (FIG. 8B).

The insulating film 125A is preferably processed by a dry etching method. The insulating film 125A is preferably processed by anisotropic etching. The insulating film 125A can be processed using an etching gas that can be used for processing the sacrificial layer.

After that, the sacrificial layer 119 and the sacrificial layer 118 are removed. Accordingly, at least part of the top surface of the EL layer 113 and the top surface of the conductive layer 123 are exposed.

For the removal of the sacrificial layer, a wet etching method is preferably used. With this method, damage given to the EL layer 113 in removal of the sacrificial layer can be reduced as compared to the case where the sacrificial layer is removed by a dry etching method, for example.

The sacrificial layer may be removed by being dissolved in a solvent such as water or alcohol. Examples of alcohol include ethyl alcohol, methyl alcohol, isopropyl alcohol (IPA), and glycerin.

After the sacrificial layers are removed, drying treatment may be performed to remove water included in the EL layer and water adsorbed on the surface of the EL layer. For example, heat treatment in an inert gas atmosphere or a reduced-pressure atmosphere can be performed. The heat treatment can be performed with a substrate temperature higher than or equal to 50° C. and lower than or equal to 200° C., preferably higher than or equal to 60° C. and lower than or equal to 150° C., further preferably higher than or equal to 70° C. and lower than or equal to 120° C. Employing a reduced-pressure atmosphere is preferable, in which case drying at a lower temperature is possible.

Next, the common layer 114 is formed over the insulating layer 125, the insulating layer 127, and the EL layer 113. Then, the common electrode 115 is formed over the common layer 114 (FIG. 8C).

The common layer 114 can be formed by an evaporation method (including a vacuum evaporation method), a transfer method, a printing method, an inkjet method, a coating method, or the like. As described above, the common layer 114 can include an electron-injection layer or a hole-injection layer, for example.

The common electrode 115 can be formed by a sputtering method or a vacuum evaporation method, for example. Alternatively, the common electrode 115 may be a stack of a film formed by an evaporation method and a film formed by a sputtering method.

Figure 8C:
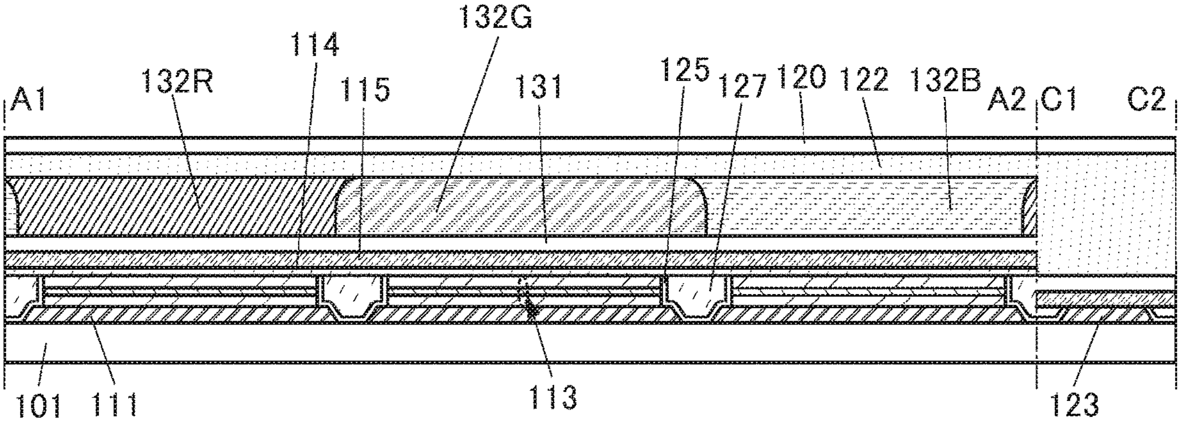

Next, the protective layer 131 is formed over the common electrode 115, and the coloring layers 132R, 132G, and 132B are formed over the protective layer 131 (FIG. 8C). In addition, the substrate 120 is bonded onto the protective layer 131 and the coloring layers with the resin layer 122, whereby the display device 100 illustrated in FIG. 1B and FIG. 2C can be manufactured.

Examples of methods for forming the protective layer 131 include a vacuum evaporation method, a sputtering method, a CVD method, and an ALD method. The protective layer 131 may have a single-layer structure or a stacked-layer structure.

[Pixel Layout]

Pixel layouts different from the layout in FIG. 1A will be mainly described below. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Examples of a top surface shape of the subpixel include polygons such as a triangle, a tetragon (including a rectangle and a square), and a pentagon; polygons with rounded corners; an ellipse; and a circle. Here, the top surface shape of the subpixel corresponds to the top surface shape of a light-emitting region of the light-emitting device.

Figure 9A:
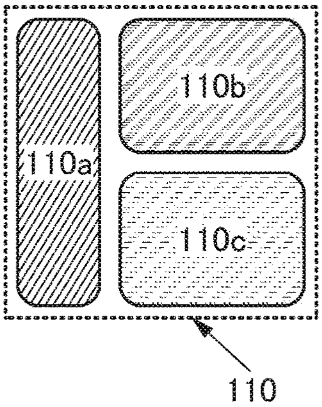
FIG. 9A to FIG. 9F are top views each illustrating an example of a pixel.
Figure 11A:
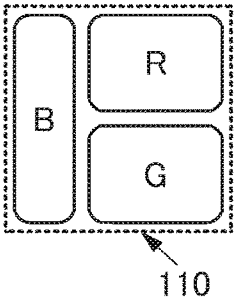
FIG. 11A to FIG. 11J are top views each illustrating an example of a pixel.

The pixel 110 illustrated in FIG. 9A employs S-stripe arrangement. The pixel 110 illustrated in FIG. 9A is composed of three subpixels 110*a*, 110*b*, and 110*c*. For example, as illustrated in FIG. 11A, the subpixel 110*a* may be a blue subpixel B, the subpixel 110*b* may be a red subpixel R, and the subpixel 110*c* may be a green subpixel G.

Figure 9B:
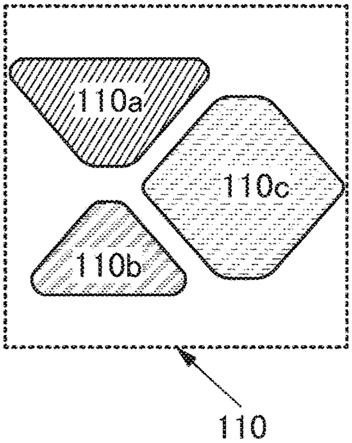
Figure 11B:
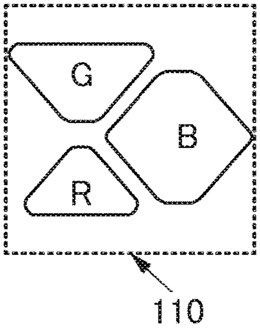

The pixel 110 illustrated in FIG. 9B includes the subpixel 110*a* whose top surface has a rough trapezoidal shape with rounded corners, the subpixel 110*b* whose top surface has a rough triangle shape with rounded corners, and the subpixel 110*c* whose top surface has a rough tetragonal or rough hexagonal shape with rounded corners. The subpixel 110*a* has a larger light-emitting area than the subpixel 110*b*. In this manner, the shapes and sizes of the subpixels can be determined independently. For example, the size of a subpixel including a light-emitting device with higher reliability can be smaller. For example, as illustrated in FIG. 11B, the subpixel 110*a* may be the green subpixel G, the subpixel 110*b* may be the red subpixel R, and the subpixel 110*c* may be the blue subpixel B.

Figure 9C:
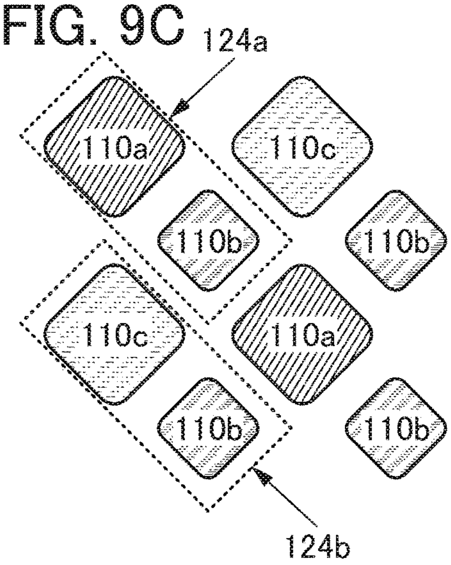
Figure 11C:
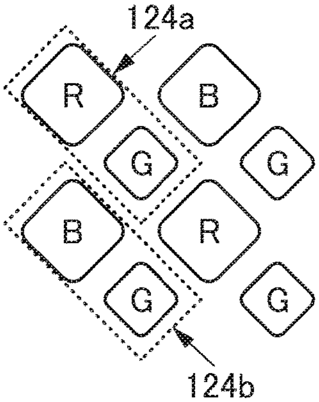

Pixels 124*a* and 124*b* illustrated in FIG. 9C employ pentile arrangement. FIG. 9C illustrates an example where the pixels 124*a* including the subpixel 110*a* and the subpixel 110*b* and the pixels 124*b* including the subpixel 110*b* and the subpixel 110*c* are alternately arranged. For example, as illustrated in FIG. 11C, the subpixel 110*a* may be the red subpixel R, the subpixel 110*b* may be the green subpixel G, and the subpixel 110*c* may be the blue subpixel B.

Figure 9D:
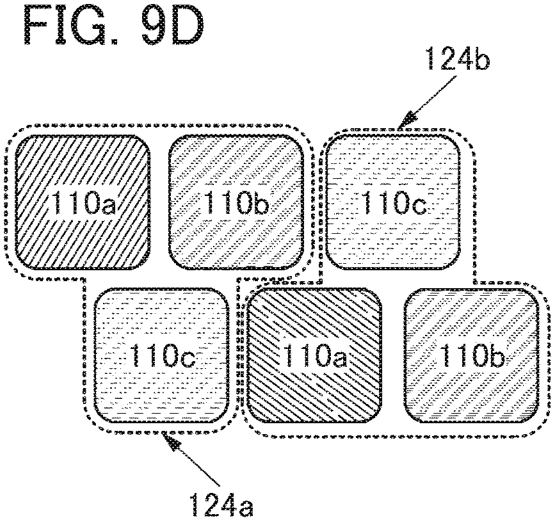
Figure 9E:
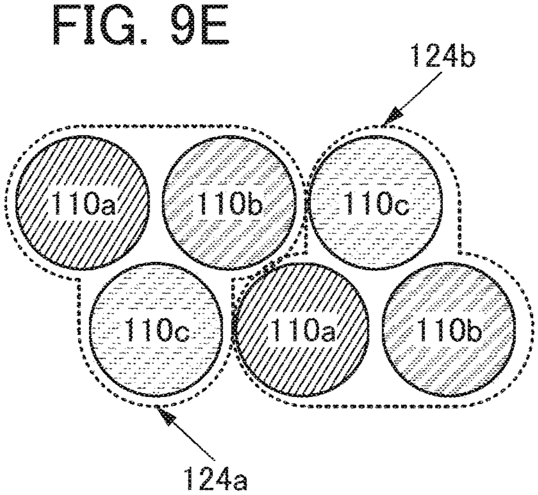
Figure 11D:
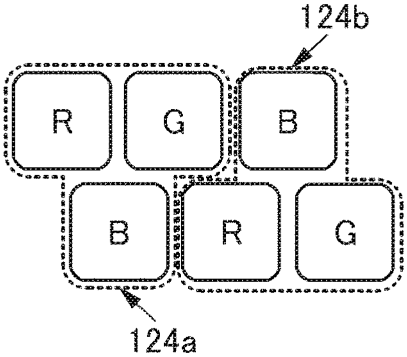

The pixels 124*a* and 124*b* illustrated in FIG. 9D and FIG. 9E employ delta arrangement. The pixel 124*a* includes two subpixels (the subpixels 110*a* and 110*b*) in the upper row (first row) and one subpixel (the subpixel 110*c*) in the lower row (second row). The pixel 124*b* includes one subpixel (the subpixel 110*c*) in the upper row (first row) and two subpixels (the subpixels 110*a* and 110*b*) in the lower row (second row). For example, as illustrated in FIG. 11D, the subpixel 110*a* may be the red subpixel R, the subpixel 110*b* may be the green subpixel G, and the subpixel 110*c* may be the blue subpixel B.

FIG. 9D is an example where each subpixel has a rough quadrangular top surface shape with rounded corners, and FIG. 9E is an example where each subpixel has a circular top surface shape.

Figure 9F:
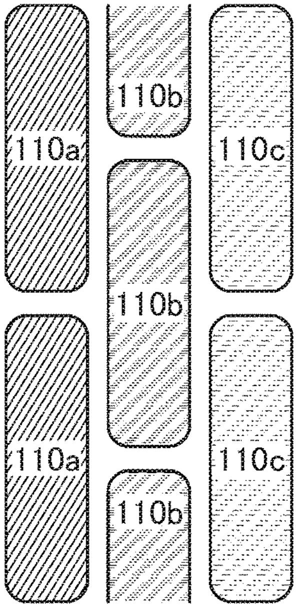
Figure 11E:
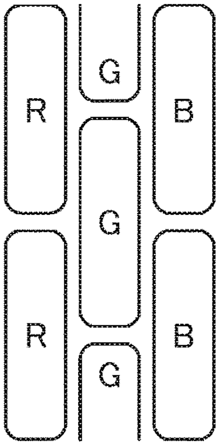

FIG. 9F illustrates an example where subpixels of different colors are arranged in a zigzag manner. Specifically, the positions of the top sides of two subpixels arranged in the column direction (e.g., the subpixel 110*a* and the subpixel 110*b* or the subpixel 110*b* and the subpixel 110*c*) are not aligned in the top view. For example, as illustrated in FIG. 11E, the subpixel 110*a* may be the red subpixel R, the subpixel 110*b* may be the green subpixel G, and the subpixel 110*c* may be the blue subpixel B.

In a photolithography method, as a pattern to be processed becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel can have a polygonal shape with rounded corners, an elliptical shape, a circular shape, or the like.

Furthermore, in the method of manufacturing the display device of one embodiment of the present invention, the EL layer is processed into an island shape with the use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape by processing. As a result, the top surface of the EL layer may have a polygonal shape with rounded corners, an elliptical shape, a circular shape, or the like. For example, when a resist mask with a square top surface is intended to be formed, a resist mask with a circular top surface may be formed, and the top surface of the EL layer may be circular.

To obtain a desired top surface shape of the EL layer, a technique of correcting a mask pattern in advance so that a design pattern agrees with a transferred pattern (an OPC (Optical Proximity Correction) technique) may be used. Specifically, with the OPC technique, a pattern for correction is added to a corner portion or the like of a figure on a mask pattern.

Figure 11F:
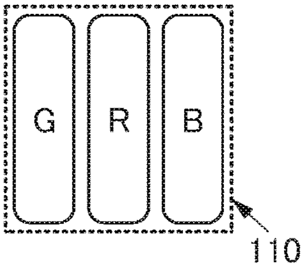
Figure 11G:
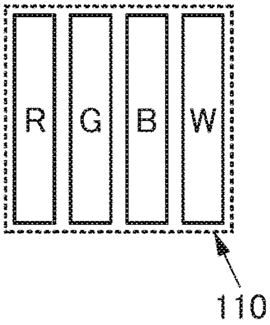
Figure 11H:
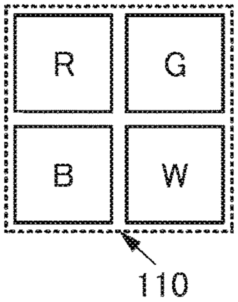
Figure 11I:
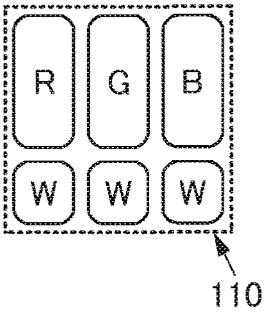
Figure 11J:
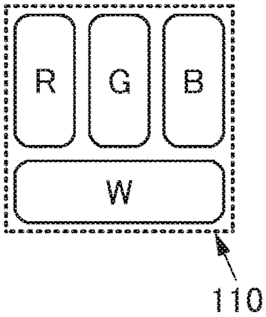

Also in the pixel 110 illustrated in FIG. 1A, which employs stripe arrangement, there is no limitation on the arrangement order of the subpixels; for example, the red subpixel R, the green subpixel G, and the blue subpixel B may be arranged in this order as illustrated in FIG. 11F.

As illustrated in FIG. 10A to FIG. 10H, the pixel can include four types of subpixels.

Figure 10A:
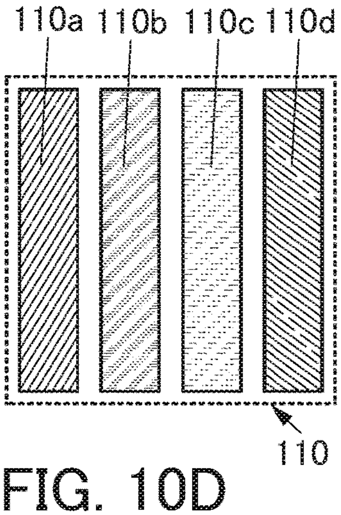
FIG. 10A to FIG. 10H are top views each illustrating an example of a pixel.
Figure 10B:
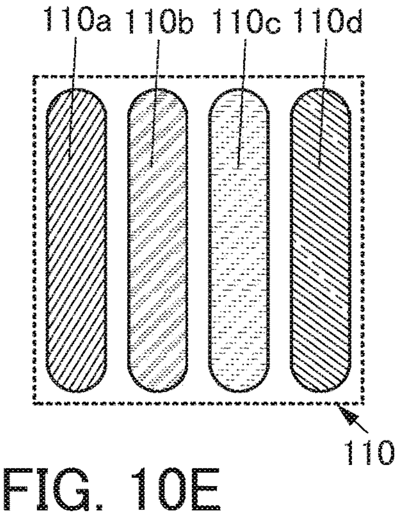
Figure 10C:
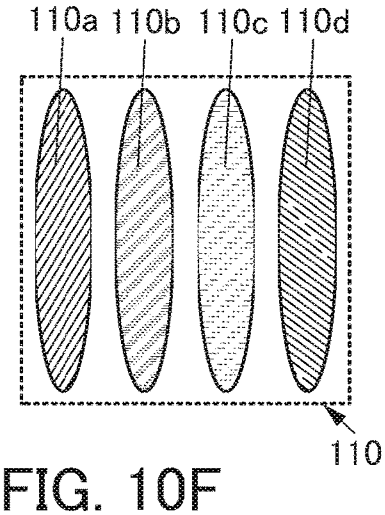

The pixels 110 illustrated in FIG. 10A to FIG. 10C employ stripe arrangement.

FIG. 10A illustrates an example where each subpixel has a rectangular top surface shape, FIG. 10B illustrates an example where each subpixel has a top surface shape formed by combining two half circles and a rectangle, and FIG. 10C illustrates an example where each subpixel has an elliptical top surface shape.

Figure 10D:
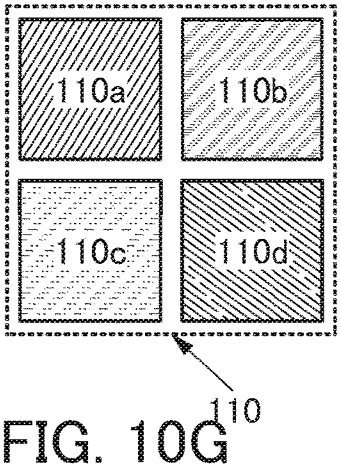
Figure 10E:
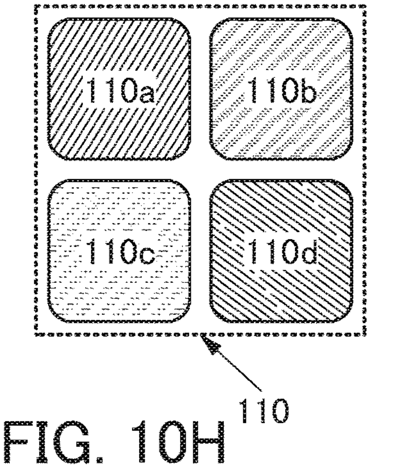
Figure 10F:
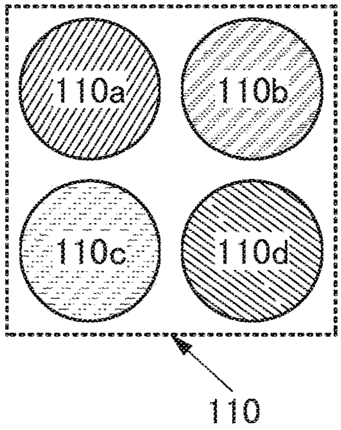

The pixels 110 illustrated in FIG. 10D to FIG. 10F employ matrix arrangement.

FIG. 10D illustrates an example where each subpixel has a square top surface shape, FIG. 10E illustrates an example where each subpixel has a substantially square top surface shape with rounded corners, and FIG. 10F illustrates an example where each subpixel has a circular top surface shape.

Figure 10G:
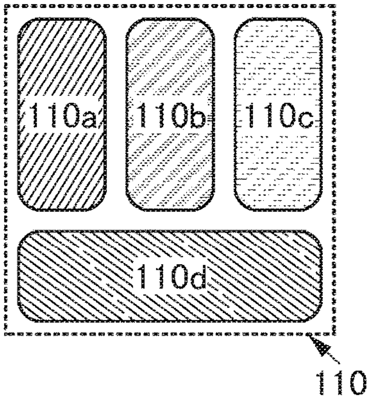
Figure 10H:
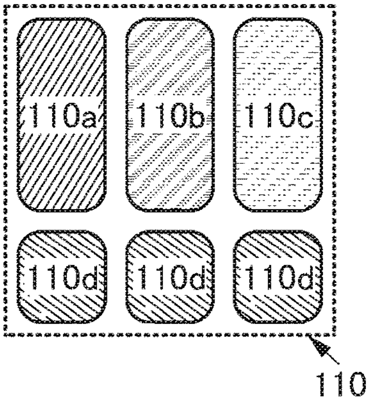

FIG. 10G and FIG. 10H each illustrate an example where one pixel 110 is composed of two rows and three columns.

The pixel 110 illustrated in FIG. 10G includes three subpixels (the subpixels 110*a*, 110*b*, and 110*c*) in the upper row (first row) and one subpixel (a subpixel 110*d*) in the lower row (second row). In other words, the pixel 110 includes the subpixel 110*a* in the left column (first column), the subpixel 110*b* in the center column (second column), the subpixel 110*c* in the right column (third column), and the subpixel 110*d* across these three columns.

The pixel 110 illustrated in FIG. 10H includes three subpixels (the subpixels 110*a*, 110*b*, and 110*c*) in the upper row (first row) and three subpixels 110*d* in the lower row (second row). In other words, the pixel 110 includes the subpixel 110*a* and the subpixel 110*d* in the left column (first column), the subpixel 110*b* and another subpixel 110*d* in the center column (second column), and the subpixel 110*c* and another subpixel 110*d* in the right column (third column). Matching the positions of the subpixels in the upper row and the lower row as illustrated in FIG. 10H enables dust and the like that would be produced in the manufacturing process to be removed efficiently. Thus, a display device with high display quality can be provided.

The pixels 110 illustrated in FIG. 10A to FIG. 10H are each composed of the four subpixels 110*a*, 110*b*, 110*c*, and 110*d*. The subpixels 110*a*, 110*b*, 110*c*, and 110*d* include light-emitting devices that emit light of different colors. For example, the subpixels 110*a*, 110*b*, 110*c*, and 110*d* can be of four colors of R, G, B, and white (W), of four colors of R, G, B, and Y, or of R, G, B, and infrared light (IR). For example, the subpixels 110*a*, 110*b*, 110*c*, and 110*d* can be red, green, blue, and white subpixels, respectively, as illustrated in FIG. 11G to FIG. 11J.

As described above, the pixel composed of the subpixels each including the light-emitting device can employ any of a variety of layouts in the display device of one embodiment of the present invention.

As described above, in the method for manufacturing the display device of this embodiment, the island-shaped EL layers are formed by processing an EL layer formed on the entire surface, not by using a metal mask having a fine pattern. Thus, the size of the island-shaped EL layers can be made smaller than the size of the layers formed with use of a metal mask. Accordingly, a high-resolution display device or a display device with a high aperture ratio, which has been difficult to achieve, can be manufactured.

In the display device of one embodiment of the present invention, since the light-emitting device with a tandem structure is included, the carrier balance can be more easily adjusted and the emission color at a low luminance is less different from that at a high luminance. Similarly, each subpixel includes an island-shaped EL layer, which can inhibit generation of leakage current between the subpixels. Accordingly, degradation of the display quality of the display device can be inhibited. In addition, both the higher resolution and higher display quality of the display device can be achieved.

This embodiment can be combined with any of the other embodiments as appropriate. In this specification, in the case where a plurality of structure examples are described in one embodiment, the structure examples can be combined as appropriate.

Embodiment 2

In this embodiment, a display device of one embodiment of the present invention will be described with reference to FIG. 12 to FIG. 15.

The display device in this embodiment can be a high-definition display device or a large-sized display device. Accordingly, the display device in this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

Since the light-emitting device in the display device of this embodiment has a tandem structure, the difference in chromaticity between low luminance emission and high luminance emission is small. Furthermore, since the EL layers of the respective light-emitting devices in the display devices of this embodiment are separated from each other, crosstalk generated between adjacent subpixels is prevented. Accordingly, the display device can have high display quality.

[Display Device 100A]

Figure 12:
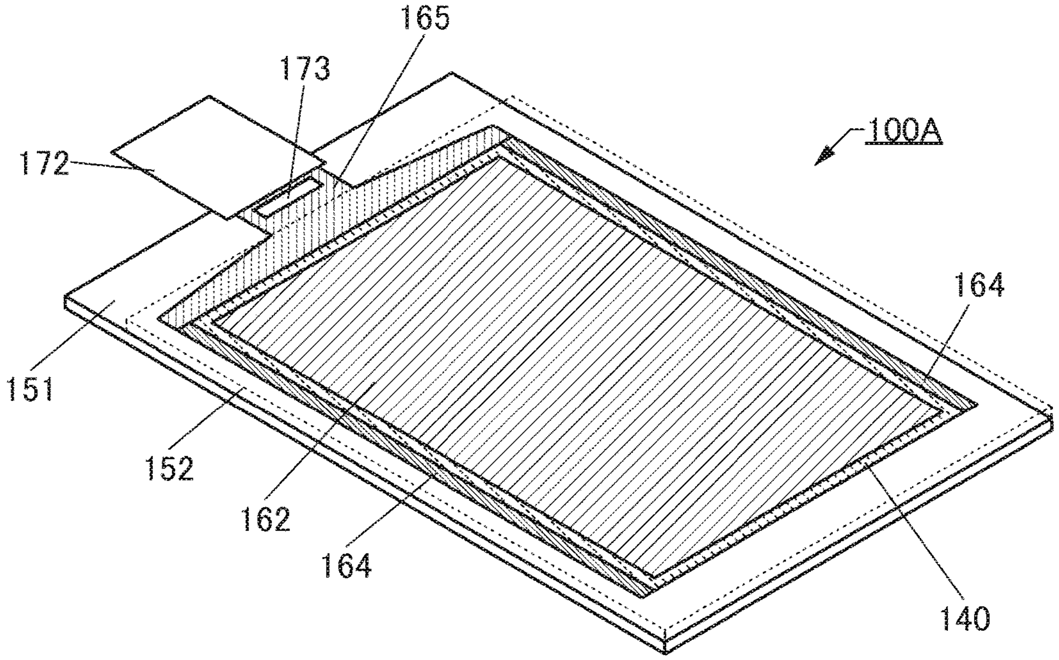
FIG. 12 is a perspective view illustrating an example of a display device.
Figure 13A:
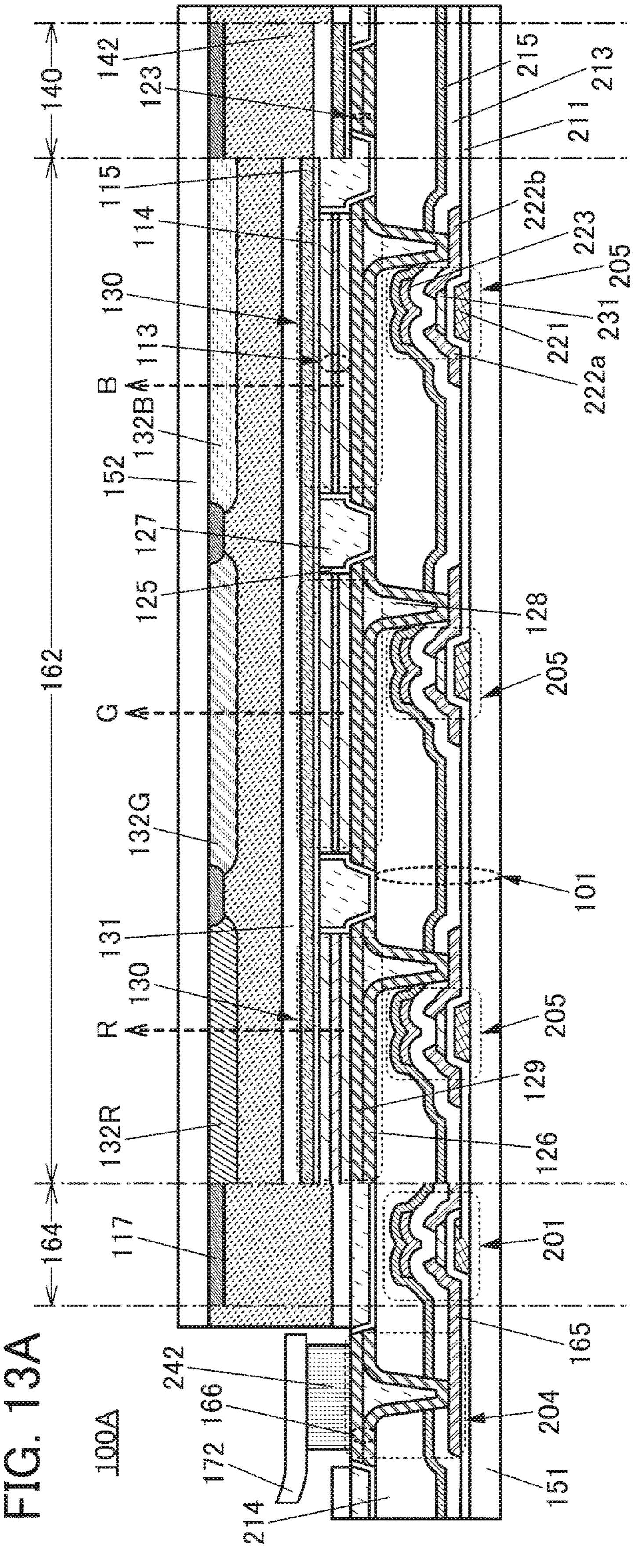
FIG. 13A is a cross-sectional view illustrating an example of a display device.

FIG. 12 is a perspective view of a display device 100A, and FIG. 13A is a cross-sectional view of the display device 100A.

In the display device 100A, a substrate 152 and a substrate 151 are attached to each other. In FIG. 12, the substrate 152 is denoted by a dashed line.

The display device 100A includes a display portion 162, the connection portion 140, a circuit 164, a wiring 165, and the like. FIG. 12 illustrates an example in which an IC 173 and an FPC 172 are implemented onto the display device 100A. Thus, the structure illustrated in FIG. 12 can be regarded as a display module including the display device 100A, the IC (integrated circuit), and the FPC.

The connection portion 140 is provided outside the display portion 162. The connection portion 140 can be provided along one or more sides of the display portion 162. The number of the connection portions 140 may be one or more. FIG. 12 illustrates an example in which the connection portion 140 is provided to surround the four sides of the display portion. The common electrode of the light-emitting device is electrically connected to a conductive layer in the connection portion 140, and thus a potential can be supplied to the common electrode.

As the circuit 164, a scan line driver circuit can be used, for example.

The wiring 165 has a function of supplying a signal and power to the display portion 162 and the circuit 164. The signal and power are input to the wiring 165 from the outside through the FPC 172 or from the IC 173.

FIG. 12 illustrates an example in which the IC 173 is provided over the substrate 151 by a chip on glass (COG) method, a chip on film (COF) method, or the like. An IC including a scan line driver circuit, a signal line driver circuit, or the like can be used as the IC 173, for example. Note that the display device 100A and the display module are not necessarily provided with an IC. The IC may be mounted on the FPC by a COF method or the like.

FIG. 13A illustrates an example of cross sections of part of a region including the FPC 172, part of the circuit 164, part of the display portion 162, part of the connection portion 140, and part of a region including an end portion of the display device 100A.

The display device 100A illustrated in FIG. 13A includes a transistor 201, a transistor 205, the light-emitting device 130, the coloring layer 132R transmitting red light, the coloring layer 132G transmitting green light, and the coloring layer 132B transmitting blue light, and the like between the substrate 151 and the substrate 152. The light-emitting device 130 can be configured to emit white light. Light emitted by the light-emitting device 130 overlapping with the coloring layer 132R is extracted as red light to the outside of the display device 100A through the coloring layer 132R. Similarly, light emitted by the light-emitting device 130 overlapping with the coloring layer 132G is extracted as green light to the outside of the display device 100A through the coloring layer 132G. Light emitted by the light-emitting device 130 overlapping with the coloring layer 132B is extracted as blue light to the outside of the display device 100A through the coloring layer 132B.

For the display device 100A, the pixel layout shown in Embodiment 1 can be employed.

The same structure can be employed for the light-emitting devices included in subpixels exhibiting different colors, and for example, a structure emitting white light can be employed. Specifically, the EL layers 113 included in respective light-emitting devices can have the same structure. In contrast, the EL layers 113 included in respective light-emitting device are separated from each other, which can inhibit generation of leakage current between light-emitting devices. Thus, the display quality of the display device can be improved.

Other than a difference in the structure of pixel electrode, the light-emitting devices 130 each have a structure similar to the stacked-layer structure illustrated in FIG. 1B. Embodiment 1 can be referred to for the details of the light-emitting devices 130.

The light-emitting devices 130 each include a conductive layer 126 and a conductive layer 129 over the conductive layer 126. One or both of the conductive layer 126 and the conductive layer 129 can be referred to as a pixel electrode.

The conductive layer 126 is connected to a conductive layer 222*b* included in the transistor 205 through an opening provided in an insulating layer 214. In the display device 100A, the end portion of the conductive layer 126 and the end portion of the conductive layer 129 are aligned or substantially aligned with each other; however, one embodiment of the present invention is not limited thereto. For example, the conductive layer 129 may be provided so as to cover the end portion of the conductive layer 126. The conductive layer 126 and the conductive layer 129 each preferably include a conductive layer functioning as a reflective electrode. The one or both of the conductive layer 126 and the conductive layer 129 may include a conductive layer functioning as a transparent electrode.

The conductive layer 126 is formed to cover the opening provided in the insulating layer 214. A layer 128 is embedded in a depressed portion of the conductive layer 126.

The layer 128 has a function of filling the depressed portion of the conductive layer 126 for planarization. The conductive layer 129 electrically connected to the conductive layer 126 is provided over the conductive layer 126 and the layer 128. Thus, a region overlapping with the depressed portion of the conductive layer 126 can also be used as the light-emitting region, increasing the aperture ratio of the pixel.

The layer 128 may be an insulating layer or a conductive layer. Any of a variety of inorganic insulating materials, organic insulating materials, and conductive materials can be used for the layer 128 as appropriate. In particular, the layer 128 is preferably formed using an insulating material.

An insulating layer containing an organic material can be suitably used as the layer 128. For example, an acrylic resin, a polyimide resin, an epoxy resin, a polyamide resin, a polyimide-amide resin, a siloxane resin, a benzocyclobutene-based resin, a phenol resin, and precursors of these resins can be used for the layer 128. A photosensitive resin can also be used for the layer 128. As the photosensitive resin, a positive photosensitive material or a negative photosensitive material can be used.

When a photosensitive resin is used, the layer 128 can be formed through only light-exposure and development steps, reducing the influence of dry etching method, wet etching method, or the like on the surfaces of the conductive layer 126. When the layer 128 is formed using a negative photosensitive resin, the layer 128 can sometimes be formed using the same photomask (light-exposure mask) as the photomask used for forming the opening in the insulating layer 214.

The top surface of the conductive layer 129 is covered with the EL layer 113. Accordingly, a region where the conductive layer 129 overlaps with the EL layer 113 in a top view can be entirely used as a light-emitting region of the light-emitting device 130, increasing the aperture ratio of the pixel. Note that the EL layer 113 may cover at least part of the side surface of the conductive layer 129. The EL layer 113 may cover only part of the top surface of the conductive layer 129. In other words, part of the top surface of the conductive layer 129 is not necessarily covered with the EL layer 113.

The side surface of EL layer 113 are covered with the insulating layer 125 and overlap with the insulating layer 127 with the insulating layer 125 provided therebetween. The common layer 114 is provided over the EL layer 113, the insulating layer 125, and the insulating layer 127, and the common electrode 115 is provided over the common layer 114. The common layer 114 and the common electrode 115 are each one continuous film shared by the plurality of light-emitting devices.

The protective layer 131 is provided over the light-emitting device 130. Providing the protective layer 131 that covers the light-emitting device can inhibit entry of impurities such as water into the light-emitting device, thereby increasing the reliability of the light-emitting device.

The protective layer 131 and the substrate 152 are bonded to each other with an adhesive layer 142. A solid sealing structure, a hollow sealing structure, or the like can be employed to seal the light-emitting device. In FIG. 13A, a solid sealing structure is employed, in which a space between the substrate 152 and the substrate 151 is filled with the adhesive layer 142. Alternatively, a hollow sealing structure may be employed, in which the space is filled with an inert gas (e.g., nitrogen or argon). In this case, the adhesive layer 142 may be provided not to overlap with the light-emitting device. Alternatively, the space may be filled with a resin other than the frame-like adhesive layer.

The conductive layer 123 is provided over the insulating layer 214 in the connection portion 140. An example is illustrated in which the conductive layer 123 has a stacked-layer structure of a conductive film obtained by processing the same conductive film as the conductive layer 126 and a conductive film obtained by processing the same conductive film as the conductive layer 129. The side surface of the conductive layer 123 is covered with the insulating layer 125 and overlaps with the insulating layer 127 with the insulating layer 125 provided therebetween. The common layer 114 is provided over the conductive layer 123, and the common electrode 115 is provided over the common layer 114. The conductive layer 123 and the common electrode 115 are electrically connected to each other through the common layer 114. Note that the common layer 114 is not necessarily formed in the connection portion 140. In this case, the conductive layer 123 and the common electrode 115 are directly and electrically connected to each other.

The display device 100A has a top-emission structure. Light emitted by the light-emitting device is emitted toward the substrate 152 side. For the substrate 152, a material having a high visible-light-transmitting property is preferably used.

The pixel electrode contains a material reflecting visible light, and the counter electrode (the common electrode 115) contains a material transmitting visible light.

A stacked-layer structure including the substrate 151 and the components thereover up to the insulating layer 214 corresponds to the layer 101 including a transistor in Embodiment 1.

The transistor 201 and the transistor 205 are formed over the substrate 151. These transistors can be formed using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, an aluminum nitride film, or the like can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. Alternatively, the insulating layer 214 may have a stacked-layer structure of an organic insulating layer and an inorganic insulating film. The outermost layer of the insulating layer 214 preferably has a function of an etching protective film. Thus, the formation of a depressed portion in the insulating layer 214 can be inhibited in processing the conductive layer 126, the conductive layer 129, or the like. Alternatively, a depressed portion may be formed in the insulating layer 214 in processing the conductive layer 126, the conductive layer 129, or the like.

Each of the transistor 201 and the transistor 205 includes a conductive layer 221 functioning as a gate, the insulating layer 211 functioning as a gate insulating layer, a conductive layer 222_a_ and a conductive layer 222_b_ functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, an inverted staggered transistor, or the like can be used. A top-gate transistor or a bottom-gate transistor can be used. Alternatively, gates may be provided above and below a semiconductor layer where a channel is formed.

The structure in which the semiconductor layer where a channel is formed is provided between two gates is used for the transistor 201 and the transistor 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity because degradation of transistor characteristics can be inhibited.

It is preferable that a semiconductor layer of a transistor contain a metal oxide (also referred to as an oxide semiconductor). That is, a transistor including a metal oxide in its channel formation region (hereinafter, also referred to as an OS transistor) is preferably used for the display device of this embodiment.

As the oxide semiconductor having crystallinity, a CAAC (c-axis aligned crystalline)-OS, an nc (nanocrystalline)-OS, and the like can be given.

Alternatively, a transistor using silicon in a channel formation region (a Si transistor) may be used. Examples of silicon include single crystal silicon, polycrystalline silicon, and amorphous silicon. In particular, a transistor containing low-temperature polysilicon (LTPS) in a semiconductor layer (such a transistor is referred to as an LTPS transistor below) can be used. The LTPS transistor has high field-effect mobility and excellent frequency characteristics.

With use of the Si transistor such as the LTPS transistor, a circuit required to drive at a high frequency (e.g., a source driver circuit) can be formed on the same substrate as the display portion. This allows simplification of an external circuit mounted on the display device and a reduction in costs of parts and mounting costs.

The OS transistor has much higher field-effect mobility than a transistor containing amorphous silicon. In addition, the OS transistor has an extremely low leakage current between a source and a drain in an off state (hereinafter, also referred to as an off-state current), and electric charge accumulated in a capacitor that is connected in series to the transistor can be held for a long period. Furthermore, the power consumption of the display device can be reduced with the OS transistor.

The off-state current per micrometer of channel width of the OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current per micrometer of channel width of a Si transistor at room temperature is higher than or equal to 1 fA ($1\times10^{-15}$ A) and lower than or equal to 1 pA ($1\times10^{-12}$ A). That is, the off-state current of the OS transistor is lower than the off-state current of the Si transistor by approximately 10 digits.

To increase the emission luminance of the light-emitting device included in a pixel circuit, it is necessary to increase the amount of current flowing through the light-emitting device. For this, it is necessary to increase the source-drain voltage of a driving transistor included in the pixel circuit. Since the OS transistor has a higher withstand voltage between the source and the drain than a Si transistor, a high voltage can be applied between the source and the drain of the OS transistor. Thus, with use of an OS transistor as a driving transistor included in the pixel circuit, the amount of current flowing through the light-emitting device can be increased, resulting in an increase in emission luminance of the light-emitting device.

When transistors operate in a saturation region, a change in source-drain current relative to a change in gate-source voltage can be smaller in an OS transistor than in a Si transistor. Accordingly, when an OS transistor is used as the driving transistor included in the pixel circuit, the amount of current flowing between the source and the drain can be set minutely by a change in gate-source voltage; hence, the amount of current flowing through the light-emitting device can be controlled. Accordingly, the gray level in the pixel circuit can be increased.

Regarding saturation characteristics of current flowing when transistors operate in a saturation region, even in the case where the source-drain voltage of an OS transistor increases gradually, more stable constant current (saturation current) can be fed through the OS transistor than through a Si transistor. Thus, with use of an OS transistor as a driving transistor, current can be made flow stably through the light-emitting device, for example, even when a variation in current-voltage characteristics of the EL device occurs. In other words, the amount of current between the source and the drain is less changed in the OS transistor operating in the saturation region even when the source-drain voltage is made higher. As a result, the emission luminance of the light-emitting device can be stabilized.

As described above, with use of an OS transistor as a driving transistor included in the pixel circuit, it is possible to achieve "inhibition of black floating", "increase in emission luminance", "increase in gray level", "inhibition of variation in light-emitting devices", and the like.

The metal oxide used in the semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used for the semiconductor layer. Alternatively, it is preferable to use an oxide containing indium, tin, and zinc. Further alternatively, it is preferable to use an oxide containing indium, gallium, tin, and zinc. Further alternatively, it is preferable to use an oxide containing indium (In), aluminum (Al), and zinc (Zn) (also referred to as IAZO). Further alternatively, it is preferable to use an oxide containing indium (In), aluminum (Al), gallium (Ga), and zinc (Zn) (also referred to as IAGZO).

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide are In:M:Zn=1:1:1 or a composition in the vicinity thereof, In:M:Zn=1:1:1.2 or a composition in the vicinity thereof, In:M:Zn=1:3:2 or a composition in the vicinity thereof, In:M:Zn=1:3:4 or a composition in the vicinity thereof, In:M:Zn=2:1:3 or a composition in the vicinity thereof, In:M:Zn=3:1:2 or a composition in the vicinity thereof, In:M:Zn=4:2:3 or a composition in the vicinity thereof, In:M:Zn=4:2:4.1 or a composition in the vicinity thereof, In:M:Zn=5:1:3 or a composition in the vicinity thereof, In:M:Zn=5:1:6 or a composition in the vicinity thereof, In:M:Zn=5:1:7 or a composition in the vicinity thereof, In:M:Zn=5:1:8 or a composition in the vicinity thereof, In:M:Zn=6:1:6 or a composition in the vicinity thereof, and In:M:Zn=5:2:5 or a composition in the vicinity thereof. Note that the vicinity of the atomic ratio includes ±30% of an intended atomic ratio.

For example, when the atomic ratio is described as In:Ga:Zn=4:2:3 or a composition in the vicinity thereof, the case is included where the atomic ratio of Ga is greater than or equal to 1 and less than or equal to 3 and the atomic ratio of Zn is greater than or equal to 2 and less than or equal to 4 with the atomic ratio of In being 4. In addition, when the atomic ratio is described as In:Ga:Zn=5:1:6 or a composition in the vicinity thereof, the case is included where the atomic ratio of Ga is greater than 0.1 and less than or equal to 2 and the atomic ratio of Zn is greater than or equal to 5 and less than or equal to 7 with the atomic ratio of In being 5. Furthermore, when the atomic ratio is described as In:Ga:Zn=1:1:1 or a composition in the vicinity thereof, the case is included where the atomic ratio of Ga is greater than 0.1 and less than or equal to 2 and the atomic ratio of Zn is greater than 0.1 and less than or equal to 2 with the atomic ratio of In being 1.

The transistors included in the circuit 164 and the transistors included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

All of the transistors included in the display portion 162 may be OS transistors or Si transistors. Alternatively, some of the transistors included in the display portion 162 may be OS transistors and the others may be Si transistors.

For example, when both the LTPS transistor and the OS transistor are used in the display portion 162, the display device can have low power consumption and high drive capability. Note that a structure in which the LTPS transistor and the OS transistor are combined is referred to as LTPO in some cases. In a preferred example, the OS transistor is used as a transistor or the like functioning as a switch controlling conduction or non-conduction between wirings and the LTPS transistor is used as a transistor or the like controlling current.

For example, one transistor included in the display portion 162 may function as a transistor for controlling current flowing through the light-emitting device and be also referred to as a driving transistor. One of a source and a drain of the driving transistor is electrically connected to the pixel electrode of the light-emitting device. The LTPS transistor is preferably used as the driving transistor. Thus, current flowing through the light-emitting device in the pixel circuit can be increased.

In contrast, another transistor included in the display portion 162 may function as a switch for controlling selection or non-selection of a pixel and can also be referred to as a selection transistor. A gate of the selection transistor is electrically connected to a gate line, and one of a source and a drain thereof is electrically connected to a source line (signal line). The OS transistor is preferably used as the selection transistor. Thus, the gray level of the pixel can be maintained even when the frame frequency is extremely reduced (e.g., 1 fps or lower), whereby power consumption can be reduced by stopping the driver in displaying a still image.

As described above, the display device of one embodiment of the present invention can have all of a high aperture ratio, high resolution, high display quality, and low power consumption.

Note that the display device of one embodiment of the present invention has a structure including the OS transistor and the light-emitting device having an MML (metal maskless) structure. This structure can extremely reduce the leakage current that might flow through a transistor, and the leakage current that might flow between adjacent light-emitting devices (also referred to as a lateral leakage current, a side leakage current, or the like). With the structure, a viewer can observe any one or more of the image crispness, the image sharpness, a high chroma, and a high contrast ratio in an image displayed on the display device. Note that when the leakage current that might flow through a transistor and the lateral leakage current between light-emitting devices are extremely low, display with little leakage of light or the like that might occur in black display can be reduced as much as possible.

Figure 13B:
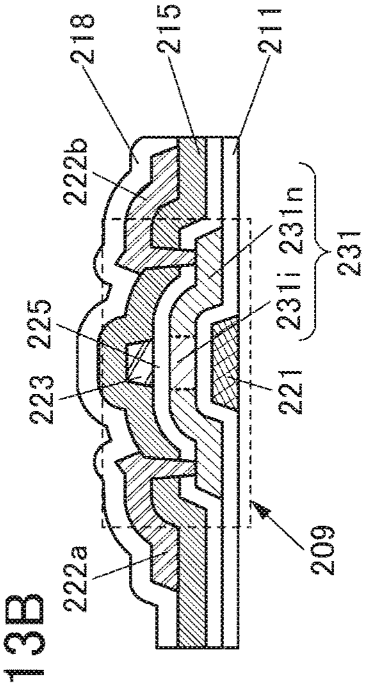
FIG. 13B and FIG. 13C are cross-sectional views each illustrating an example of a transistor.
Figure 13C:
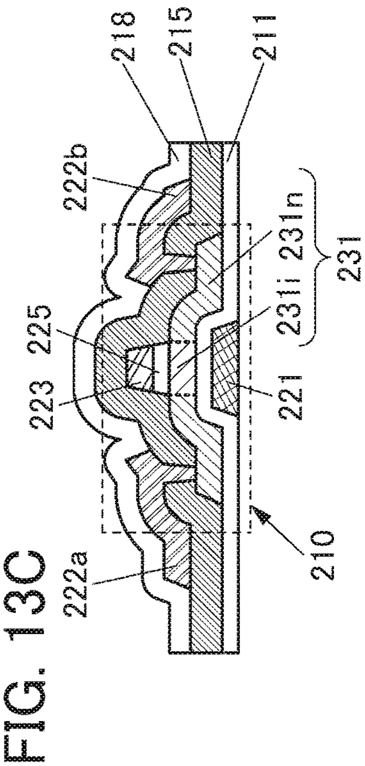

FIG. 13B and FIG. 13C illustrate other structure examples of transistors.

A transistor 209 and a transistor 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between at least the conductive layer 223 and the channel formation region 231*i*. Furthermore, an insulating layer 218 covering the transistor may be provided.

FIG. 13B illustrates an example of the transistor 209 in which the insulating layer 225 covers the top surface and the side surface of the semiconductor layer 231. The conductive layer 222*a* and the conductive layer 222*b* are connected to the corresponding low-resistance regions 231*n* through openings provided in the insulating layer 225 and the insulating layer 215. One of the conductive layer 222*a* and the conductive layer 222*b* functions as a source, and the other functions as a drain.

In the transistor 210 illustrated in FIG. 13C, the insulating layer 225 overlaps with the channel formation region 231*i* of the semiconductor layer 231 and does not overlap with the low-resistance regions 231*n*. The structure illustrated in FIG. 13C is obtained by processing the insulating layer 225 with the conductive layer 223 as a mask, for example. In FIG. 13C, the insulating layer 215 is provided to cover the insulating layer 225 and the conductive layer 223, and the conductive layer 222*a* and the conductive layer 222*b* are connected to the corresponding low-resistance regions 231*n* through the openings in the insulating layer 215.

A connection portion 204 is provided in a region of the substrate 151 which does not overlap with the substrate 152. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the conductive layer 126 and a conductive film obtained by processing the same conductive film as the conductive layer 129. On the top surface of the connection portion 204, the conductive layer 166 is exposed. Thus, the connection portion 204 and the FPC 172 can be electrically connected to each other through the connection layer 242.

A light-blocking layer 117 is preferably provided on the surface of the substrate 152 on the substrate 151 side. In addition, the coloring layers 132R and 132G may be provided on the surface of the substrate 152 that faces the substrate 151. In FIG. 13A, when the substrate 152 is considered as a reference, the coloring layers 132R and 132G are provided to cover part of the light-blocking layer 117.

The substrate 151 and the substrate 152 can be each formed using any of the materials given in Embodiment 1 as examples of the material that can be used for the substrate 120. In addition, a variety of members that can be placed outside the substrate 120 can also be used at the outside of the substrate 151 or the substrate 152.

A material that can be used for the resin layer 122 described in Embodiment 1 can be used for the adhesive layer 142.

As the connection layer 242, an anisotropic conductive film (ACF), an anisotropic conductive paste (ACP), or the like can be used.

As materials for a gate, a source, and a drain of a transistor and conductive layers functioning as wirings and electrodes included in the display device, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, stacked films of any of the above materials can be used for the conductive layers. For example, stacked films of indium tin oxide and an alloy of silver and magnesium are preferably used, in which case the conductivity can be increased. These materials can also be used for conductive layers such as wirings and electrodes included in the display device and conductive layers (e.g., a conductive layer functioning as the pixel electrode or the common electrode) included in the light-emitting device.

Examples of insulating materials that can be used for insulating layers include resins such as an acrylic resin and an epoxy resin, and inorganic insulating materials such as silicon oxide, silicon oxynitride, silicon nitride oxide, silicon nitride, and aluminum oxide.

[Display Device 100B]

Figure 14:
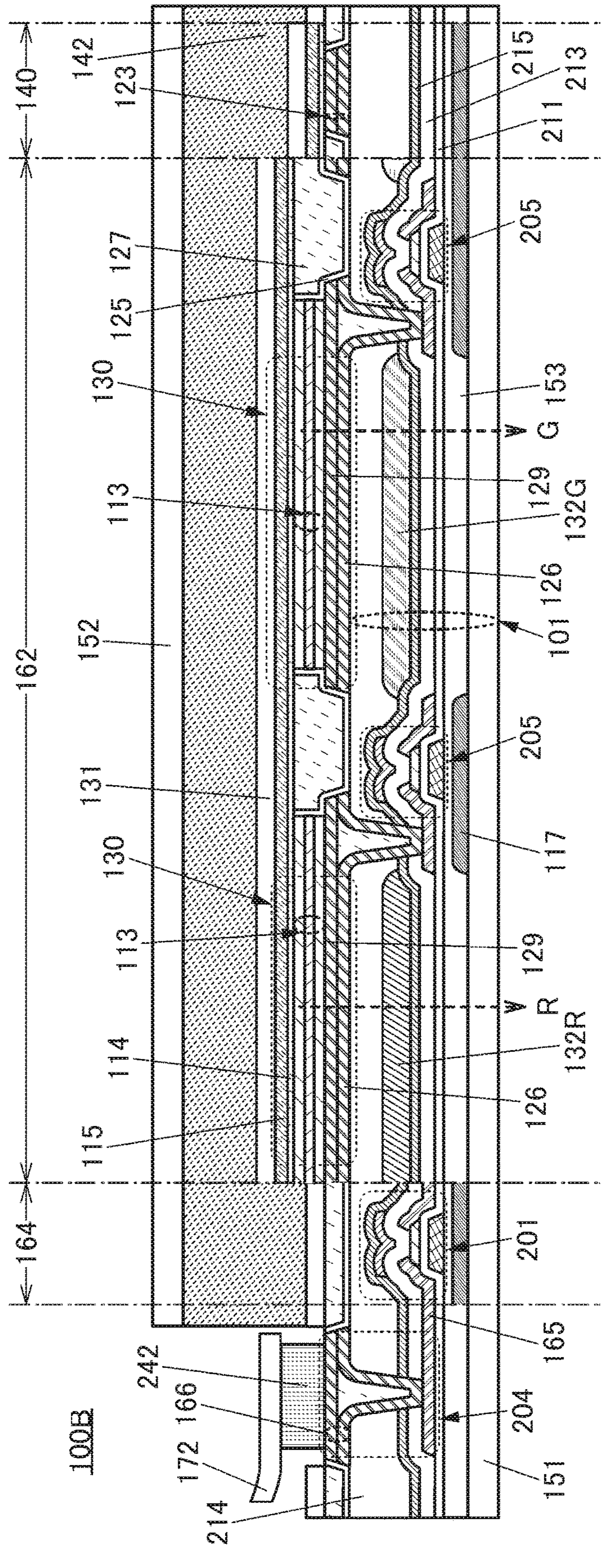
FIG. 14 is a cross-sectional view illustrating an example of a display device.

A display device 100B illustrated in FIG. 14 differs from the display device 100A mainly in having a bottom-emission structure. Note that the description of portions similar to those of the display device 100A is omitted.

Light emitted by the light-emitting device is emitted toward the substrate 151 side. For the substrate 151, a material having a high visible-light-transmitting property is preferably used. In contrast, there is no limitation on the light-transmitting property of a material used for the substrate 152.

In the display device 100B, the conductive layer 126 and the conductive layer 129 each contain a material transmitting visible light, and the common electrode 115 contains a material reflecting visible light.

The light-blocking layer 117 is preferably formed between the substrate 151 and the transistor 201 and between the substrate 151 and the transistor 205. FIG. 14 illustrates an example in which the light-blocking layer 117 is provided over the substrate 151, an insulating layer 153 is provided over the light-blocking layer 117, and the transistors 201 and 205 and the like are provided over the insulating layer 153.

Moreover, in the display device 100B, the coloring layer 132R transmitting red light and the coloring layer 132G transmitting green light are provided between the insulating layer 215 and the insulating layer 214. The end portion of the coloring layer 132R and the end portion of the coloring layer 132G each preferably overlap with the light-blocking layer 117. Light emitted by the light-emitting device 130 overlapping with the coloring layer 132R is extracted as red light to the outside of the display device 100B through the coloring layer 132R. Light emitted by the light-emitting device 130 overlapping with the coloring layer 132G is extracted as green light to the outside of the display device 100B through the coloring layer 132G. Although not illustrated, the coloring layer 132B transmitting blue light is provided between the insulating layer 215 and the insulating layer 214. Light emitted by the light-emitting device 130 overlapping with the coloring layer 132B is extracted as blue light to the outside of the display device 100B through the coloring layer 132B.

Here, FIG. 15A to FIG. 15D illustrate cross-sectional structures of a region 138 including the conductive layer 126, the layer 128, and the vicinity thereof in the display device 100A and the display device 100B.

Figure 15A:
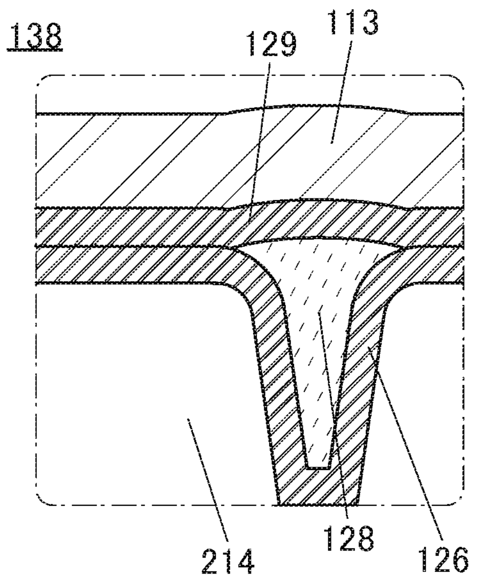
FIG. 15A to FIG. 15D are cross-sectional views each illustrating an example of a display device.

FIG. 13A and FIG. 14 each illustrate an example in which the top surface of the layer 128 and the top surface of the conductive layer 126 are substantially at the same level; however, the present invention is not limited to such an example. For example, as illustrated in FIG. 15A, the top surface of the layer 128 may be at a higher level than that of the conductive layer 126. In this case, the top surface of the layer 128 has a convex shape that is gently bulged toward the center.

Figure 15B:
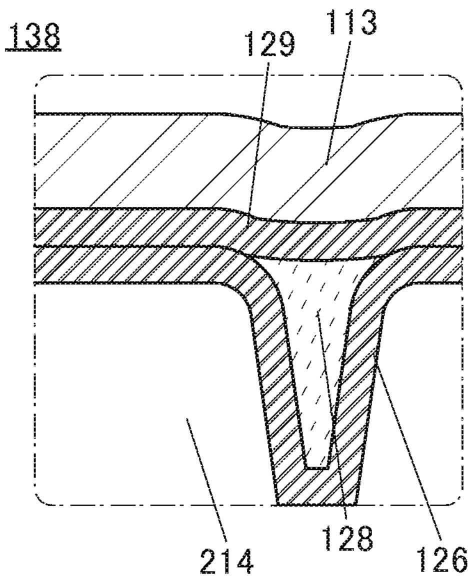

As illustrated in FIG. 15B, the top surface of the layer 128 may be at a lower level than that of the conductive layer 126. In this case, the top surface of the layer 128 has a concave shape that is gently recessed toward the center.

Figure 15C:
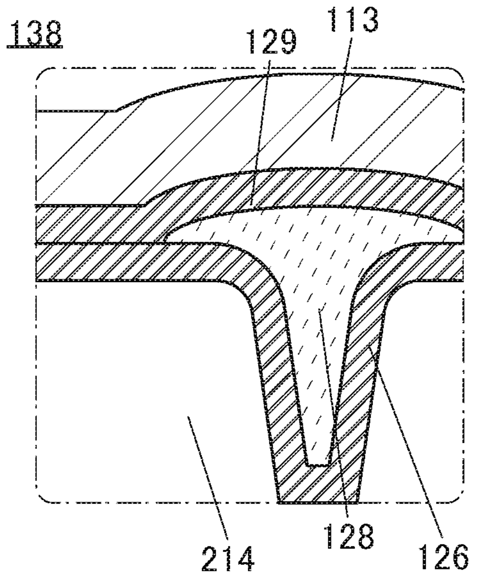

When the top surface of the layer 128 is at a higher level than that of the conductive layer 126 as illustrated in FIG. 15C, the upper portion of the layer 128 is formed to extend beyond a depressed portion in the conductive layer 126 in some cases. In this case, part of the layer 128 may be formed to cover part of a region of the conductive layer 126 which is substantially flat.

Figure 15D:
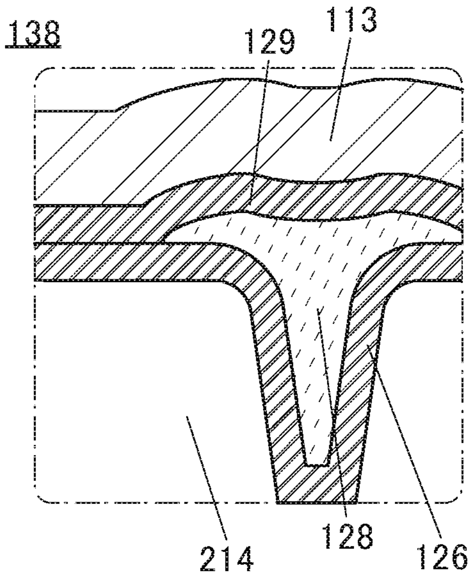

As illustrated in FIG. 15D, the top surface of layer 128 has a depressed portion in the structure of FIG. 15C, in some cases. The depressed portion has a shape that is gently recessed toward the center.

This embodiment can be combined with any of the other embodiments as appropriate.

Embodiment 3

In this embodiment, a display device of one embodiment of the present invention will be described with reference to FIG. 16 to FIG. 21.

The display device in this embodiment can be a high-resolution display device. Accordingly, the display device in this embodiment can be used for display portions of information terminals (wearable devices) such as watch-type and bracelet-type information terminals and display portions of wearable devices capable of being worn on the head, such as a VR device like a head-mounted display and a glasses-type AR device.

Since the light-emitting device in the display device of this embodiment has a tandem structure, the difference in chromaticity between low luminance emission and high luminance emission is small. Furthermore, since the EL layers of the respective light-emitting devices in the display devices of this embodiment are separated from each other, crosstalk generated between adjacent subpixels can be prevented while the display device has high resolution. Accordingly, the display device can have high resolution and high display quality.

Specifically, it is preferable that the resolution of the display portion included in the display device of one embodiment of the present invention be 1000 ppi or higher, 2000 ppi or higher, 3000 ppi or higher, 5000 ppi or higher, or 6000 ppi or higher and 20000 ppi or lower or 30000 ppi or lower.

[Display Module]

Figure 16A:
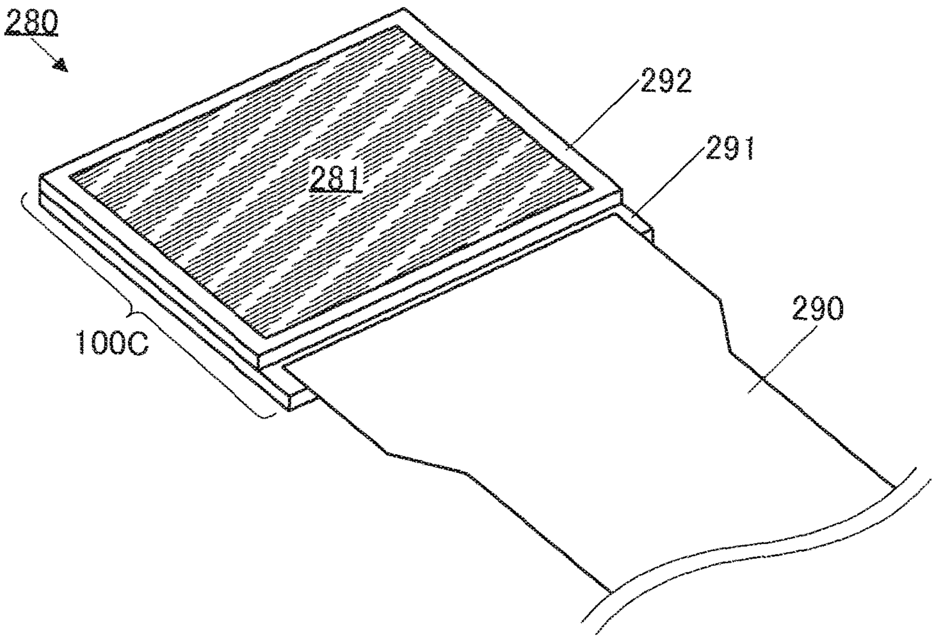
FIG. 16A and FIG. 16B are perspective views illustrating an example of a display module.

FIG. 16A is a perspective view of a display module 280. The display module 280 includes a display device 100C and an FPC 290. Note that the display device included in the display module 280 is not limited to the display device 100C and may be any of a display device 100D to a display device 100G described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 16B:
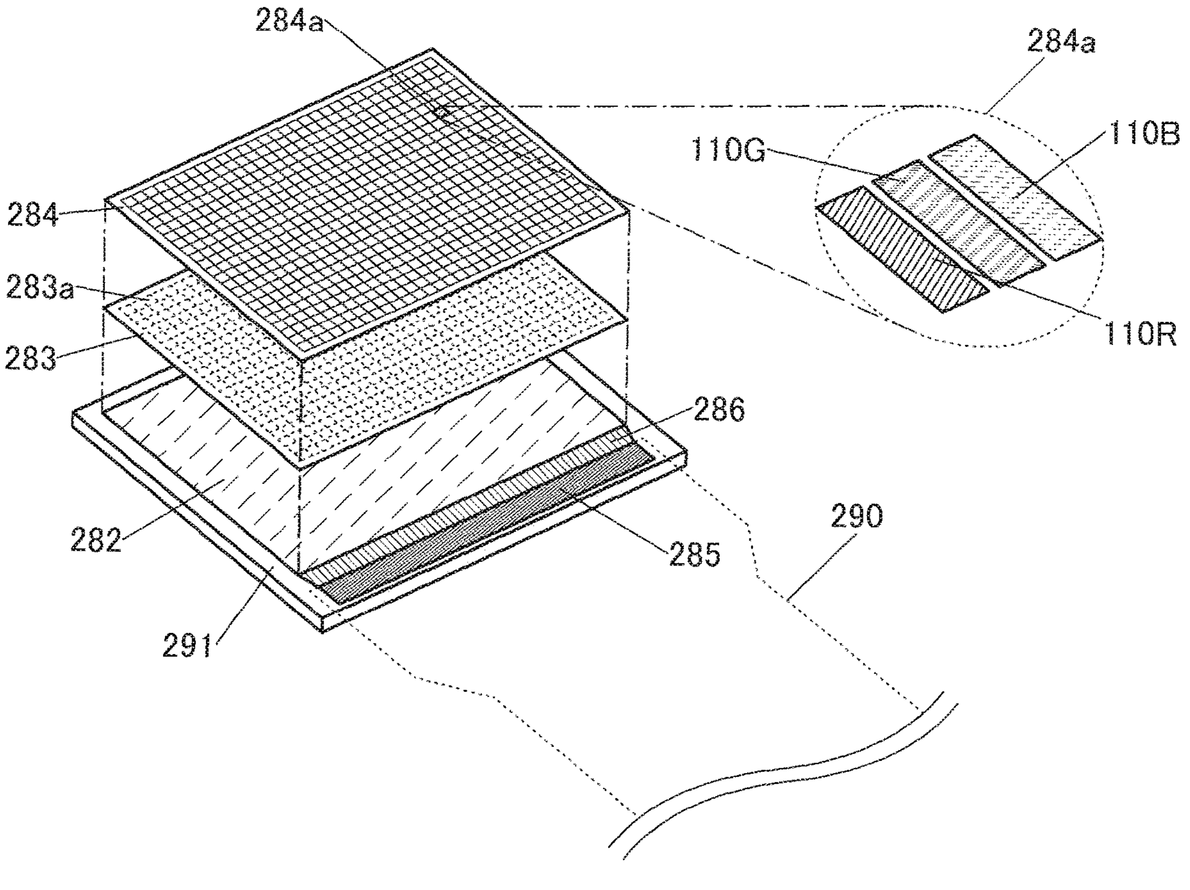

FIG. 16B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side in FIG. 16B. The pixel 284*a* includes the subpixel 110R exhibiting red light, the subpixel 110G exhibiting green light, and the subpixel 110B exhibiting blue light arranged in this order. Embodiment 1 can be referred to as a pixel layout applicable to the pixel portion 284.

The pixel circuit portion 283 includes a plurality of pixel circuits 283*a* arranged periodically.

One pixel circuit 283*a* is a circuit that controls light emission by three light-emitting devices included in one pixel 284*a*. One pixel circuit 283*a* may be provided with three circuits that each controls light emission by one light-emitting device. For example, the pixel circuit 283*a* can include at least one selection transistor, one current control transistor (driving transistor), and a capacitor for one light-emitting device. In this case, a gate signal is input to a gate of the selection transistor, and a source signal is input to a source of the selection transistor. With such a structure, an active-matrix display device is achieved.

The circuit portion 282 includes a circuit for driving the pixel circuits 283*a* in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (the effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284*a* can be arranged extremely densely and thus the display portion 281 can have extremely high resolution. For example, the pixels 284*a* are preferably arranged in the display portion 281 with a resolution 2000 ppi or higher, preferably 3000 ppi or higher, further preferably 5000 ppi or higher, still further preferably 6000 ppi or higher, and 20000 ppi or lower or 30000 ppi or lower.

Such a display module 280 has extremely high resolution, and thus can be suitably used for a VR device such as a head-mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be suitably used in a display portion of a wearable electronic device, such as a wrist watch.

[Display Device 100C]

Figure 17A:
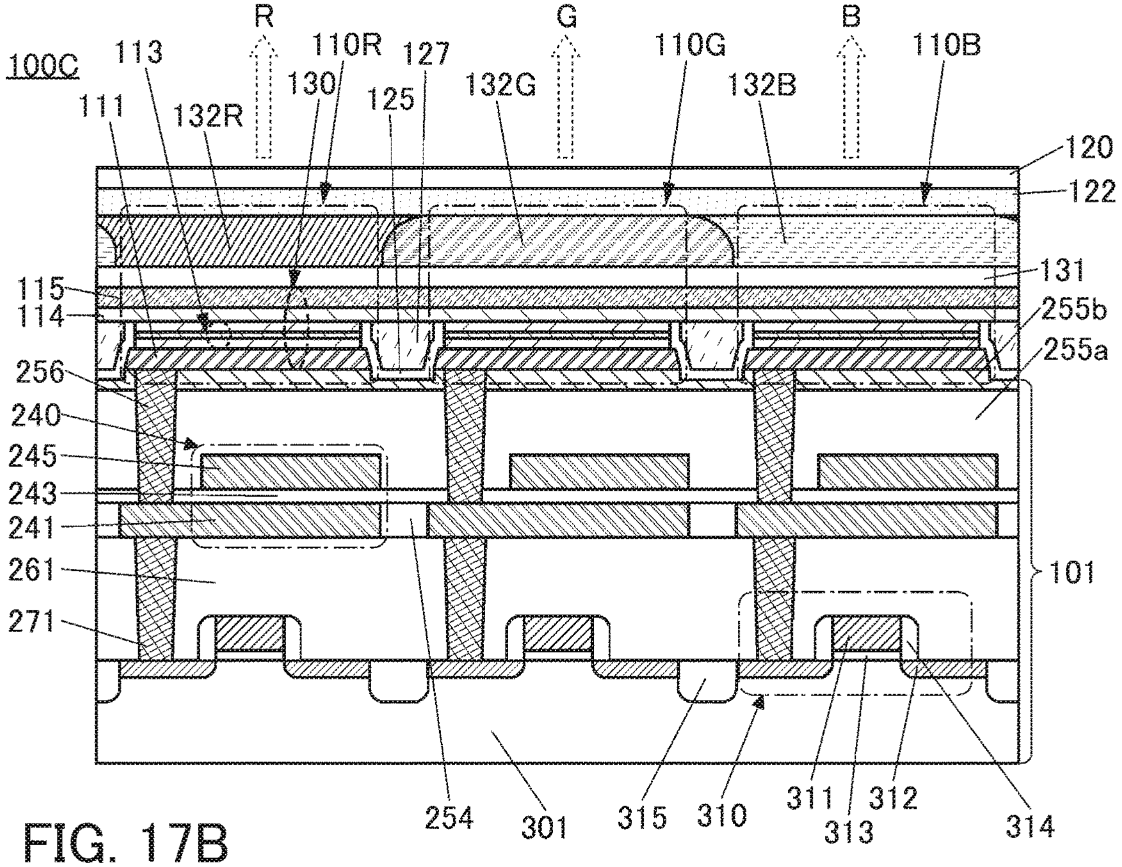
FIG. 17A to FIG. 17C are cross-sectional views each illustrating an example of a display device.

The display device 100C illustrated in FIG. 17A includes a substrate 301, the light-emitting device 130, the coloring layer 132R, the coloring layer 132G, the coloring layer 132B, a capacitor 240, a transistor 310, and the like. The subpixel 110R includes the light-emitting device 130 and the coloring layer 132R, the subpixel 110G includes the light-emitting device 130 and the coloring layer 132G, and the subpixel 110B includes the light-emitting device 130 and the coloring layer 132B. The light-emitting device 130 can be configured to emit white light. In the subpixel 110R, light emitted by the light-emitting device 130 is extracted as red light to the outside of the display device 100C through the coloring layer 132R. In the subpixel 110G, light emitted by the light-emitting device 130 is extracted as green light to the outside of the display device 100C through the coloring layer 132G. In the subpixel 110B, light emitted by the light-emitting device 130 is extracted as blue light to the outside of the display device 100C through the coloring layer 132B.

The same structure can be employed for the light-emitting devices included in subpixels exhibiting different colors, and for example, a structure emitting white light can be employed. Specifically, the EL layers 113 included in respective light-emitting devices can have the same structure. In contrast, the EL layers 113 included in respective light-emitting device are separated from each other, which can inhibit generation of leakage current between light-emitting devices. Thus, the display quality of the display device can be improved.

The substrate 301 corresponds to the substrate 291 illustrated in FIG. 16A and FIG. 16B. A stacked-layer structure including the substrate 301 and the components thereover up to the insulating layer 255*b* corresponds to the layer 101 including a transistor in Embodiment 1.

The transistor 310 includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as one of a source and a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 between the conductive layer 241 and the conductive layer 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of a source and a drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255*a* is provided to cover the capacitor 240, and the insulating layer 255*b* is provided over the insulating layer 255*a*.

As each of the insulating layer 255*a* and the insulating layer 255*b*, a variety of inorganic insulating films such as an oxide insulating film, a nitride insulating film, an oxynitride insulating film, and a nitride oxide insulating film can be suitably used. As the insulating layer 255*a*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferred that a silicon oxide film be used as the insulating layer 255*a* and a silicon nitride film be used as the insulating layer 255*b*. The insulating layer 255*b* preferably has a function of an etching protective film. Alternatively, a nitride insulating film or a nitride oxide insulating film may be used as the insulating layer 255*a*, and an oxide insulating film or an oxynitride insulating film may be used as the insulating layer 255*b*. Although this embodiment describes an example in which a depressed portion is provided in the insulating layer 255*b*, a depressed portion is not necessarily provided in the insulating layer 255*b*.

The light-emitting device 130 is provided over the insulating layer 255*b*. In this embodiment, the light-emitting device 130 has a structure similar to the stacked-layer structure illustrated in FIG. 1B. The side surface of the pixel electrode 111 and the side surfaces of the EL layer 113 are each covered with the insulating layer 125 and overlap with the insulating layer 127 with the insulating layer 125 provided therebetween. The common layer 114 is provided over the EL layer 113, the insulating layer 125, and the insulating layer 127, and the common electrode 115 is provided over the common layer 114.

The pixel electrode 111 of the light-emitting device is electrically connected to one of the source and the drain of the transistor 310 through a plug 256 embedded in the insulating layer 255*a* and the insulating layer 255*b*, the conductive layer 241 embedded in the insulating layer 254, and the plug 271 embedded in the insulating layer 261. The top surface of the insulating layer 255*b* and the top surface of the plug 256 are level with or substantially level with each other. A variety of conductive materials can be used for the plugs.

The protective layer 131 is provided over the light-emitting device 130. The coloring layers 132R, 132G, and 132B are provided over the protective layer 131. The substrate 120 is bonded onto the coloring layers 132R, 132G, and 132B with the resin layer 122. Embodiment 1 can be referred to for the details of the light-emitting devices and the components thereover up to the substrate 120. The substrate 120 corresponds to the substrate 292 in FIG. 16A.

The end portions of the top surfaces of the pixel electrodes 111 are not covered with insulating layers. Thus, the distance between adjacent light-emitting devices can be extremely shortened. Accordingly, the display device can have high resolution or high definition.

Figure 17B:
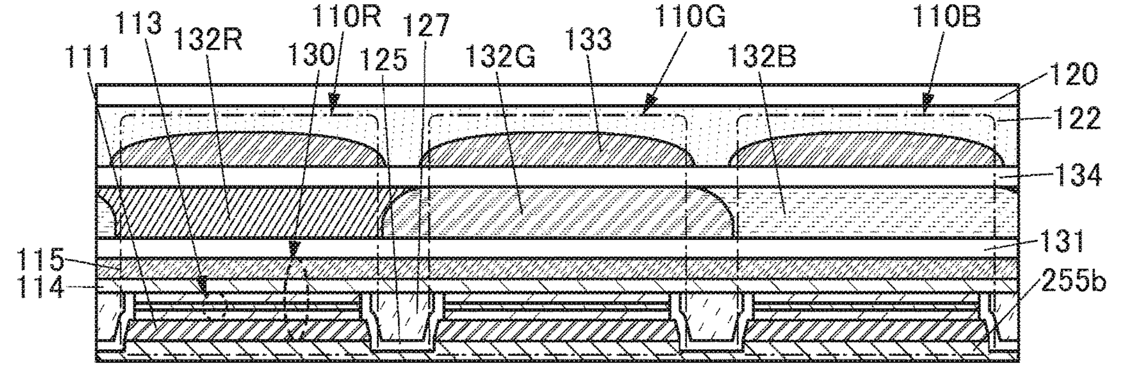
Figure 17C:
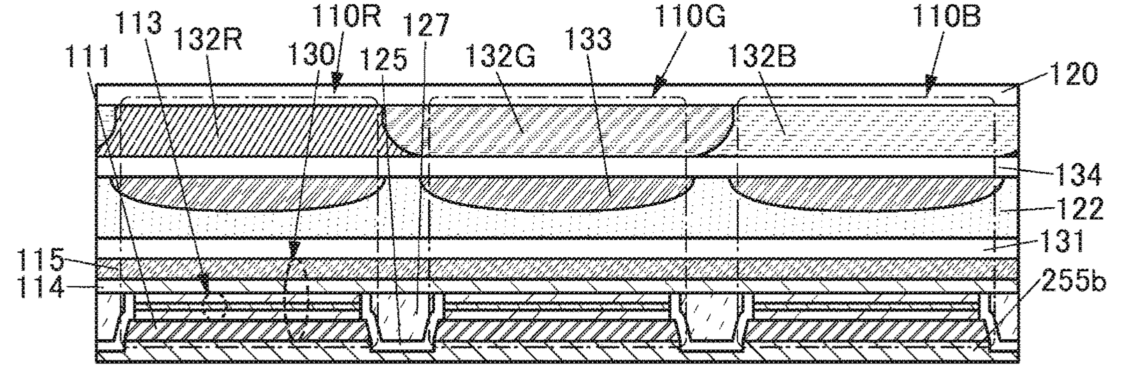

As illustrated in FIG. 17B and FIG. 17C, a lens array 133 may be provided. Using the lens array 133 enables light emitted from the light-emitting devices 130 to be collected.

FIG. 17B illustrates an example in which the coloring layers 132R, 132G, and 132B are provided over the light-emitting devices 130 with the protective layer 131 provided therebetween, an insulating layer 134 is provided over the coloring layers 132R, 132G, and 132B, and the lens array 133 is provided over the insulating layer 134. The coloring layer 132R, the coloring layer 132G, the coloring layer 132B, and the lens array 133 are directly formed over the substrate provided with the light-emitting devices 130, whereby the accuracy of positional alignment of the light-emitting device and the coloring layer or the lens array can be enhanced.

For the insulating layer 134, one or both of an inorganic insulating film and an organic insulating film can be used. The insulating layer 134 may have either a single-layer structure or a stacked-layer structure. The insulating layer 134 can be formed using a material that can be used for the protective layer 131, for example. When light emitted by the light-emitting device is extracted through the insulating layer 134, the insulating layer 134 preferably has a high visible-light-transmitting property.

In FIG. 17B, light emitted by the light-emitting device 130 passes through the coloring layer and then passes through the lens array 133, resulting in being extracted to the outside of the display device. It is preferable to shorten the distance between the light-emitting device and the coloring layer because color mixing can be inhibited and the viewing angle characteristics can be improved. Note that a structure in which the lens array 133 is provided over the light-emitting device 130 and the coloring layer is provided over the lens array 133 may be employed.

FIG. 17C illustrates an example in which the substrate 120 provided with the coloring layer 132R, the coloring layer 132G, the coloring layer 132B, and the lens array 133 is bonded onto the protective layer 131 with the resin layer 122. The substrate 120 is provided with the coloring layer 132R, the coloring layer 132G, the coloring layer 132B, and the lens array 133, whereby the heat treatment temperature in the forming step of them can be increased.

In the example of FIG. 17C, the coloring layers 132R, 132G, and 132B are provided in contact with the substrate 120, the insulating layer 134 is provided in contact with the coloring layers 132R, 132G, and 132B, and the lens array 133 is provided in contact with the insulating layer 134.

In FIG. 17C, light emitted by the light-emitting device 130 passes through the lens array 133 and then passes through the coloring layer, resulting in being extracted to the outside of the display device. Note that a structure in which the lens array 133 is provided in contact with the substrate 120, the insulating layer 134 is provided in contact with the lens array 133, and the coloring layers are provided in contact with the insulating layer 134 may be employed. In this case, light emitted by the light-emitting device 130 passes through the coloring layer and then passes through the lens array 133, resulting in being extracted to the outside of the display device.

The lens array 133 may have a convex surface facing the substrate 120 side or a convex surface facing the light-emitting device 130 side.

The lens array 133 can be formed using at least one of an inorganic material and an organic material. For example, a material containing a resin can be used for the lens. Moreover, a material containing at least one of an oxide and a sulfide can be used for the lens. As the lens array 133, a microlens array can be used. The lens array 133 may be directly formed over the substrate or the light-emitting device. Alternatively, a lens array separately formed may be bonded thereto.

[Display Device 100D]

Figure 18:
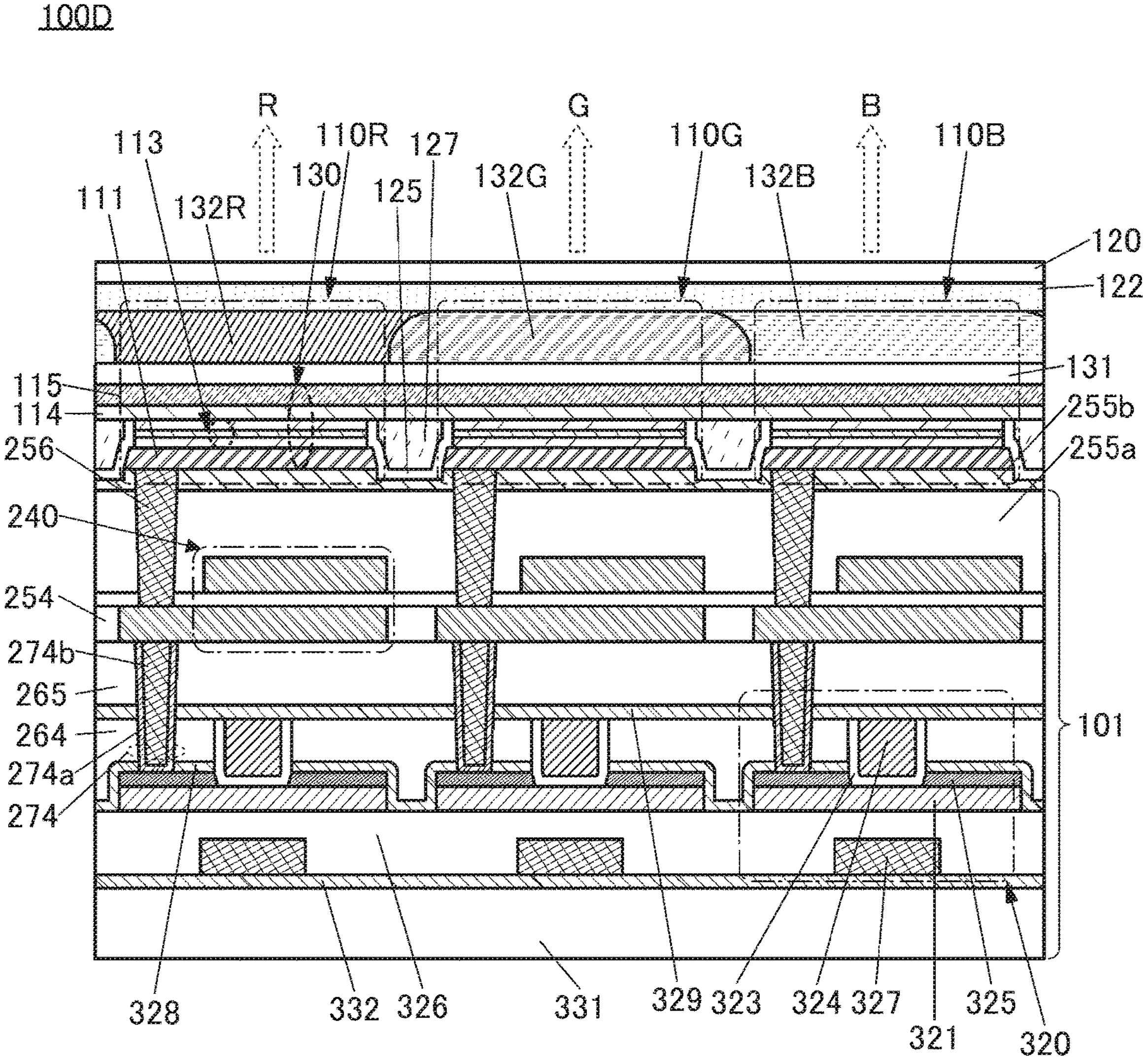
FIG. 18 is a cross-sectional view illustrating an example of a display device.

The display device 100D illustrated in FIG. 18 differs from the display device 100C mainly in a structure of a transistor. Note that in the following description of display devices, the description of portions similar to those of the above-described display devices may be omitted.

A transistor 320 is a transistor that contains a metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 illustrated in FIG. 16A and FIG. 16B. A stacked-layer structure including the substrate 331 and the components thereover up to the insulating layer 255*b* corresponds to the layer 101 including a transistor in Embodiment 1. As the substrate 331, an insulating substrate or a semiconductor substrate can be used.

An insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. As the insulating layer 332, it is possible to use, for example, a film in which hydrogen or oxygen is less likely to diffuse than in a silicon oxide film, such as an aluminum oxide film, a hafnium oxide film, or a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. A metal oxide (also referred to as an oxide semiconductor) film having semiconductor characteristics is preferably used as the semiconductor layer 321.

The pair of conductive layers 325 is provided on and in contact with the semiconductor layer 321, and functions as a source electrode and a drain electrode.

An insulating layer 328 is provided to cover top and the side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325, and the top surface of the semiconductor layer 321 and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are level with or substantially level with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water or hydrogen from the insulating layer 265 and the like into the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274*a* that covers the side surfaces of openings formed in the insulating layer 265, the insulating layer 329, the insulating layer 264, and the insulating layer 328 and part of the top surface of the conductive layer 325, and a conductive layer 274*b* in contact with the top surface of the conductive layer 274*a*. For the conductive layer 274*a*, a conductive material in which hydrogen and oxygen are less likely to diffuse is preferably used.

The structures of the insulating layer 254 and the components thereover up to the substrate 120 in the display device 100D are similar to those in the display device 100C.

[Display Device 100E]

Figure 19:
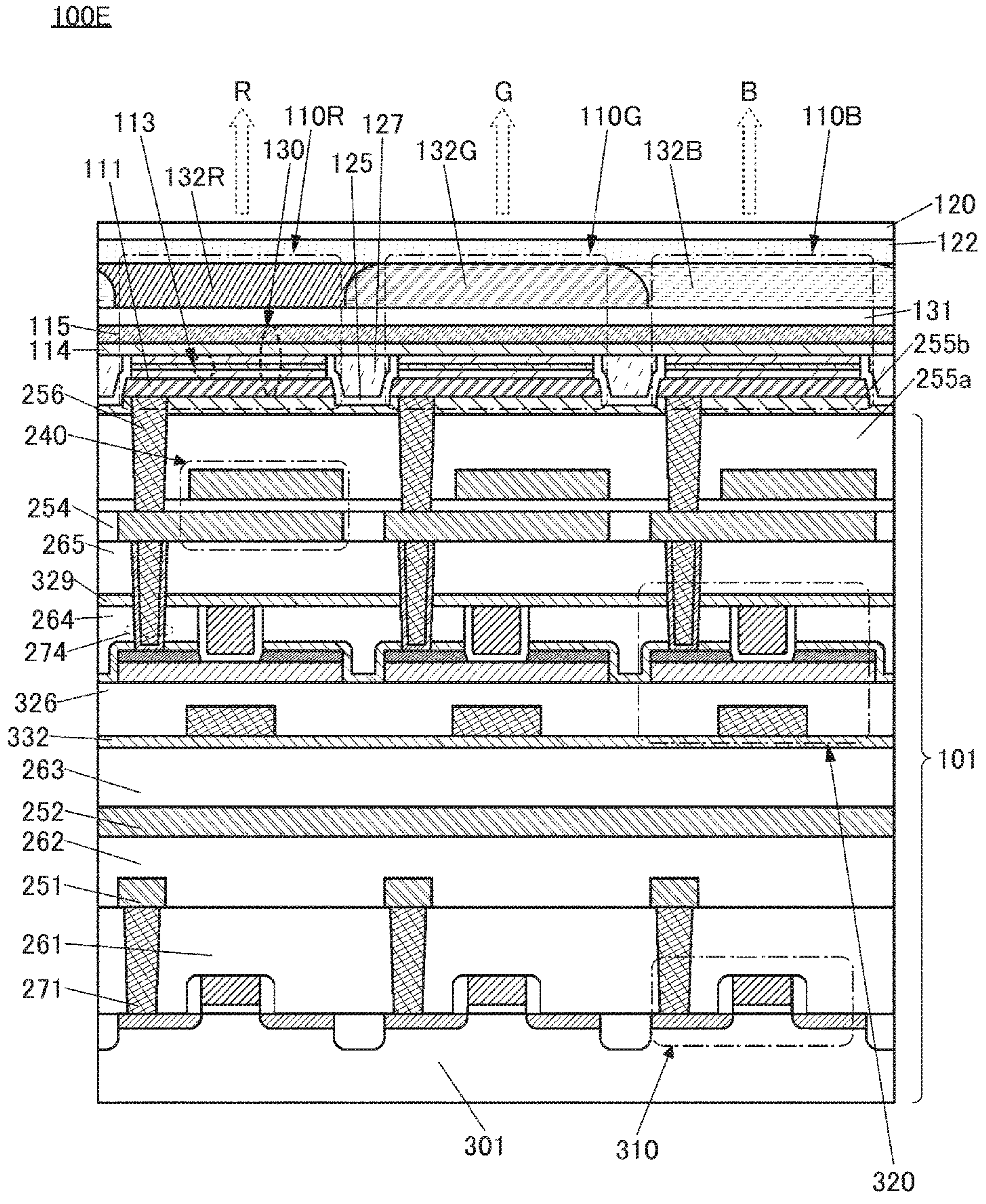
FIG. 19 is a cross-sectional view illustrating an example of a display device.

The display device 100E illustrated in FIG. 19 has a structure in which the transistor 310 whose channel is formed in the substrate 301 and the transistor 320 including a metal oxide in the semiconductor layer where the channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display device can be downsized as compared with the case where a driver circuit is provided around a display region.

[Display Device 100F]

Figure 20:
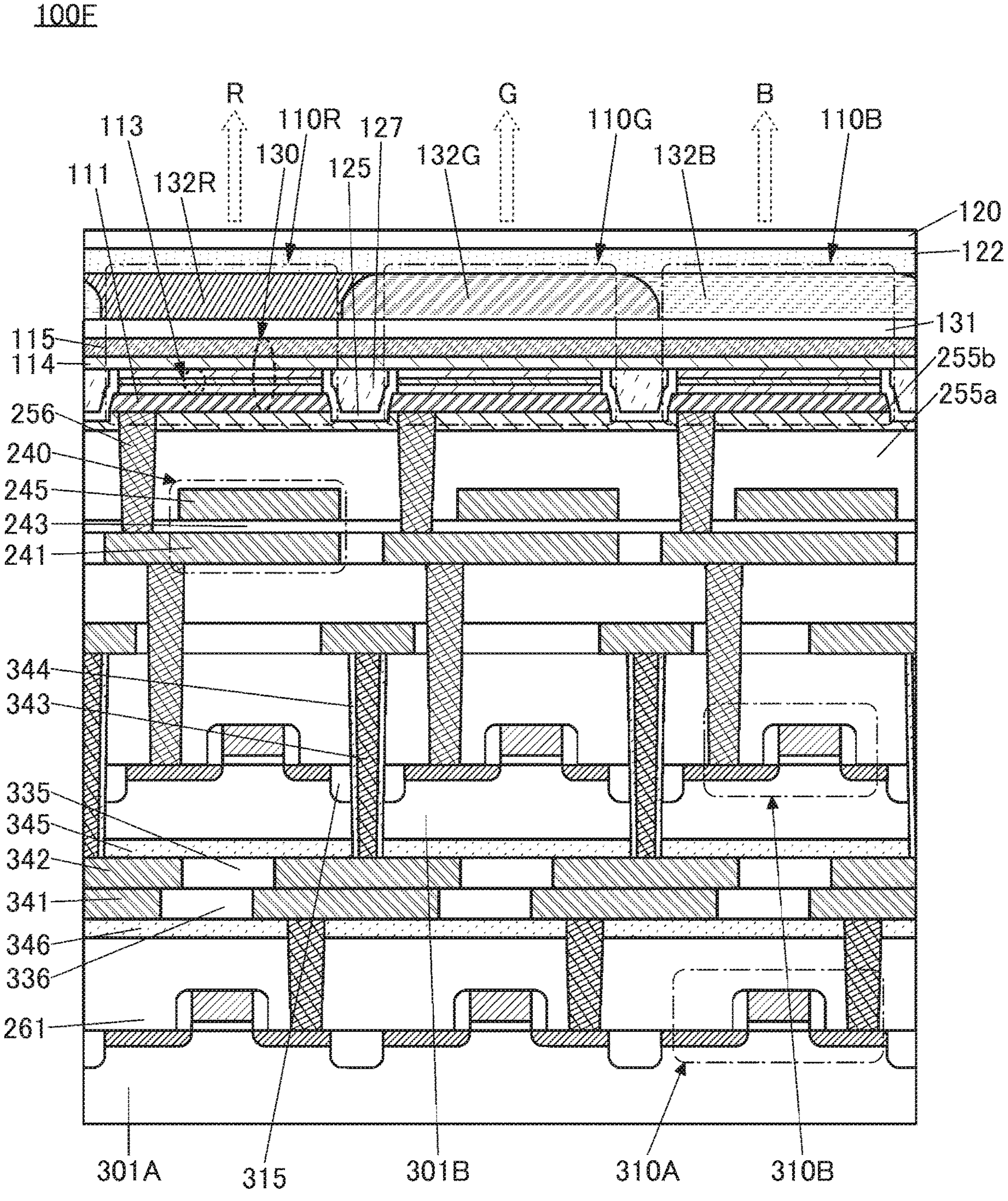
FIG. 20 is a cross-sectional view illustrating an example of a display device.

The display device 100F illustrated in FIG. 20 has a structure where a transistor 310A and a transistor 310B in each of which a channel is formed in a semiconductor substrate are stacked.

In the display device 100F, a substrate 301B provided with the transistor 310B, the capacitor 240, and the light-emitting devices is attached to a substrate 301A provided with the transistor 310A.

Here, an insulating layer 345 is preferably provided on the bottom surface of the substrate 301B. An insulating layer 346 is preferably provided over the insulating layer 261 over the substrate 301A. The insulating layers 345 and 346 function as protective layers and can inhibit diffusion of impurities into the substrate 301B and the substrate 301A. As the insulating layers 345 and 346, an inorganic insulating film that can be used as the protective layer 131 can be used.

The substrate 301B is provided with a plug 343 that penetrates the substrate 301B and the insulating layer 345. Here, an insulating layer 344 is preferably provided to cover the side surface of the plug 343. The insulating layer 344 functions as a protective layer and can inhibit diffusion of impurities into the substrate 301B. As the insulating layer 344, an inorganic insulating film that can be used as the protective layer 131 can be used.

A conductive layer 342 is provided under the insulating layer 345 on the rear surface of the substrate 301B (the surface opposite to the substrate 120). The conductive layer 342 is preferably provided to be embedded in an insulating layer 335. The bottom surfaces of the conductive layer 342 and the insulating layer 335 are preferably planarized. Here, the conductive layer 342 is electrically connected to the plug 343.

A conductive layer 341 is provided over the insulating layer 346 over the substrate 301A. The conductive layer 341 is preferably provided to be embedded in an insulating layer 336. The top surfaces of the conductive layer 341 and the insulating layer 336 are preferably planarized.

The conductive layer 341 and the conductive layer 342 are bonded to each other, whereby the substrate 301A and the substrate 301B are electrically connected to each other. Here, improving the flatness of a plane formed by the conductive layer 342 and the insulating layer 335 and a plane formed by the conductive layer 341 and the insulating layer 336 allows the conductive layer 341 and the conductive layer 342 to be bonded to each other favorably.

The conductive layer 341 and the conductive layer 342 are preferably formed using the same conductive material. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. Copper is particularly preferably used for the conductive layer 341 and the conductive layer 342. In that case, it is possible to employ a Cu-to-Cu (copper-to-copper) direct bonding technique (a technique for achieving electrical continuity by connecting Cu (copper) pads).

[Display Device 100G]

Figure 21:
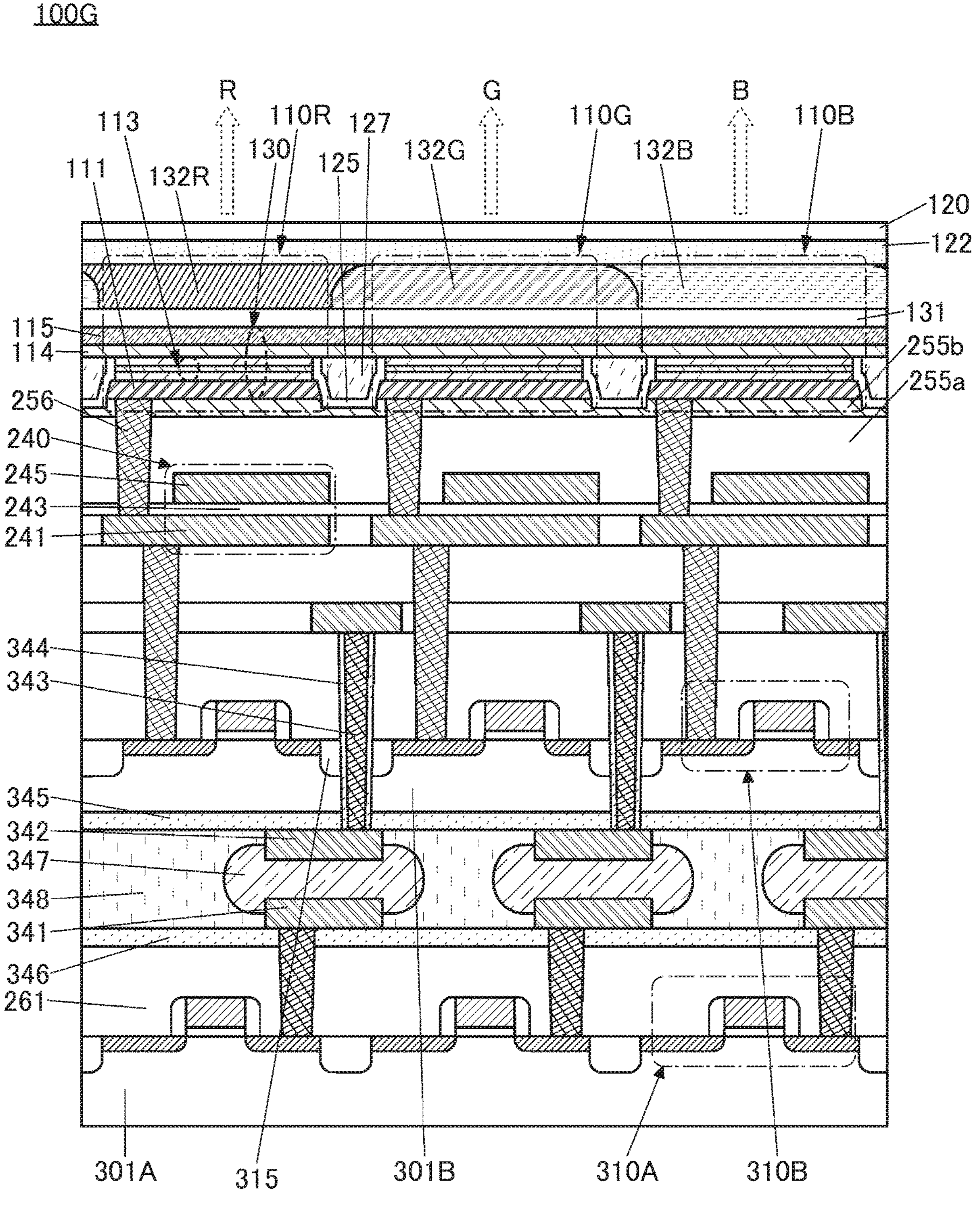
FIG. 21 is a cross-sectional view illustrating an example of a display device.

Although FIG. 20 illustrates an example in which Cu-to-Cu direct bonding technique is used to bond the conductive layer 341 and the conductive layer 342, the present invention is not limited thereto. As illustrated in FIG. 21, the conductive layer 341 and the conductive layer 342 may be bonded to each other through a bump 347 in the display device 100G.

As illustrated in FIG. 21, providing the bump 347 between the conductive layer 341 and the conductive layer 342 enables the conductive layer 341 and the conductive layer 342 to be electrically connected to each other. The bump 347 can be formed using a conductive material containing gold (Au), nickel (Ni), indium (In), tin (Sn), or the like, for example. As another example, solder may be used for the bump 347. An adhesive layer 348 may be provided between the insulating layer 345 and the insulating layer 346. In the case where the bump 347 is provided, the insulating layer 335 and the insulating layer 336 may be omitted.

[Display Device 100H]

Figure 22:
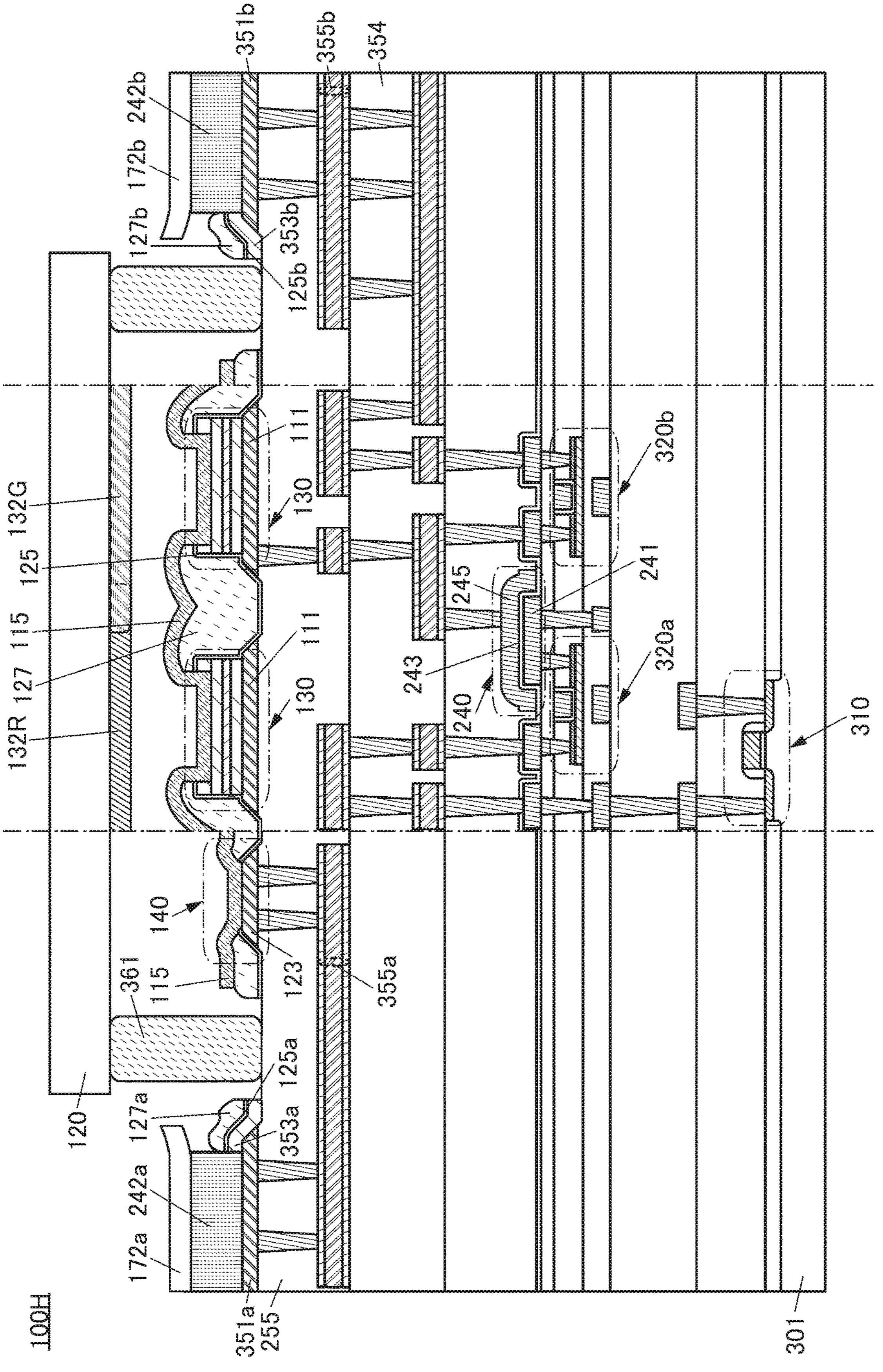
FIG. 22 is a cross-sectional view illustrating an example of a display device.

FIG. 22 is a cross-sectional view of a display device 100H. The display device 100H includes the transistor 310, a transistor 320*a*, a transistor 320*b*, the capacitor 240, the light-emitting device 130, the coloring layer 132R, the coloring layer 132G, the connection portion 140, and the like between the substrate 301 and the substrate 120. The light-emitting device 130 and the connection portion 140 are provided over an insulating layer 255. The insulating layer 255 can be formed using any of the materials that can be used for the insulating layers 255*a* and 255*b*. The insulating layer 255 may have a stacked-layer structure of the insulating layer 255*a* and the insulating layer 255*b*. The insulating layer 255 and the substrate 120 are attached to each other with a sealant 361. For the sealant 361, the material that can be used for the adhesive layer 142 can be used.

The light-emitting device 130 included in the display device 100H can emit white light. Providing the coloring layer to have a region overlapping with the light-emitting device 130 enables the display device 100H to perform full-color display. FIG. 22 illustrates the coloring layer 132R transmitting red light and the coloring layer 132G transmitting green light which are among the coloring layers provided in the display device 100H. FIG. 22 illustrates the light-emitting device 130 overlapping with the coloring layer 132R and the light-emitting device 130 overlapping with the coloring layer 132G. In FIG. 22, the dotted line represents a region where the coloring layer 132R and the coloring layer 132G overlap with each other.

The pixel electrode 111 included in the light-emitting device 130 is electrically connected to one of a source and a drain of the transistor 320*b* and the conductive layer 245 included in the capacitor 240. The conductive layer 241 included in the capacitor 240 is electrically connected to one of a source and a drain of the transistor 320*a*. The other of the source and the drain of the transistor 320*a* is electrically connected to one of the source and the drain of the transistor 310.

The transistor 320*a* and the transistor 320*b* can each have a structure similar to that of the transistor 320. That is, the transistor 320 can be an OS transistor, for example.

The conductive layer 123 included in the connection portion 140 is electrically connected to a conductive layer 351*a* over the insulating layer 255 through a wiring 355*a* and the like provided over an insulating layer 354. The conductive layer 351*a* is electrically connected to an FPC 172*a* through a connection layer 242*a*. As described above, the common electrode 115 is electrically connected to the conductive layer 123, and thus the common electrode 115 is electrically connected to the FPC 172*a* through the conductive layer 123, the wiring 355*a*, the conductive layer 351*a*, the connection layer 242*a*, and the like. Accordingly, the common electrode 115 is supplied with a potential such as a power supply potential from the outside of the display device 100H through the FPC 172*a* and the like.

An end portion of the conductive layer 351*a* is covered with a sacrificial layer 353*a*. An insulating layer 125*a* and an insulating layer 127*a* are stacked in this order over the sacrificial layer 353*a*.

The other of the source and the drain of the transistor 320*b* is electrically connected to a conductive layer 351*b* over the insulating layer 255 through a wiring 355*b* and the like provided over the insulating layer 354. The conductive layer 351*b* is electrically connected to an FPC 172*b* through a connection layer 242*b*. Thus, the other of the source and the drain of the transistor 320*b* is electrically connected to the FPC 172*b* through the wiring 355*b*, the conductive layer 351*b*, the connection layer 242*b*, and the like. Accordingly, the other of the source and the drain of the transistor 320*b* is supplied with a potential such as a power supply potential from the outside of the display device 100H through the FPC 172*b* and the like.

Here, a potential supplied to the FPC 172*a* and a potential supplied to the FPC 172*b* can be different from each other. For example, a high potential is supplied to the FPC 172*a* and a low potential can be supplied to the FPC 172*b*. Alternatively, a low potential can be supplied to the FPC 172*a* and a high potential can be supplied to the FPC 172*b*. Current flows to the light-emitting device 130 in this manner and the light-emitting device 130 can emit light.

An end portion of the conductive layer 351*b* is covered with a sacrificial layer 353*b*. An insulating layer 125*b* and an insulating layer 127*b* are stacked in this order over the sacrificial layer 353*b*.

The connection layer 242*a* and the connection layer 242*b* can each have a structure similar to that of the connection layer 242; an ACF can be used, for example. The sacrificial layer 353*a* and the sacrificial layer 353*b* can each have a stacked-layer structure of the sacrificial layer 118 and the sacrificial layer 119 (see FIG. 6C). The insulating layer 125*a* and the insulating layer 125*b* each include a material similar to that of the insulating layer 125 and the insulating layer 127*a* and the insulating layer 127*b* each include a material similar to that of the insulating layer 127.

The conductive layer 351*a* and the conductive layer 351*b* can be formed using the same material through the same steps as the pixel electrode 111 and the conductive layer 123.

The connection portion 140 is provided between the display portion in which the light-emitting device 130 is provided and the sealant 361. In contrast, the conductive layer 351*a*, the connection layer 242*a*, the FPC 172*a*, the sacrificial layer 353*a*, the insulating layer 125*a*, and the insulating layer 127*a* are provided outward from the sealant 361 (on the side opposite to the display portion). The conductive layer 351*b*, the connection layer 242*b*, the FPC 172*b*, the sacrificial layer 353*b*, the insulating layer 125*b*, and the insulating layer 127*b* are provided outward from the sealant 361 (on the side opposite to the display portion). The conductive layer 351*a*, the conductive layer 351*b*, the connection layer 242*a*, the connection layer 242*b*, the FPC 172*a*, the FPC 172*b*, the sacrificial layer 353*a*, the sacrificial layer 353*b*, the insulating layer 125*a*, the insulating layer 125*b*, the insulating layer 127*a*, and the insulating layer 127*b* have regions not overlapping with the substrate 120.

This embodiment can be combined with any of the other embodiments as appropriate.

Embodiment 4

In this embodiment, a light-emitting device that can be used in the display device of one embodiment of the present invention will be described.

Figure 23A:
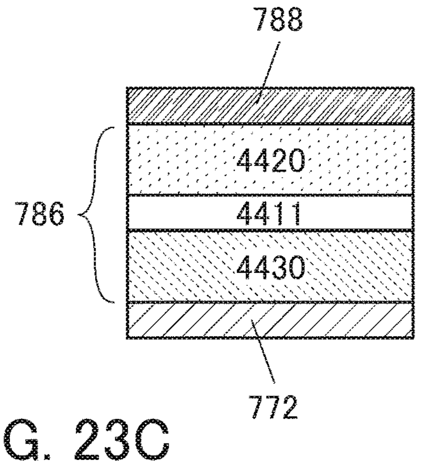
FIG. 23A to FIG. 23F are diagrams each illustrating a structure example of a light-emitting device.

As illustrated in FIG. 23A, the light-emitting device includes an EL layer 786 between a pair of electrodes (a lower electrode 772 and an upper electrode 788). The EL layer 786 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes, can function as a single light-emitting unit, and the structure in FIG. 23A is referred to as a single structure in this specification.

Figure 23B:
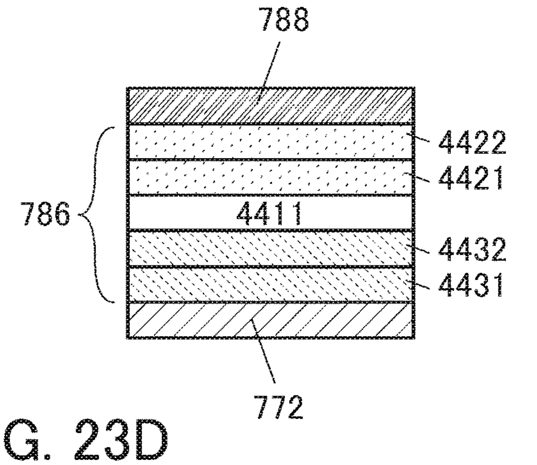

FIG. 23B is a variation example of the EL layer 786 included in the light-emitting device illustrated in FIG. 23A. Specifically, the light-emitting device illustrated in FIG. 23B includes a layer 4431 over the lower electrode 772, a layer 4432 over the layer 4431, the light-emitting layer 4411 over the layer 4432, a layer 4421 over the light-emitting layer 4411, a layer 4422 over the layer 4421, and the upper electrode 788 over the layer 4422. For example, when the lower electrode 772 is an anode and the upper electrode 788 is a cathode, the layer 4431 functions as a hole-injection layer, the layer 4432 functions as a hole-transport layer, the layer 4421 functions as an electron-transport layer, and the layer 4422 functions as an electron-injection layer. Alternatively, when the lower electrode 772 is a cathode and the upper electrode 788 is an anode, the layer 4431 functions as an electron-injection layer, the layer 4432 functions as an electron-transport layer, the layer 4421 functions as a hole-transport layer, and the layer 4422 functions as a hole-injection layer. With such a layered structure, carriers can be efficiently injected into the light-emitting layer 4411, and the efficiency of the recombination of carriers in the light-emitting layer 4411 can be enhanced.

Figure 23C:
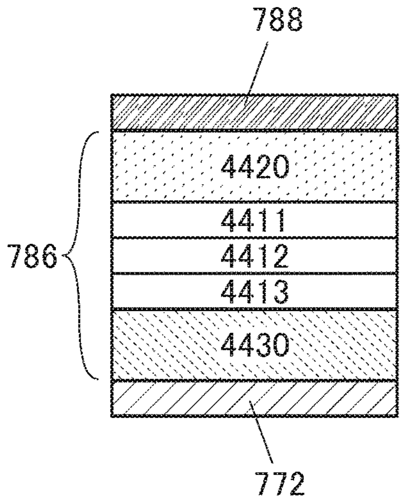
Figure 23D:
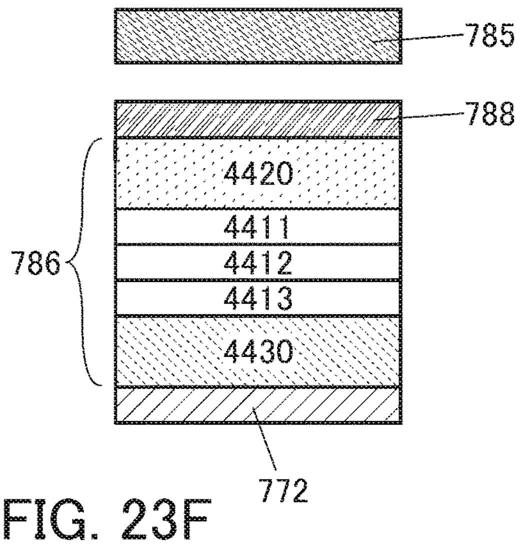

Note that structures in which a plurality of light-emitting layers (light-emitting layers 4411, 4412, and 4413) are provided between the layer 4420 and the layer 4430 as illustrated in FIG. 23C and FIG. 23D are other variations of the single structure.

Figure 23E:
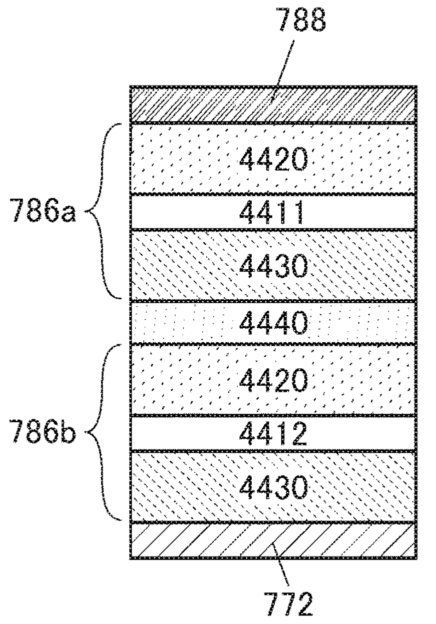
Figure 23F:
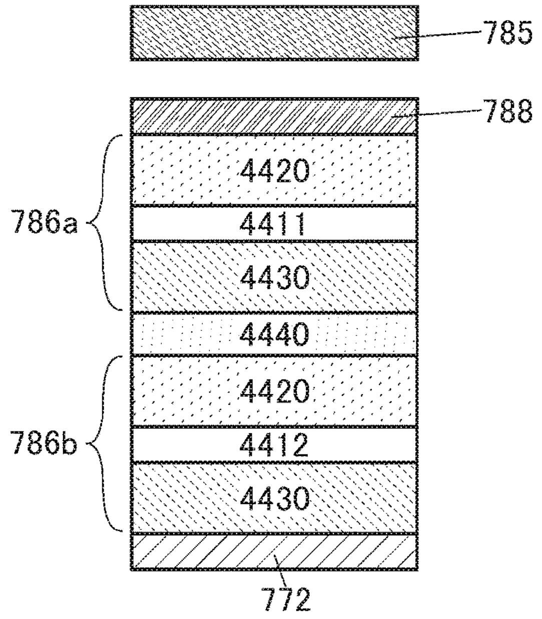

Structures in which a plurality of light-emitting units (an EL layer 786*a* and an EL layer 786*b*) are connected in series with a charge-generation layer 4440 therebetween as illustrated in FIG. 23E and FIG. 23F are referred to as a tandem structure in this specification. A tandem structure may be referred to as a stack structure. The tandem structure enables a light-emitting device capable of high luminance light emission.

In FIG. 23C and FIG. 23D, light-emitting materials that emit light of the same color, or moreover, the same light-emitting material may be used for the light-emitting layer 4411, the light-emitting layer 4412, and the light-emitting layer 4413. For example, a light-emitting material emitting blue light may be used for the light-emitting layer 4411, the light-emitting layer 4412, and the light-emitting layer 4413. A color conversion layer may be provided as a layer 785 illustrated in FIG. 23D.

Alternatively, light-emitting materials that emit light of different colors may be used for the light-emitting layer 4411, the light-emitting layer 4412, and the light-emitting layer 4413. White light can be obtained when the light-emitting layer 4411, the light-emitting layer 4412, and the light-emitting layer 4413 emit light of complementary colors. A color filter (also referred to as a coloring layer) may be provided as the layer 785 illustrated in FIG. 23D. When white light passes through a color filter, light of a desired color can be obtained.

In FIG. 23E and FIG. 23F, light-emitting materials that emit light of the same color, or moreover, the same light-emitting material may be used for the light-emitting layer 4411 and the light-emitting layer 4412. Alternatively, light-emitting materials that emit light of different colors may be used for the light-emitting layer 4411 and the light-emitting layer 4412. White light can be obtained when the light-emitting layer 4411 and the light-emitting layer 4412 emit light of complementary colors. FIG. 23F illustrates an example in which the layer 785 is further provided. One or both of a color conversion layer and a color filter (a coloring layer) can be used as the layer 785.

In FIG. 23C, FIG. 23D, FIG. 23E, and FIG. 23F, the layer 4420 and the layer 4430 may each have a stacked-layered structure of two or more layers as in FIG. 23B.

A structure in which light-emitting devices of different emission colors (e.g., blue (B), green (G), and red (R)) are separately formed is referred to as an SBS (Side By Side) structure in some cases.

The emission color of the light-emitting device can be changed to red, green, blue, cyan, magenta, yellow, white, or the like depending on the material of the EL layer 786. When the light-emitting device has a microcavity structure, the color purity can be further increased.

In the light-emitting device emitting white light, the light-emitting layer preferably contains two or more kinds of light-emitting substances. In order to obtain white light, light-emitting substances may be selected so that colors of light emitted by the two light-emitting substances are complementary colors, or light-emitting substances may be selected so that colors of light emitted by two or more light-emitting substances are combined to be white. For example, in the case where white light is obtained with use of two light-emitting layers, the emission colors of the two light-emitting layers are complementary, so that the light-emitting device can emit white light as a whole. In the case where three or more light-emitting layers are used to obtain white light emission, a light-emitting device is configured to emit white light as a whole by combining emission colors of the three or more light-emitting layers.

The light-emitting layer preferably contains two or more selected from light-emitting substances that emit light of R (red), G (green), B (blue), Y (yellow), O (orange), and the like. Alternatively, the light-emitting layer preferably contains two or more light-emitting substances that emit light containing two or more of spectral components of R, G, and B.

This embodiment can be combined with any of the other embodiments as appropriate.

Embodiment 5

In this embodiment, electronic devices of one embodiment of the present invention will be described with reference to FIG. 24 to FIG. 27.

Electronic devices of this embodiment are each provided with the display device of one embodiment of the present invention in a display portion. The display device of one embodiment of the present invention can be easily increased in resolution and definition. Thus, the display device of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and laptop personal computers, a monitor of a computer and the like, digital signage, and a large game machine such as a pachinko machine.

In particular, the display device of one embodiment of the present invention can have a high resolution, and thus can be suitably used for an electronic device having a relatively small display portion. Examples of such an electronic device include watch-type and bracelet-type information terminal devices (wearable devices) and wearable devices worn on the head, such as a VR device like a head-mounted display, a glasses-type AR device, and an MR device.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. The pixel density (resolution) of the display device of one embodiment of the present invention is preferably 100 ppi or higher, further preferably 300 ppi or higher, further preferably 500 ppi or higher, further preferably 1000 ppi or higher, still further preferably 2000 ppi or higher, still further preferably 3000 ppi or higher, still further preferably 5000 ppi or higher, yet further preferably 7000 ppi or higher. With the use of the display device having one or both of such high definition and high resolution, the electronic device can provide higher realistic sensation, sense of depth, and the like in personal use such as portable use and home use. There is no particular limitation on the screen ratio (aspect ratio) of the display device of one embodiment of the present invention. For example, the display device is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices will be described with reference to FIG. 24A to FIG. 24D. These wearable devices have one or both of a function of displaying AR contents and a function of displaying VR contents. Note that these wearable devices may have a function of displaying SR or MR contents, in addition to AR and VR contents. The electronic device having a function of displaying contents of AR, VR, SR, MR, or the like enables the user to reach a higher level of immersion.

Figure 24A:
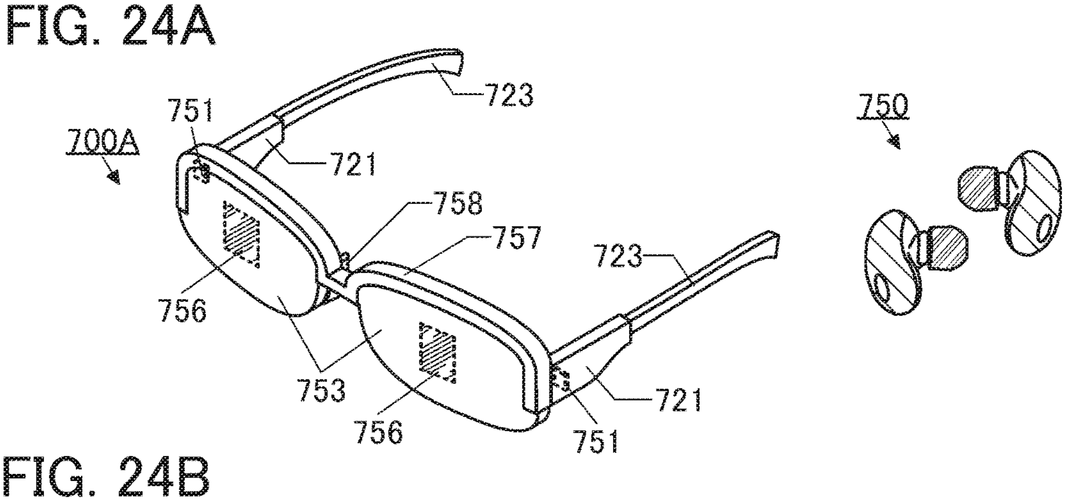
FIG. 24A to FIG. 24D are diagrams each illustrating an example of an electronic device.
Figure 24B:
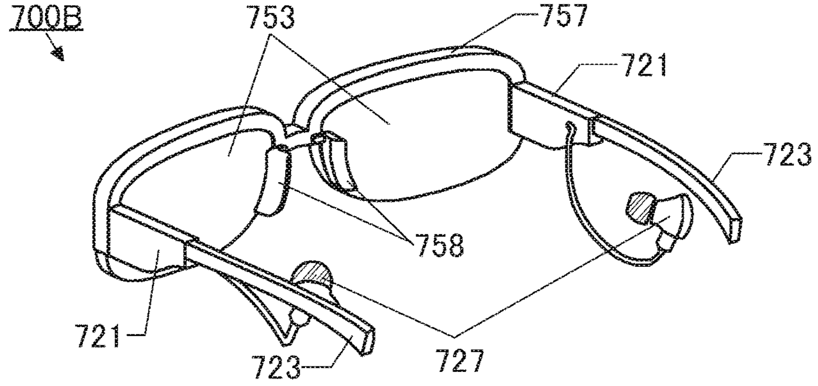

An electronic device 700A illustrated in FIG. 24A and an electronic device 700B illustrated in FIG. 24B each include a pair of display panels 751, a pair of housings 721, a communication portion (not illustrated), a pair of mounting portions 723, a control portion (not illustrated), an image capturing portion (not illustrated), a pair of optical members 753, a frame 757, and a pair of nose pads 758.

The display device of one embodiment of the present invention can be used for the display panels 751. Thus, the electronic devices are capable of performing ultrahigh-resolution display.

The electronic device 700A and the electronic device 700B can each project images displayed on the display panels 751 onto display regions 756 of the optical members 753. Since the optical members 753 have a light-transmitting property, the user can see images displayed on the display regions, which are superimposed on transmission images seen through the optical members 753. Accordingly, the electronic device 700A and the electronic device 700B are electronic devices capable of AR display.

In the electronic device 700A and the electronic device 700B, a camera capable of capturing images of the front side may be provided as the image capturing portion. Furthermore, when the electronic device 700A and the electronic device 700B are provided with an acceleration sensor such as a gyroscope sensor, the orientation of the user's head can be detected and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic device 700A and the electronic device 700B are provided with a battery so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion device (also referred to as a photoelectric conversion element) can be used as a light-receiving device (also referred to as a light-receiving element). One or both of an inorganic semiconductor and an organic semiconductor can be used for an active layer of the photoelectric conversion device.

Figure 24C:
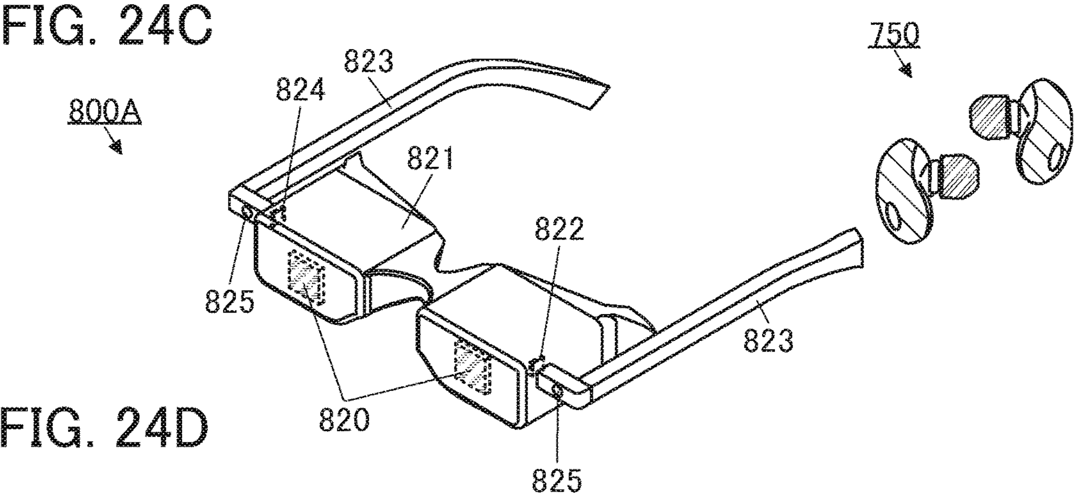
Figure 24D:
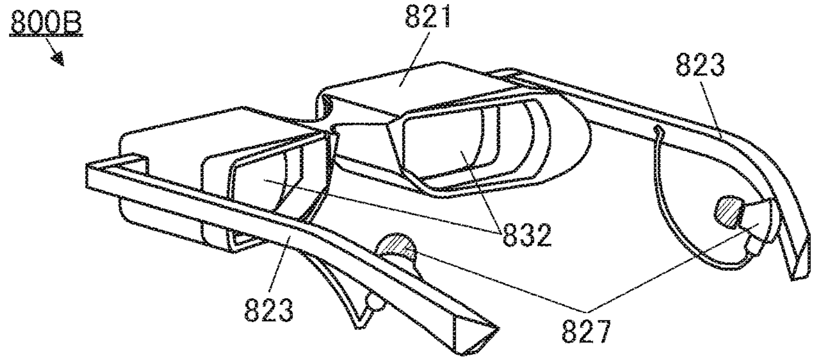

An electronic device 800A illustrated in FIG. 24C and an electronic device 800B illustrated in FIG. 24D each include a pair of display portions 820, a housing 821, a communication portion 822, a pair of mounting portions 823, a control portion 824, a pair of image capturing portions 825, and a pair of lenses 832.

The display device of one embodiment of the present invention can be used in the display portions 820. Thus, the electronic devices are capable of performing ultrahigh-resolution display. Such electronic devices can provide an enhanced sense of immersion to the user.

The display portions 820 are positioned inside the housing 821 so as to be seen through the lenses 832. When the pair of display portions 820 display different images, three-dimensional display using parallax can also be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B preferably include a mechanism for adjusting the lateral positions of the lenses 832 and the display portions 820 so that the lenses 832 and the display portions 820 are positioned optimally in accordance with the positions of the user's eyes. Moreover, the electronic device 800A and the electronic device 800B preferably include a mechanism for adjusting focus by changing the distance between the lenses 832 and the display portions 820.

The electronic device 800A or the electronic device 800B can be mounted on the user's head with the mounting portions 823. FIG. 24C and the like illustrate examples where the mounting portion 823 has a shape like a temple (also referred to as a joint or the like) of glasses; however, one embodiment of the present invention is not limited thereto. The mounting portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example where the image capturing portion 825 is provided is described here, a range sensor capable of measuring a distance between the user and an object (hereinafter also referred to as a detecting portion) just needs to be provided. In other words, the image capturing portion 825 is one embodiment of the detecting portion. As the detecting portion, an image sensor or a range image sensor such as LIDAR (Light Detection and Ranging) can be used, for example. By using images obtained by the camera and images obtained by the range image sensor, more information can be obtained and a gesture operation with higher accuracy is possible.

The electronic device 800A may include a vibration mechanism that functions as bone-conduction earphones. For example, at least one of the display portion 820, the housing 821, and the mounting portion 823 can include the vibration mechanism. Thus, without additionally requiring an audio device such as headphones, earphones, or a speaker, the user can enjoy video and sound only by wearing the electronic device 800A.

The electronic device 800A and the electronic device 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and has a wireless communication function. The earphones 750 can receive information (e.g., audio data) from the electronic device with the wireless communication function. For example, the electronic device 700A in FIG. 24A has a function of transmitting information to the earphones 750 with the wireless communication function. As another example, the electronic device 800A in FIG. 24C has a function of transmitting information to the earphones 750 with the wireless communication function.

The electronic device may include an earphone portion. The electronic device 700B in FIG. 24B includes earphone portions 727. For example, the earphone portion 727 can be connected to the control portion by wire. Part of a wiring that connects the earphone portion 727 and the control portion may be positioned inside the housing 721 or the mounting portion 723.

Similarly, the electronic device 800B in FIG. 24D includes earphone portions 827. For example, the earphone portion 827 can be connected to the control portion 824 by wire. Part of a wiring that connects the earphone portion 827 and the control portion 824 may be positioned inside the housing 821 or the mounting portion 823. Alternatively, the earphone portions 827 and the mounting portions 823 may include magnets. This is preferred because the earphone portions 827 can be fixed to the mounting portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

Figure 25A:
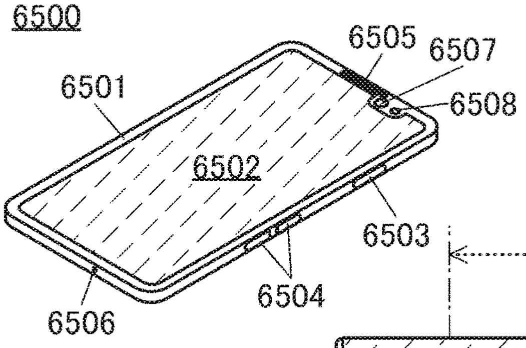
FIG. 25A to FIG. 25F are diagrams illustrating examples of electronic devices.

An electronic device 6500 illustrated in FIG. 25A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 25B:
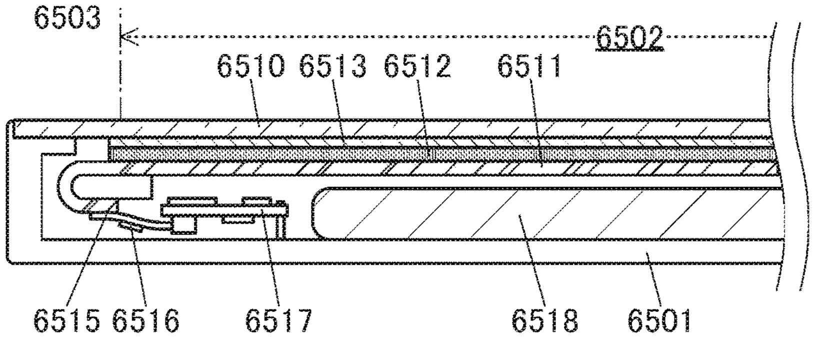

FIG. 25B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be achieved.

Figure 25C:
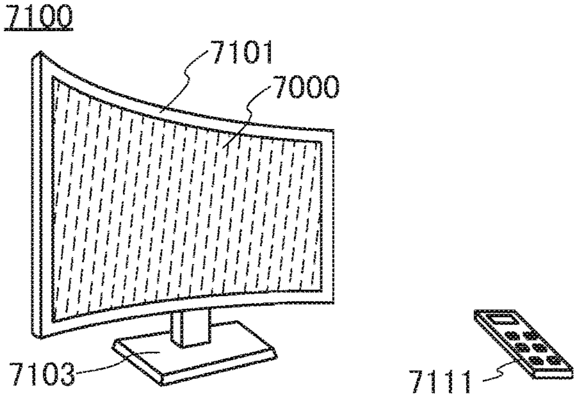

FIG. 25C illustrates an example of a television device. In a television device 7100, a display portion 7000 is incorporated in a housing 7101. Here, the housing 7101 is supported by a stand 7103.

The display device of one embodiment of the present invention can be used in the display portion 7000.

Operation of the television device 7100 illustrated in FIG. 25C can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 includes a receiver, a modem, and the like. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 25D:
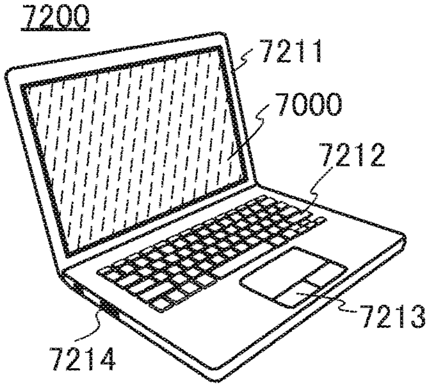

FIG. 25D illustrates an example of a laptop personal computer. A laptop personal computer 7200 includes a housing 7211, a keyboard 7212, a pointing device 7213, an external connection port 7214, and the like. The display portion 7000 is incorporated in the housing 7211.

The display device of one embodiment of the present invention can be used in the display portion 7000.

Figure 25E:
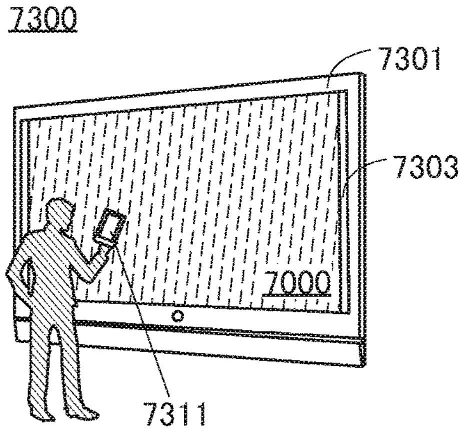
Figure 25F:
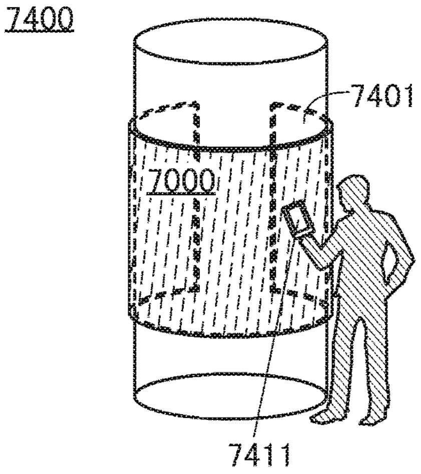

FIG. 25E and FIG. 25F illustrate examples of digital signage.

Digital signage 7300 illustrated in FIG. 25E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 25F is digital signage 7400 attached to a cylindrical pillar 7401. The digital signage 7400 includes the display portion 7000 provided along a curved surface of the pillar 7401. The display device of one embodiment of the present invention can be used in the display portion 7000 illustrated in each of FIG. 25E and FIG. 25F.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of an image or a moving image on the display portion 7000, intuitive operation by a user is possible. Moreover, for an application for providing information such as route information or traffic information, usability can be enhanced by intuitive operation.

As illustrated in FIG. 25E and FIG. 25F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 26A to FIG. 26G each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

In FIG. 26A to FIG. 26G, the display device of one embodiment of the present invention can be used in the display portion 9001.

The electronic devices illustrated in FIG. 26A to FIG. 26G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may be provided with a camera or the like and have a function of capturing a still image or a moving image, a function of storing the captured image in a storage medium (an external storage medium or a storage medium incorporated in the camera), a function of displaying the captured image on the display portion, and the like.

The electronic devices illustrated in FIG. 26A to FIG. 26G will be described in detail below.

Figure 26A:
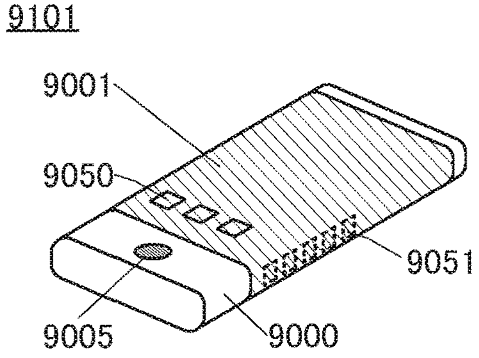
FIG. 26A to FIG. 26G are diagrams illustrating examples of electronic devices.

FIG. 26A is a perspective view of a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 26A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 26B:
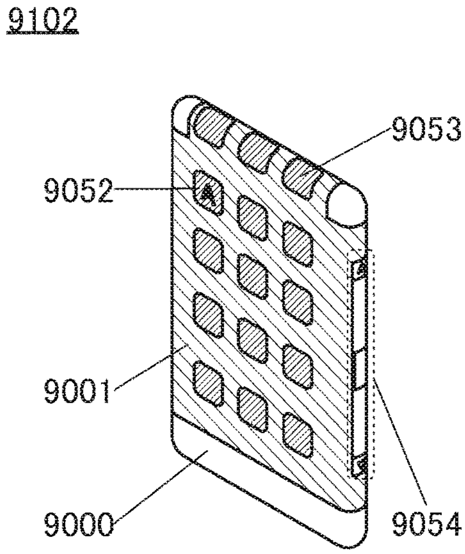

FIG. 26B is a perspective view of a portable information terminal 9102. The portable information terminal 9102 has a function of displaying information on three or more surfaces of the display portion 9001. Here, information 9052, information 9053, and information 9054 are displayed on different surfaces. For example, the user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

Figure 26C:
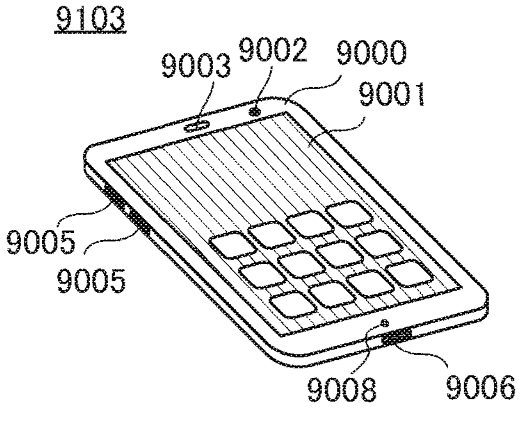

FIG. 26C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, a camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 26D:
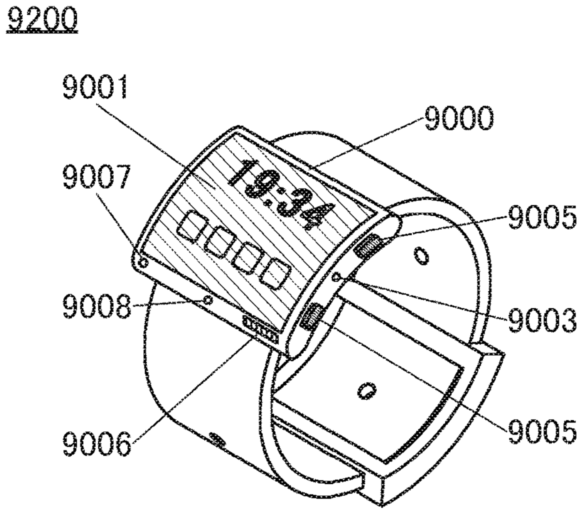

FIG. 26D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 26E:
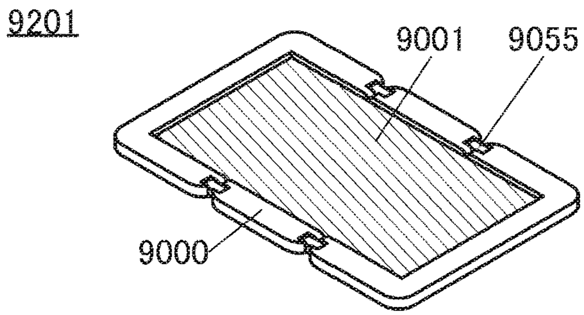
Figure 26F:
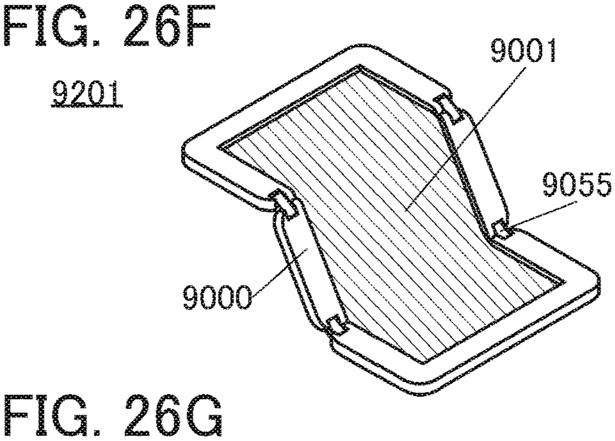
Figure 26G:
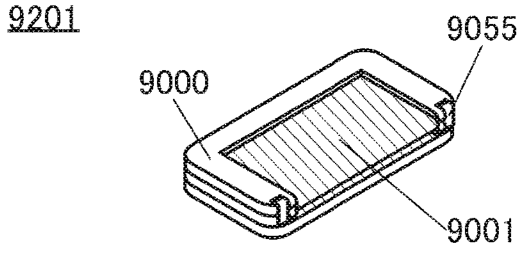

FIG. 26E to FIG. 26G are perspective views of a foldable portable information terminal 9201. FIG. 26E is a perspective view illustrating the portable information terminal 9201 that is opened. FIG. 26G is a perspective view illustrating the portable information terminal 9201 that is folded. FIG. 26F is a perspective view illustrating the portable information terminal 9201 that is shifted from one of the states in FIG. 26E and FIG. 26G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

Figure 27A:
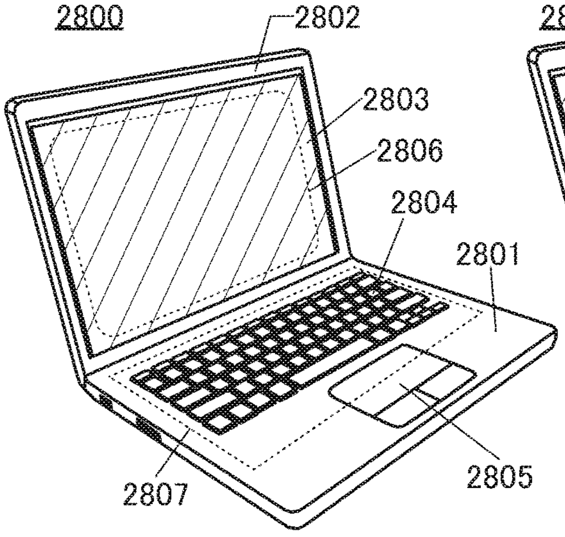
FIG. 27A to FIG. 27F are diagrams illustrating examples of electronic devices.
Figure 27B:
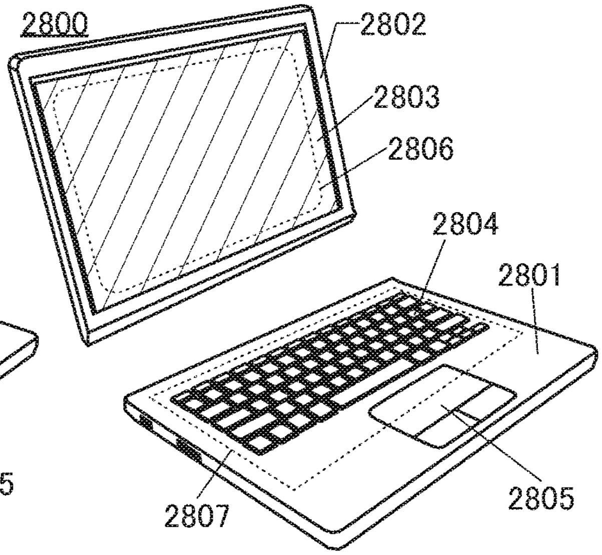

A personal computer 2800 illustrated in FIG. 27A includes a housing 2801, a housing 2802, a display portion 2803, a keyboard 2804, a pointing device 2805, and the like. A secondary battery 2807 is provided inside the housing 2801 and a secondary battery 2806 is provided inside the housing 2802. The display portion 2803 is the display device of one embodiment of the present invention, and has a touch panel function. As illustrated in FIG. 27B, the housing 2801 and the housing 2802 of the personal computer 2800 can be separated and the housing 2802 can be used alone as a tablet terminal.

Figure 27C:
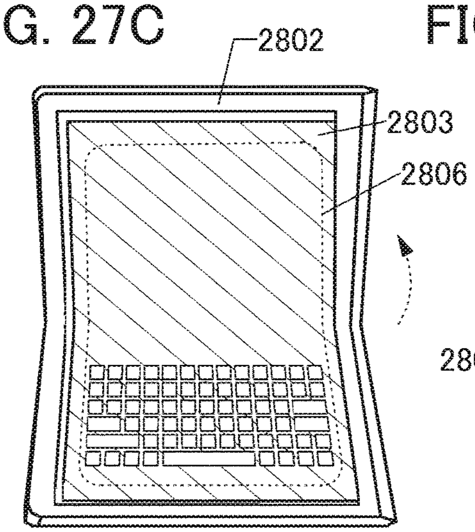

In a variation example of a personal computer illustrated in FIG. 27C, a flexible display is employed for the display portion 2803. With use of a flexible film as an exterior body, the secondary battery 2806 can be bendable secondary battery. Accordingly, the housing 2802, the display portion 2803, and the secondary battery 2806 can be used in a bent state as illustrated in FIG. 27C. At this time, part of the display portion 2803 can also be used as a keyboard as illustrated in FIG. 27C.

Figure 27D:
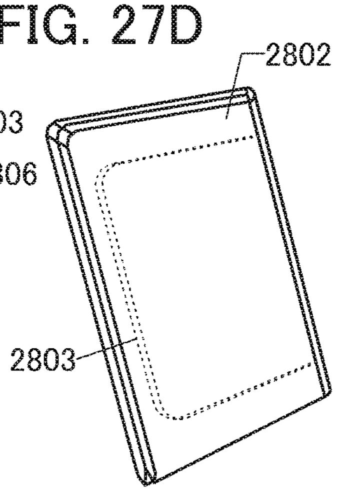
Figure 27E:
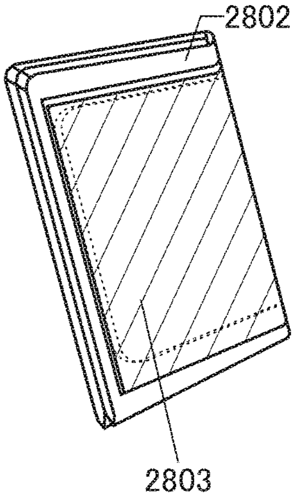

Furthermore, the housing 2802 can be folded so that the display portion 2803 is placed inward as illustrated in FIG. 27D, and the housing 2802 can be folded so that the display portion 2803 faces outward as illustrated in FIG. 27E.

Figure 27F:
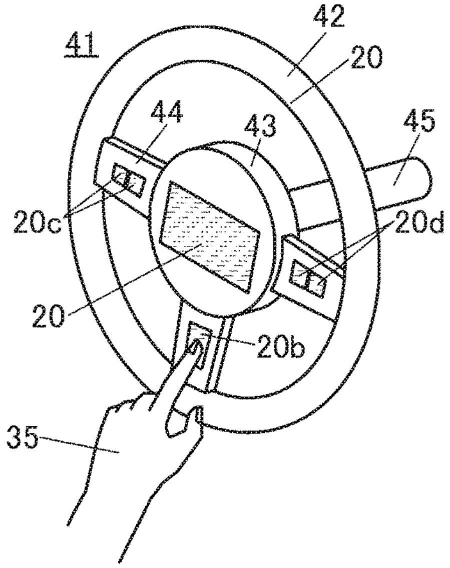

FIG. 27F is a perspective view of a steering wheel of a vehicle. A steering wheel 41 includes a rim 42, a hub 43, spokes 44, a shaft 45, and the like. A display portion 20 is provided on the surface of the hub 43. The display device of one embodiment of the present invention can be used in the display portion 20. The three spokes 44 are each provided with a light-emitting and light-receiving portion. Specifically, the spoke 44 located on the lower side is provided with a light-emitting and light-receiving portion 20*b*; the spoke 44 located on the left side is provided with a plurality of light-emitting and light-receiving portions 20*c*; and the spoke 44 located on the right side is provided with a plurality of light-emitting and light-receiving portions 20*d*. When a driver holds a finger of a hand 35 over the light-receiving and light-emitting portion 20*b*, information on a fingerprint of the driver is acquired, and user authentication can be performed with the information. Touching the light-emitting and light-receiving portion 20*c* and the light-emitting and light-receiving portion 20*d* and the like, the driver can operate systems such as a navigation system, an audio system, and a call system provided in the vehicle. In addition, a variety of operations such as adjustment of a rearview mirror and a sideview mirror, turning on/off of an interior light, adjustment of luminance, and opening/closing a window are possible.

This embodiment can be combined with any of the other embodiments as appropriate.

Example

In this example, a comparison between low luminance display and high luminance display in a display device was made and the result will be described.

In this example, four display devices, a display device A, a display device B, a display device C, and a display device D, were prepared.

In the display device A, the diagonal size of a display portion (also referred to as a display region) is 0.95 inches, the resolution is 3078 ppi, the pixel arrangement is a stripe arrangement of three colors of RGB (see FIG. 1A), and a structure in which a light-emitting device with a tandem structure is combined with a color filter is employed. The display device A employed countermeasures against crosstalk; specifically, the pixel electrode was formed to have a thickness of 258 nm.

In the display device B, the diagonal size of a display portion is 0.7 inches, the resolution is 3256 ppi, the pixel arrangement is a delta arrangement of three colors of RGB (see FIG. 9D and FIG. 9E), and a structure in which a light-emitting device with a single structure is combined with a color filter is employed.

In the display device C, the diagonal size of a display portion is 0.43 inches, the resolution is 3256 ppi, the pixel arrangement is a stripe arrangement of three colors of RGB, and a structure in which a light-emitting device with a single structure is combined with a color filter is employed.

In the display device D, a light-emitting device with a SBS structure where the diagonal size of a display portion is 0.99 inches, the resolution is 2731 ppi, and the pixel arrangement is a stripe arrangement of three colors of RGB is employed. In other words, light-emitting devices of different emission colors are separately formed: a subpixel exhibiting blue light is provided with a light-emitting device including a light-emitting layer emitting blue light, a subpixel exhibiting green light is provided with a light-emitting device including a light-emitting layer emitting green light, and a subpixel exhibiting red light is provided with a light-emitting device including a light-emitting layer emitting red light. The display device D employed countermeasures against crosstalk; specifically, part of the EL layer was processed into an island shape by a photolithography method.

Chromaticity and emission spectra of red (R), green (G), and blue (B) displayed by each display device were measured by a spectroradiometer (SR-LEDW-5N, manufactured by TOPCON TECHNOHOUSE CORPORATION). An emission spectrum of black (BK) display by each display device was also measured. Each color display was performed under two conditions, at high luminance and at low luminance.

The luminance of red, green, and blue for white display by the display portion at 100 cd/m$^2$ luminance were used as the respective high luminance conditions. In other words, single color display of red, green, or blue under the high luminance condition was performed at any value higher than 0 cd/m$^2$ and lower than 100 cd/m$^2$.

The luminance of red, green, and blue for white display by the display portion at 1 cd/m$^2$ luminance were used as the respective low luminance conditions. In other words, single color display of red, green, or blue under the low luminance condition was performed at any value higher than 0 cd/m$^2$ and lower than 1 cd/m$^2$.

Figure 28A:
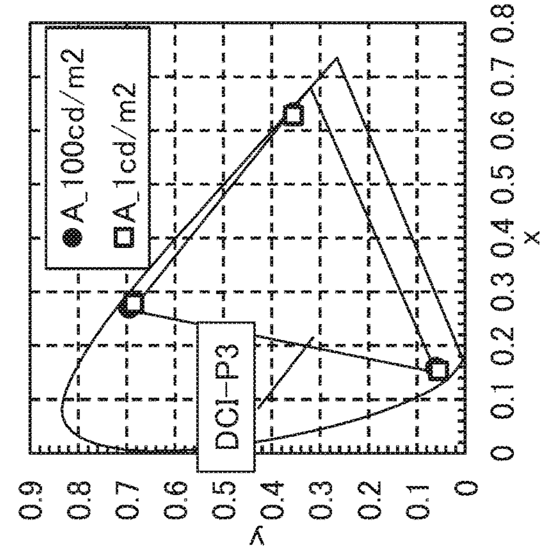
FIG. 28A to FIG. 28C are chromaticity diagrams of display devices.

FIG. 28A shows the chromaticity of the display device A under the high luminance condition (A_100 cd/m$^2$) and under the low luminance condition (A_1 cd/m$^2$).

Figure 28B:
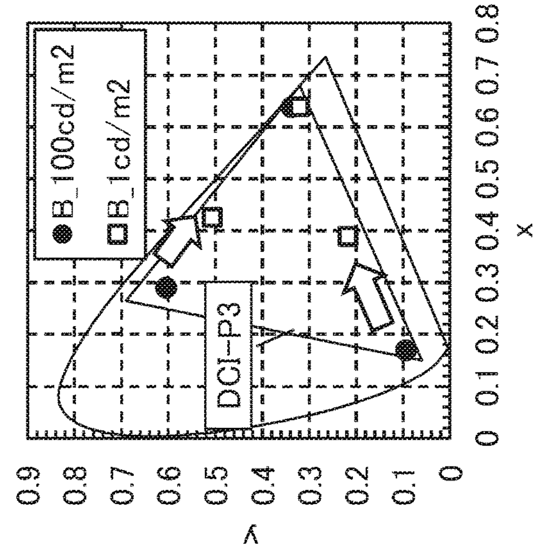

FIG. 28B shows the chromaticity of the display device B under the high luminance condition (B_100 cd/m$^2$) and under the low luminance condition (B_1 cd/m$^2$).

Figure 28C:
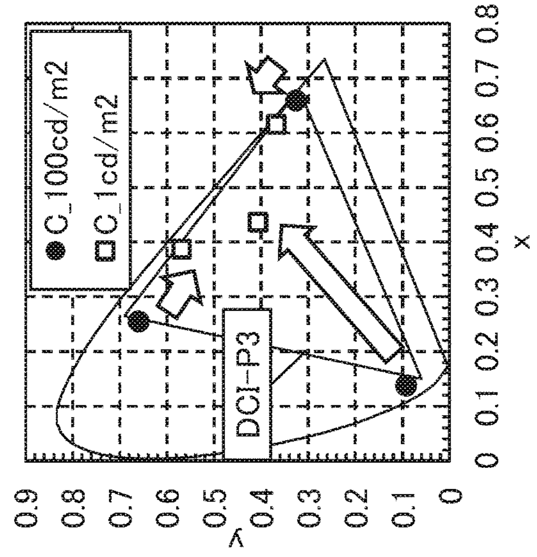

FIG. 28C shows the chromaticity of the display device C under the high luminance condition (C_100 cd/m$^2$) and under the low luminance condition (C_1 cd/m$^2$).

Figure 32:
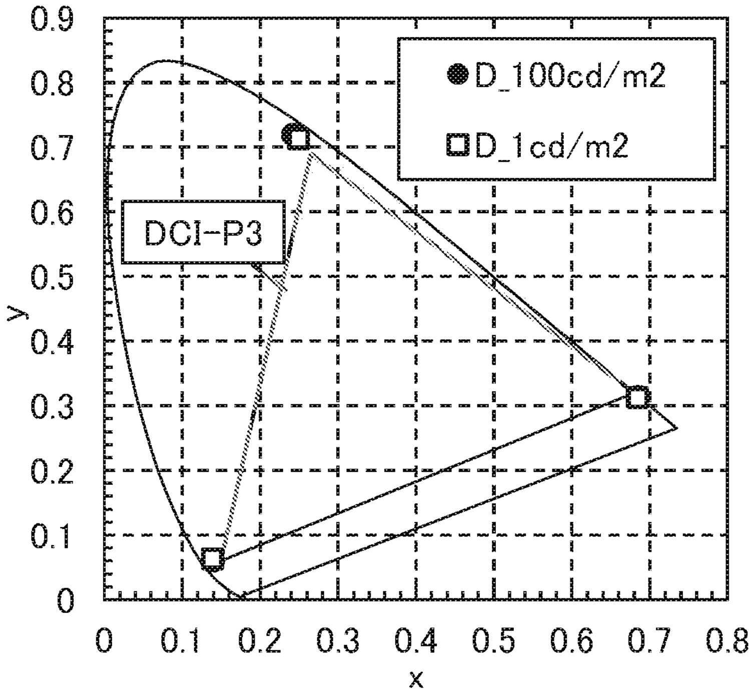
FIG. 32 is a chromaticity diagram of a display device.

FIG. 32 shows the chromaticity of the display device D under the high luminance condition (D_100 cd/m$^2$) and under the low luminance condition (D_1 cd/m$^2$).

The color gamut of DCI-P3 (Digital Cinema Initiatives P3) standard is also plotted in FIG. 28A to FIG. 28C and FIG. 32.

According to FIG. 28A, single color display of any of red, green, and blue by the display device A made almost no difference in chromaticity between the two conditions. In the display device A, DCI-P3 coverage was 88.1% under the high luminance condition and was 86.1% under the low luminance condition; this negligible difference indicates that color purity is extremely high regardless of luminance.

According to FIG. 28B, the chromaticity under the low luminance condition shifted to the red side in the display device B. It was suggested in the display device B that crosstalk (light emission by an unintended light-emitting device) did not occur but the emission color of the light-emitting device that had to emit light might shift to the red side. In the display device B, DCI-P3 coverage was markedly decreased from 69.0% under the high luminance condition to 22.6% under the low luminance condition.

According to FIG. 28C, the chromaticity under the low luminance condition shifted to the yellow side in the display device C. In the display device C, all the chromaticity of RGB shifted and thus occurrence of crosstalk was suggested. Additionally, the chromaticity of single color display of blue shifted conspicuously and thus the change in the emission color of the light-emitting device that had to emit blue light was suggested. In the display device C, DCI-P3 coverage was markedly decreased from 88.3% under the high luminance condition to 8.9% under the low luminance condition.

According to FIG. 32, single color display of any of red, green, and blue by the display device D made almost no difference in chromaticity between the two conditions. In the display device D, DCI-P3 coverage was 99.7% under the high luminance condition and was 99.3% under the low luminance condition; this negligible difference indicates that color purity is extremely high regardless of luminance.

Figure 29A:
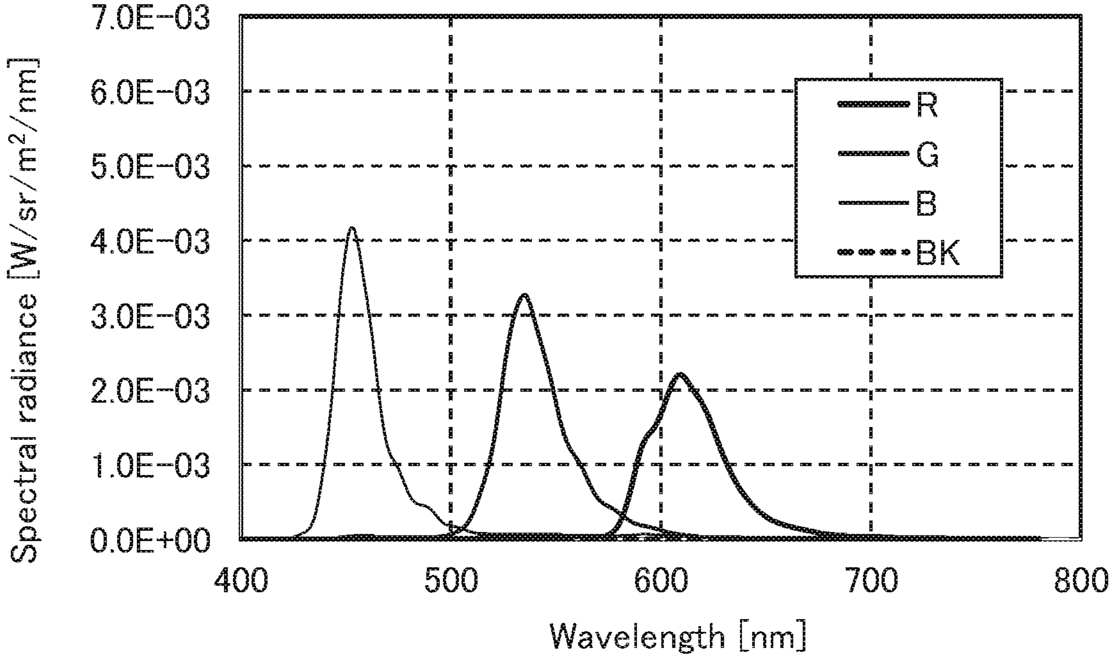
FIG. 29A and FIG. 29B show measurement results of emission spectra of a display device.
Figure 29B:
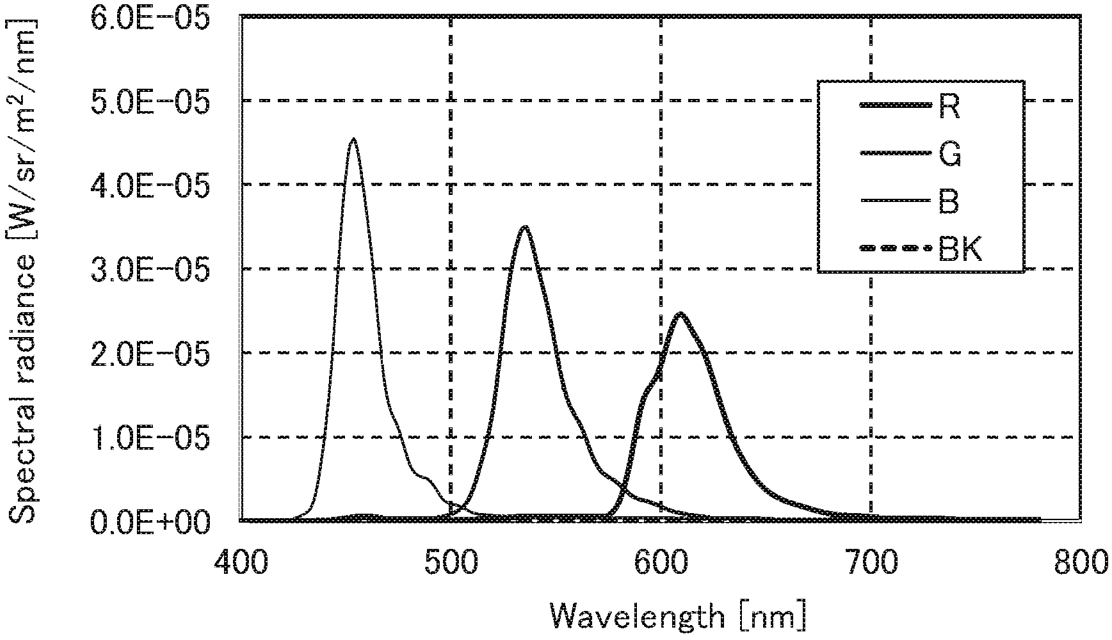

FIG. 29A and FIG. 29B show the wavelength dependence of spectral radiance (unit: W/sr/m$^2$/nm) in the display device A. FIG. 29A shows the emission spectra under the high luminance condition and FIG. 29B shows the emission spectra under the low luminance condition.

Figure 30A:
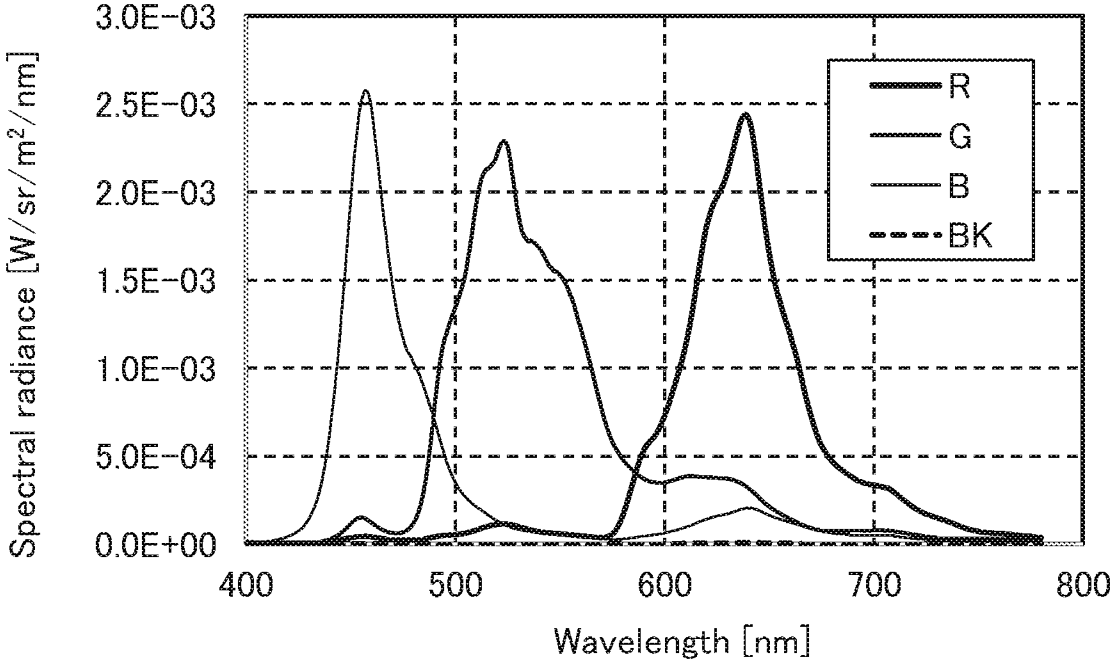
FIG. 30A and FIG. 30B show measurement results of emission spectra of a display device.
Figure 30B:
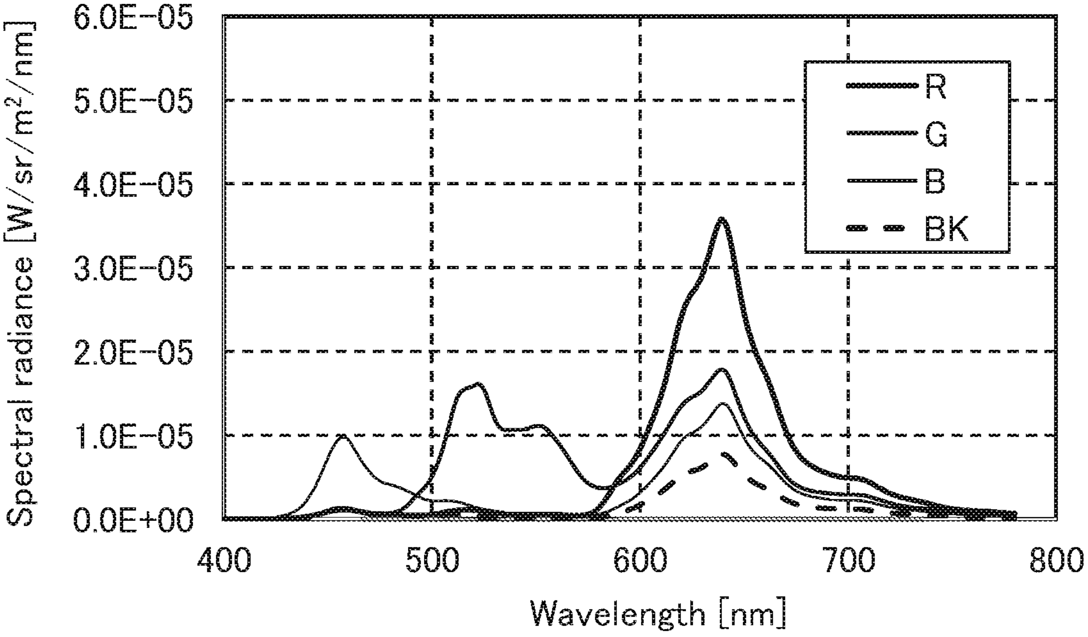

FIG. 30A and FIG. 30B show the wavelength dependence of spectral radiance (unit: W/sr/m$^2$/nm) in the display device B. FIG. 30A shows the emission spectra under the high luminance condition and FIG. 30B shows the emission spectra under the low luminance condition.

Figure 31A:
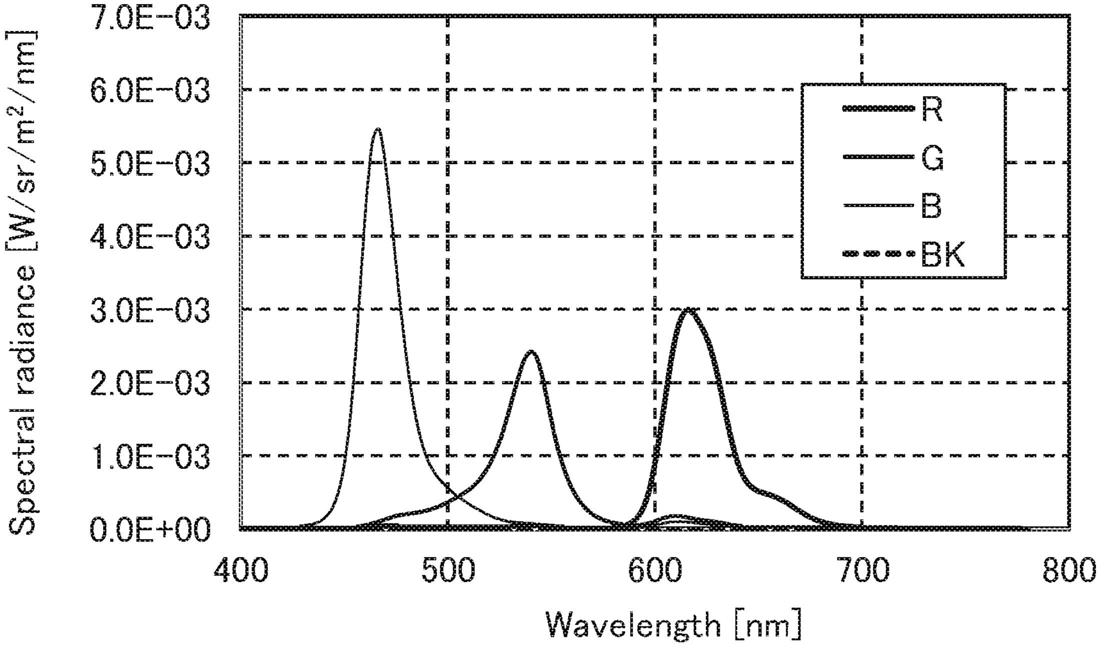
FIG. 31A and FIG. 31B show measurement results of emission spectra of a display device.
Figure 31B:
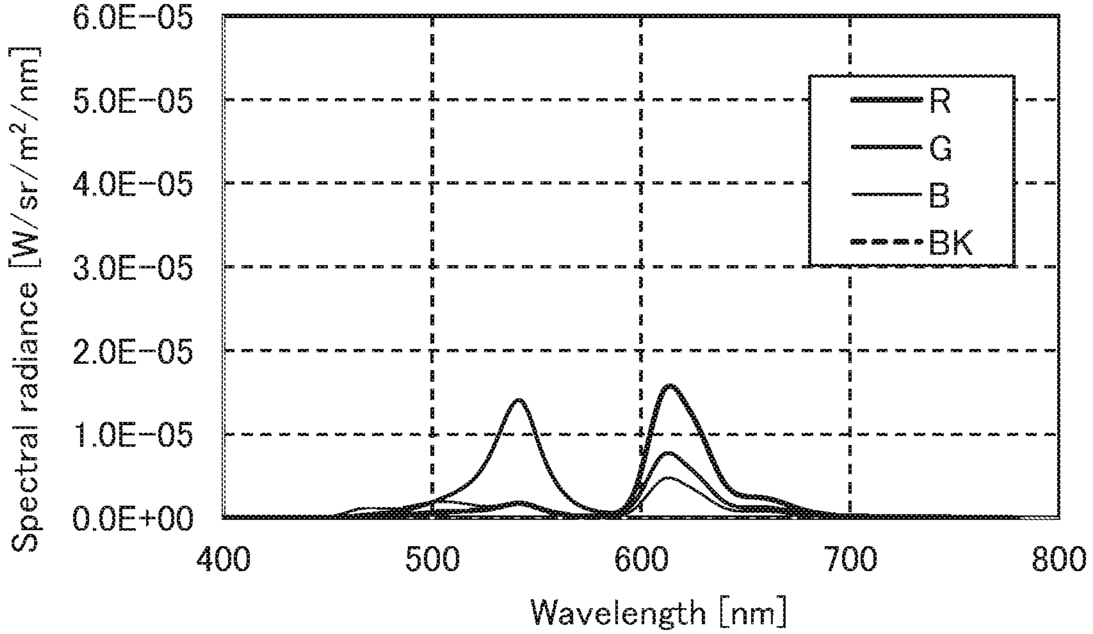

FIG. 31A and FIG. 31B show the wavelength dependence of spectral radiance (unit: W/sr/m$^2$/nm) in the display device C. FIG. 31A shows the emission spectra under the high luminance condition and FIG. 31B shows the emission spectra under the low luminance condition.

Figure 33A:
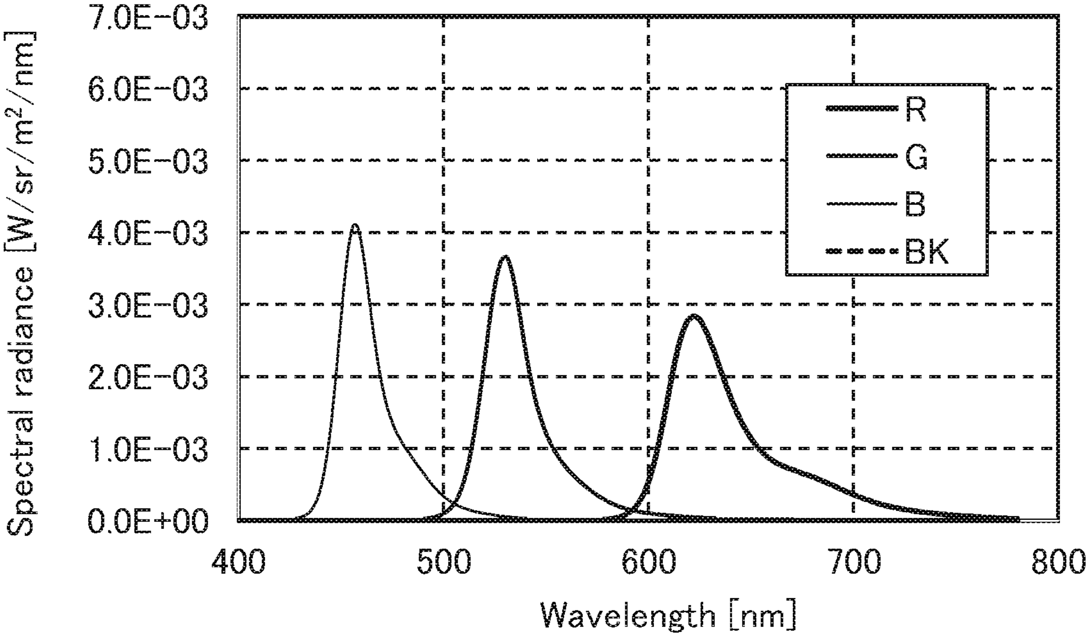
FIG. 33A and FIG. 33B show measurement results of emission spectra of a display device.
Figure 33B:
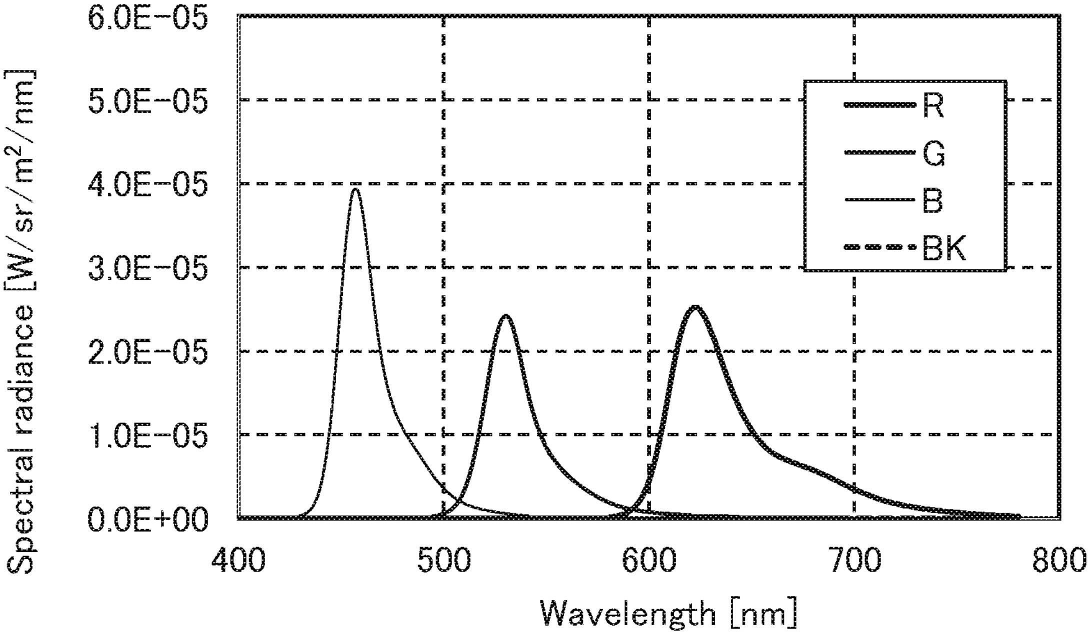

FIG. 33A and FIG. 33B show the wavelength dependence of spectral radiance (unit: W/sr/m$^2$/nm) in the display device D. FIG. 33A shows the emission spectra under the high luminance condition and FIG. 33B shows the emission spectra under the low luminance condition.

According to FIG. 29A and FIG. 29B, no color mixing was observed under the high luminance condition and the low luminance condition in the display device A. Specifically, at red (R) display even under the low luminance condition, only a light-emitting device included in a red subpixel emitted light and thus red light was extracted in the display device A. Similarly, at green (G) display under the low luminance condition, only a light-emitting device included in a green subpixel emitted light and thus green light was extracted. Similarly, at blue (B) display under the low luminance condition, only a light-emitting device included in a blue subpixel emitted light and thus blue light was extracted. At black (BK) display, light emission was hardly observed under both the high luminance condition and the low luminance condition.

The display device A includes a light-emitting device with a tandem structure and employed countermeasures against crosstalk. It was found that a change in display color was extremely small and a crosstalk phenomenon was also inhibited even when the luminance was changed. It was found that no crosstalk was observed in the display device A even with an extremely high resolution of 3000 ppi or higher and thus an extremely high display quality was obtained.

The display device A can be configured as follows: in an emission spectrum of blue display by the display portion at a first luminance, when the intensity of a first emission peak at a wavelength longer than or equal to 400 nm and shorter than 500 nm is 1, the intensity of a second emission peak at a wavelength longer than or equal to 500 nm and shorter than or equal to 700 nm in the emission spectrum is lower than or equal to 0.5. The first luminance is any value higher than 0 cd/m$^2$ and lower than 1 cd/m$^2$.

According to FIG. 30A, it was suggested that the light-emitting device in the display device B was designed to maintain color balance of RGB under the high luminance condition. Meanwhile, according to FIG. 30B, intense red light was emitted in the display device B under the low luminance condition. This reveals that the chromaticity at low luminance might be different from that at high luminance.

Specifically, red light emission was mainly observed at red (R) display under the low luminance condition in the display device B. Furthermore, not only green light emission but also red light emission were observed at green (G) display under the low luminance condition and thus occurrence of color mixing was indicated. According to FIG. 28B, the chromaticity shifted from green (G) toward red (R). Furthermore, not only blue light emission but also red light emission were observed at blue (B) display under the low luminance condition and thus occurrence of color mixing was indicated. According to FIG. 28B, the chromaticity shifted from blue (B) toward red (R). Additionally, red light emission was observed at black (BK) display under the low luminance condition.

The display device B includes a light-emitting device with a single structure including a light-emitting layer emitting red light, a light-emitting layer emitting green light, and a light-emitting layer emitting blue light. This is probably because the carrier balance was lost under the low luminance condition by the single structure including a plurality of light-emitting layers, where it is difficult to adjust the carrier balance, and thus red light emission was more likely to occur.

According to FIG. 31A, no color mixing was observed in the display device C under the high luminance condition. Meanwhile, according to FIG. 31B, color mixing was observed in the display device C under the low luminance condition. This reveals that the chromaticity at low luminance might be different from that at high luminance.

Specifically, not only red light emission but also green light emission were observed at red (R) display under the low luminance condition and thus occurrence of color mixing was indicated in the display device C. According to FIG. 28C, the chromaticity shifted from red (R) to the yellow side. Furthermore, not only green light emission but also red light emission were observed at green (G) display under the low luminance condition and thus occurrence of color mixing was indicated. According to FIG. 28C, the chromaticity shifted from green (G) to the yellow side. Furthermore, not only blue light emission but also green and red light emission were observed at blue (B) display under the low luminance condition and thus occurrence of color mixing was indicated. According to FIG. 28C, the chromaticity shifted from blue (B) to the yellow side.

The display device C includes a light-emitting device with a single structure including a light-emitting layer emitting red light, a light-emitting layer emitting green light, and a light-emitting layer emitting blue light. This is probably because the carrier balance was lost under the low luminance condition by the single structure including a plurality of light-emitting layers, where it is difficult to adjust the carrier balance, and thus red light emission and green light emission were more likely to occur. In addition, crosstalk occurred in the display device C and this revealed that the chromaticity at low luminance might be different from that at high luminance.

According to FIG. 33A and FIG. 33B, no color mixing was observed under the high luminance condition and the low luminance condition in the display device D. Specifically, at red (R) display even under the low luminance condition, only a light-emitting device included in a red subpixel emitted light and thus red light was extracted in the display device D. Similarly, at green (G) display under the low luminance condition, only a light-emitting device included in a green subpixel emitted light and thus green light was extracted. Similarly, at blue (B) display under the low luminance condition, only a light-emitting device included in a blue subpixel emitted light and thus blue light was extracted. At black (BK) display, light emission was hardly observed under both the high luminance condition and the low luminance condition.

The display device D includes light-emitting devices that were separately formed for the respective emission colors and employed countermeasures against crosstalk. It was found that a change in display color was extremely small and a crosstalk phenomenon was also inhibited even when the luminance was changed. It was found that no crosstalk was observed in the display device D even with an extremely high resolution and thus an extremely high display quality was obtained.

As described above, it was indicated that the carrier balance can be more easily adjusted with the use of a tandem structure even in a light-emitting device including a plurality of light-emitting layers and color change in a wide luminance range is reduced. Additionally, color change in a wide luminance range is reduced by the countermeasures against crosstalk. In the display device of one embodiment of the present invention, at least part of the EL layer included in the light-emitting device with a tandem structure is formed to have an island shape. This enables easier carrier balance adjustment and reduction in crosstalk. Therefore, color change can be reduced in a wide luminance range.

REFERENCE NUMERALS

20*b*: light-emitting and light-receiving portion, 20*c*: light-emitting and light-receiving portion, 20*d*: light-emitting and light-receiving portion, 20: display portion, 35: hand, 41: steering wheel, 42: rim, 43: hub, 44: spoke, 45: shaft, 100A: display device, 100B: display device, 100C: display device, 100D: display device, 100E: display device, 100F: display device, 100G: display device, 100H: display device, 100: display device, 101: layer including transistor, 103: pixel, 110*a*: subpixel, 110B: subpixel, 110*b*: subpixel, 110*c*: subpixel, 110*d*: subpixel, 110G: subpixel, 110R: subpixel, 110: pixel, 111*a*: pixel electrode, 111*b*: pixel electrode, 111: pixel electrode, 113A: EL layer, 113*a*: first light-emitting unit, 113*b*: charge-generation layer, 113*c*: second light-emitting unit, 113: EL layer, 114: common layer, 115: common electrode, 117: light-blocking layer, 118A: sacrificial layer, 118: sacrificial layer, 119A: sacrificial layer, 119: sacrificial layer, 120: substrate, 122: resin layer, 123: conductive layer, 124*a*: pixel, 124*b*: pixel, 125*a*: insulating layer, 125A: insulating film, 125*b*: insulating layer, 125: insulating layer, 126: conductive layer, 127*a*: insulating layer, 127A: insulating film, 127*b*: insulating layer, 127: insulating layer, 128: layer, 129: conductive layer, 130: light-emitting device, 131: protective layer, 132B: coloring layer, 132G: coloring layer, 132R: coloring layer, 133: lens array, 134: insulating layer, 138: region, 139: region, 140: connection portion, 142: adhesive layer, 151: substrate, 152: substrate, 153: insulating layer, 162: display portion, 164: circuit, 165: wiring, 166: conductive layer, 172*a*: FPC, 172*b*: FPC, 172: FPC, 173: IC, 190: resist mask, 191: mask, 201: transistor, 204: connection portion, 205: transistor, 209: transistor, 210: transistor, 211: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 231*i*: channel formation region, 231*n*: low-resistance region, 231: semiconductor layer, 240: capacitor, 241: conductive layer, 242*a*: connection layer, 242*b*: connection layer, 242: connection layer, 243: insulating layer, 245: conductive layer, 251: conductive layer, 252: conductive layer, 254: insulating layer, 255*a*: insulating layer, 255*b*: insulating layer, 255: insulating layer, 256: plug, 261: insulating layer, 262: insulating layer, 263: insulating layer, 264: insulating layer, 265: insulating layer, 271: plug,

274*a*: conductive layer, 274*b*: conductive layer, 274: plug, 280: display module, 281: display portion, 282: circuit portion, 283*a*: pixel circuit, 283: pixel circuit portion, 284*a*: pixel, 284: pixel portion, 285: terminal portion, 286: wiring portion, 290: FPC, 291: substrate, 292: substrate, 301A: substrate, 301B: substrate, 301: substrate, 310A: transistor, 310B: transistor, 310: transistor, 311: conductive layer, 312: low-resistance region, 313: insulating layer, 314: insulating layer, 315: element isolation layer, 320*a*: transistor, 320*b*: transistor, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 335: insulating layer, 336: insulating layer, 341: conductive layer, 342: conductive layer, 343: plug, 344: insulating layer, 345: insulating layer, 346: insulating layer, 347: bump, 348: adhesive layer, 351*a*: conductive layer, 351*b*: conductive layer, 353*a*: sacrificial layer, 353*b*: sacrificial layer, 354: insulating layer, 355*a*: wiring, 355*b*: wiring, 361: sealant, 700A: electronic device, 700B: electronic device, 721: housing, 723: mounting portion, 727: earphone portion, 750: earphone, 751: display panel, 753: optical member, 756: display region, 757: frame, 758: nose pad, 772: lower electrode, 785: layer, 786*a*: EL layer, 786*b*: EL layer, 786: EL layer, 788: upper electrode, 800A: electronic device, 800B: electronic device, 820: display portion, 821: housing, 822: communication portion, 823: mounting portion, 824: control portion, 825: image capturing portion, 827: earphone portion, 832: lens, 2800: personal computer, 2801: housing, 2802: housing, 2803: display portion, 2804: keyboard, 2805: pointing device, 2806: secondary battery, 2807: secondary battery, 4411: light-emitting layer, 4412: light-emitting layer, 4413: light-emitting layer, 4420: layer, 4421: layer, 4422: layer, 4430: layer, 4431: layer, 4432: layer, 4440: charge-generation layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9002: camera, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9103: tablet terminal, 9200: portable information terminal, 9201: portable information terminal

The invention claimed is:

1. A display device comprising a display portion capable of full-color display, wherein the display portion comprises a first subpixel, a second subpixel, a first insulating layer, and a second insulating layer, wherein the first subpixel comprises a first light-emitting device and a first coloring layer transmitting blue light, wherein the second subpixel comprises a second light-emitting device and a second coloring layer transmitting light of a color different from a color of light transmitted by the first coloring layer, wherein the first light-emitting device comprises a first pixel electrode, a first EL layer over the first pixel electrode, and a common electrode over the first EL layer, wherein the second light-emitting device comprises a second pixel electrode, a second EL layer over the second pixel electrode, and the common electrode over the second EL layer, wherein the first EL layer has a same structure as the second EL layer, wherein the first EL layer and the second EL layer are separated from each other, wherein the first EL layer comprises a first light-emitting unit over the first pixel electrode, a charge-generation layer over the first light-emitting unit, and a second light-emitting unit over the charge-generation layer, wherein the first insulating layer covers a side surface of the first EL layer and a side surface of the second EL layer, wherein the common electrode is positioned over the first insulating layer, wherein the second insulating layer covers the side surface of the first EL layer and the side surface of the second EL layer with the first insulating layer therebetween, wherein the first insulating layer comprises an inorganic material, wherein the second insulating layer comprises an organic material, wherein, in an emission spectrum of blue display by the display portion at a first luminance, when an intensity of a first emission peak at a wavelength longer than or equal to 400 nm and shorter than 500 nm is 1, an intensity of a second emission peak at a wavelength longer than or equal to 500 nm and shorter than or equal to 700 nm in the emission spectrum is lower than or equal to 0.5, and wherein the first luminance is any value higher than 0 $cd/m^2$ and lower than 1 $cd/m^2$.

2. The display device according to claim 1, wherein the first light-emitting device comprises a common layer between the first EL layer and the common electrode, wherein the second light-emitting device comprises the common layer between the second EL layer and the common electrode, and wherein the common layer comprises at least one of a hole-injection layer, a hole-transport layer, a hole-blocking layer, an electron-blocking layer, an electron-transport layer, and an electron-injection layer.

3. The display device according to claim 1, wherein the first insulating layer is in contact with a side surface of the first pixel electrode and a side surface of the second pixel electrode.

4. The display device according to claim 1, wherein a resolution of the display portion is higher than or equal to 1000 ppi.

5. The display device according to claim 1, wherein the first subpixel comprises a lens overlapping with the first light-emitting device and the first coloring layer.

6. The display device according to claim 1, wherein the first pixel electrode comprises a material reflecting visible light.

7. The display device according to claim 1, wherein the first subpixel comprises a reflective layer, wherein the first pixel electrode comprises a material transmitting visible light, and wherein the first pixel electrode is positioned between the reflective layer and the first EL layer.

8. A display module comprising the display device according to claim 1 and at least one of a connector and an integrated circuit.

9. An electronic device comprising the display module according to claim 8 and at least one of a housing, a battery, a camera, a speaker, and a microphone.

* * * * *